US012772435B2

(12) United States Patent
Kim et al.

(10) Patent No.: US 12,772,435 B2
(45) Date of Patent: Oct. 20, 2026

(54) SEMICONDUCTOR DEVICE

(71) Applicant: Samsung Electronics Co., Ltd., Suwon-si (KR)

(72) Inventors: Jongmin Kim, Suwon-si (KR); Chansic Yoon, Suwon-si (KR); Kiseok Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 18/616,352

(22) Filed: Mar. 26, 2024

(65) Prior Publication Data

US 2025/0016979 A1 Jan. 9, 2025

(30) Foreign Application Priority Data

Jul. 4, 2023 (KR) ........................ 10-2023-0086188

(51) Int. Cl.
*H01L 33/56* (2010.01)
*H01L 25/075* (2006.01)
(Continued)

(52) U.S. Cl.
CPC ......... *H10B 12/315* (2023.02); *H10B 12/482* (2023.02); *H10B 12/50* (2023.02)

(58) Field of Classification Search
CPC ...... H10B 12/50; H10B 12/09; H10B 12/053; H10B 12/482; H10B 12/056; H10B 12/03; H10B 12/36
See application file for complete search history.

(56) References Cited

U.S. PATENT DOCUMENTS

| | | | |
|---|---|---|---|
| 7,425,740 | B2 | 9/2008 | Liu et al. |
| 10,446,555 | B2 | 10/2019 | Wang et al. |

(Continued)

FOREIGN PATENT DOCUMENTS

| | | | |
|---|---|---|---|
| KR | 100599085 | B1 | 7/2006 |
| KR | 20120068618 | A | 6/2012 |
| KR | 20240013582 | A | 1/2024 |

OTHER PUBLICATIONS

Partial Search Report issued for corresponding European Patent Application No. 24175409.2 (Oct. 30, 2024).

(Continued)

*Primary Examiner* — John A Bodnar
(74) *Attorney, Agent, or Firm* — Wolf, Greenfield & Sacks, P.C.

(57) ABSTRACT

A semiconductor device may include first and second active patterns, first and second gate structures, a source/drain layer, a bit line structure, a contact plug structure, and a capacitor. The first and second active patterns are on a cell region and a peripheral circuit region of a substrate, respectively. The first gate structure extends through an upper portion of the first active pattern. The second gate structure is on an upper surface and an upper sidewall of the second active pattern. The source/drain layer is on a portion of the second active pattern that is adjacent to the second gate structure. The bit line structure is on a central portion of the first active pattern, and overlaps the second gate structure in a horizontal direction. The contact plug structure is on opposing end portions of the first active pattern. The capacitor is on the contact plug structure.

20 Claims, 49 Drawing Sheets

(51) Int. Cl.
*H01L 33/00* (2010.01)
*H10B 12/00* (2023.01)

(56) References Cited

U.S. PATENT DOCUMENTS

| | | | | |
|---|---|---|---|---|
| 10,541,302 | B2 | 1/2020 | Yoon et al. | |
| 10,685,708 | B2 | 6/2020 | Jeon et al. | |
| 10,879,398 | B2 | 12/2020 | Lee et al. | |
| 11,411,010 | B2 | 8/2022 | Seong et al. | |
| 2012/0217576 | A1 | 8/2012 | Yeo | |
| 2020/0135850 | A1 | 4/2020 | Yoon et al. | |
| 2022/0181330 | A1* | 6/2022 | Seong | H10B 12/315 |
| 2023/0148126 | A1 | 5/2023 | Lee et al. | |
| 2024/0032286 | A1 | 1/2024 | Yoon et al. | |

OTHER PUBLICATIONS

"Extended European Search Report dated Feb. 24, 2025, issued in corresponding European Application No. 24175409.2, 16 pages".

* cited by examiner

SEMICONDUCTOR DEVICE

CROSS-REFERENCE TO RELATED APPLICATION

This application claims priority under 35 U.S.C. § 119 to Korean Patent Application No. 10-2023-0086188 filed on Jul. 4, 2023 in the Korean Intellectual Property Office, the disclosure of which is hereby incorporated by reference in its entirety.

BACKGROUND

Example embodiments of the present disclosure relate to a semiconductor device. More particularly, example embodiments of the present disclosure relate to a dynamic random-access memory (DRAM) device.

As a degree of integration in a DRAM device has increased, the sizes of components of the DRAM device have decreased, and the areas of transistors in a peripheral circuit region may need to be reduced. In a planar transistor, a gate electrode has low controllability of a channel, and the planar transistor may have the problem of gate induced drain leakage (GIDL) or gate induced junction leakage (GIJL).

SUMMARY

Example embodiments provide a semiconductor device having improved characteristics.

According to example embodiments of the inventive concepts, there is provided a semiconductor device. The semiconductor device may include first and second active patterns on a cell region and a peripheral circuit region of a substrate, respectively, a first gate structure that extends through an upper portion of the first active pattern, a second gate structure on an upper surface and an upper sidewall of the second active pattern, a source/drain layer on a portion of the second active pattern that is adjacent to the second gate structure, a bit line structure on a central portion of the first active pattern, the bit line structure overlapping the second gate structure in a horizontal direction that is substantially parallel to an upper surface of the substrate, a contact plug structure on opposing end portions of the first active pattern, and a capacitor on the contact plug structure.

According to example embodiments of the inventive concepts, there is provided a semiconductor device. The semiconductor device may include a first active pattern on a substrate, a first gate structure that extends through an upper portion of the first active pattern in a first direction that is substantially parallel to an upper surface of the substrate, a bit line structure on a central portion of the first active pattern, the bit line structure extending in a second direction that is substantially parallel to the upper surface of the substrate and intersects the first direction, wherein the bit line structure includes a first conductive pattern, a barrier pattern, a second conductive pattern, and a capping pattern stacked in a vertical direction that is substantially perpendicular to the upper surface of the substrate, a contact plug structure on opposing end portions of the first active pattern, and a capacitor on the contact plug structure. An end portion of the barrier pattern in the second direction may have an "L" shape in a cross-sectional view.

According to example embodiments of the inventive concepts, there is provided a semiconductor device. The semiconductor device may include first and second active patterns on a cell region and a peripheral circuit region of a substrate, respectively, an isolation structure on the substrate and on sidewalls of the first and second active patterns, the isolation structure including first, second, and third isolation patterns, a first gate structure that extends on the cell region of the substrate through upper portions of the first active pattern and the isolation structure in a first direction that is substantially parallel to an upper surface of the substrate, a second gate structure on an upper surface and an upper sidewall of the second active pattern, wherein the second gate structure is on the isolation structure and is on the peripheral circuit region of the substrate, a source/drain layer on a portion of the second active pattern that is adjacent to the second gate structure, a bit line structure on a central portion of the first active pattern and on the isolation structure, the bit line structure extending in a second direction that is substantially parallel to the upper surface of the substrate and intersects the first direction, wherein the bit line structure is on the cell region and is on a portion of the peripheral circuit region that is adjacent to the cell region, and wherein the bit line structure includes a first conductive pattern, a barrier pattern, a second conductive pattern, and a capping pattern stacked in a vertical direction that is substantially perpendicular to the upper surface of the substrate, a contact plug structure on opposing end portions of the first active pattern, and a capacitor on the contact plug structure.

The semiconductor device in accordance with example embodiments may include a transistor on the peripheral circuit region of the substrate, and the gate structure of the transistor may contact the upper sidewall of the active pattern protruding from the substrate as well as the upper surface of the active pattern. Thus, a controllability of the gate structure on the channel in the active pattern may be enhanced, and the GIDL or GIJL phenomenon may be reduced.

DETAILED DESCRIPTION

The above and other aspects and features of a semiconductor device and a method of forming the same in accordance with example embodiments will become readily understood from detailed descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could also be termed a second or third material, layer (film), region, electrode, pad, pattern, structure and process without departing from the teachings of inventive concepts.

Hereinafter, two directions among horizontal directions that are substantially parallel to an upper surface of a substrate may be referred to as first and second directions D1 and D2, respectively, and a direction among the horizontal directions, which has an acute angle with respect to the first and second directions D1 and D2, may be referred to as a third direction D3. A direction substantially perpendicular to the upper surface of the substrate may be referred to as a vertical direction.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

Figure 1:
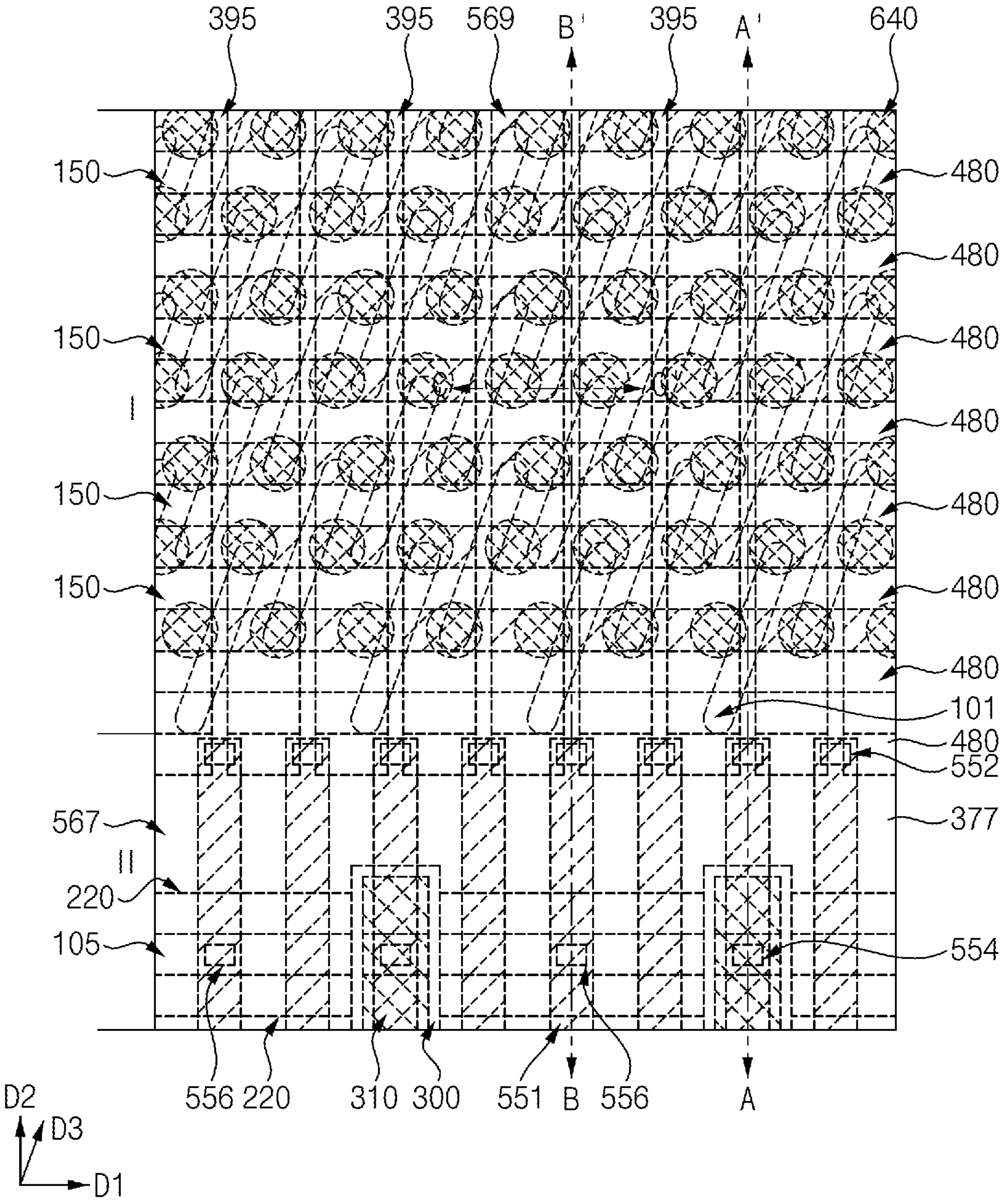
FIG. 1 is a plan view illustrating a semiconductor device in accordance with example embodiments.
Figure 2:
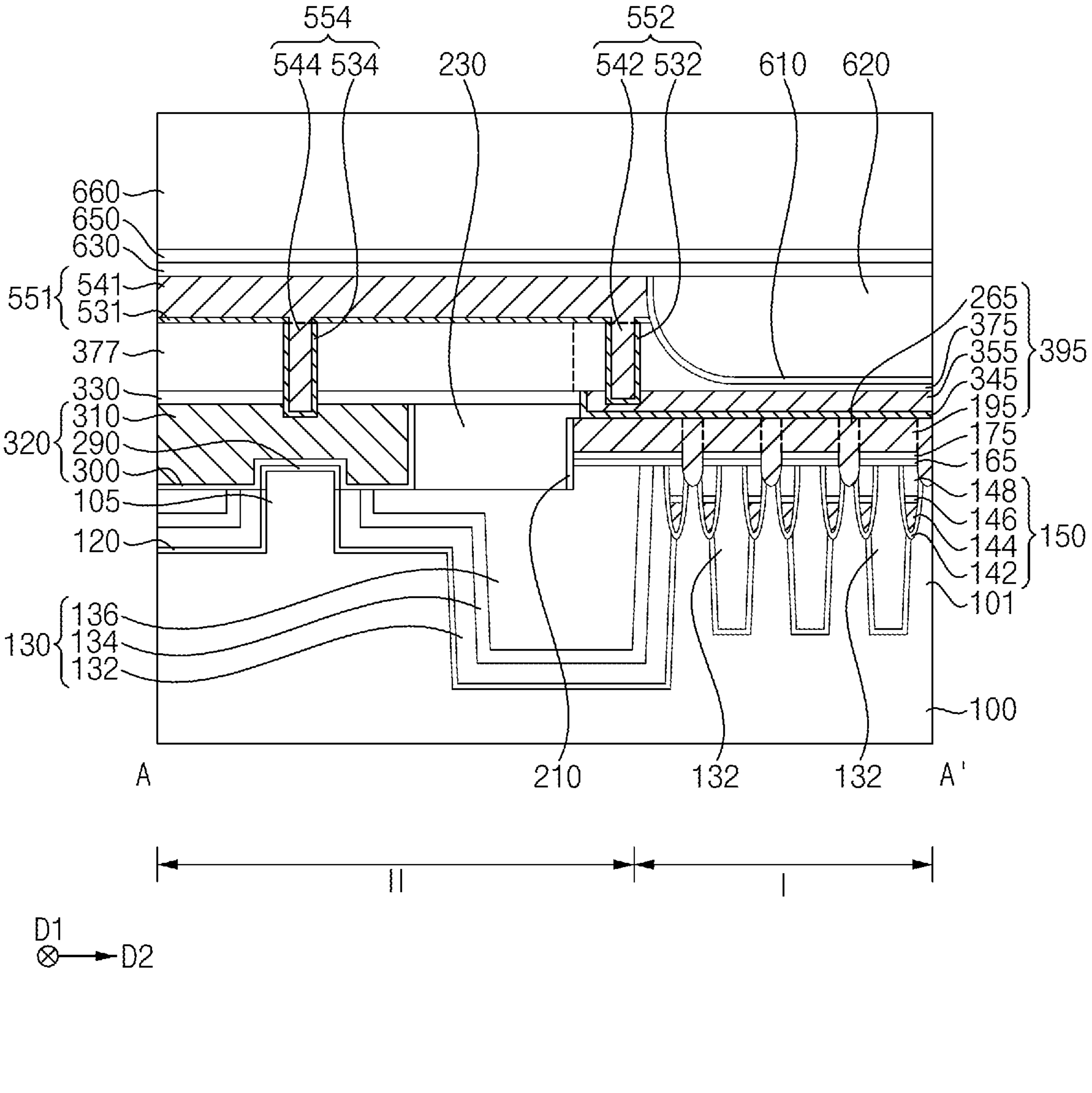
FIG. 2 is a cross-sectional view taken along line A-A' of FIG. 1.
Figure 3:
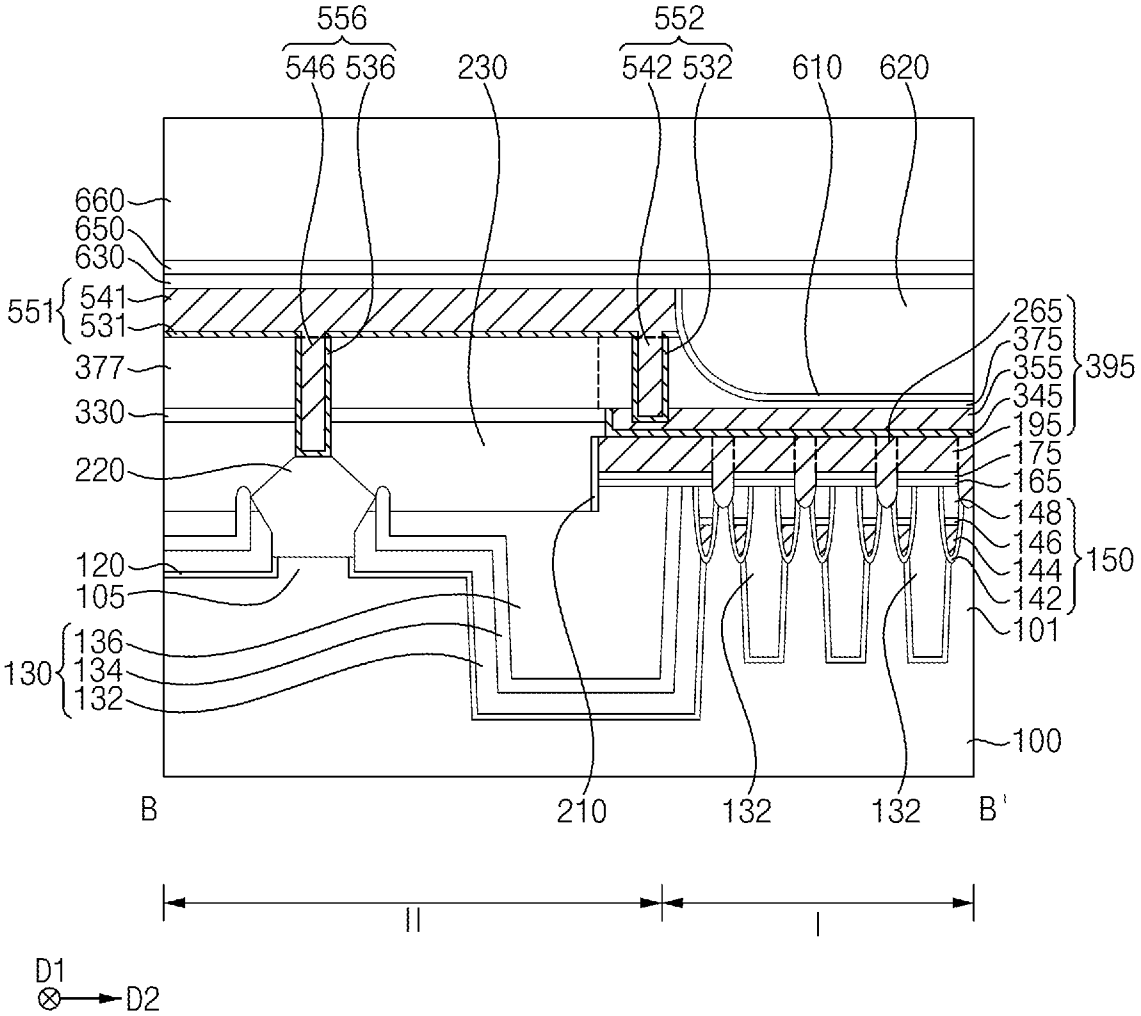
FIG. 3 is a cross-sectional view taken along line B-B' of FIG. 1.
Figure 4:
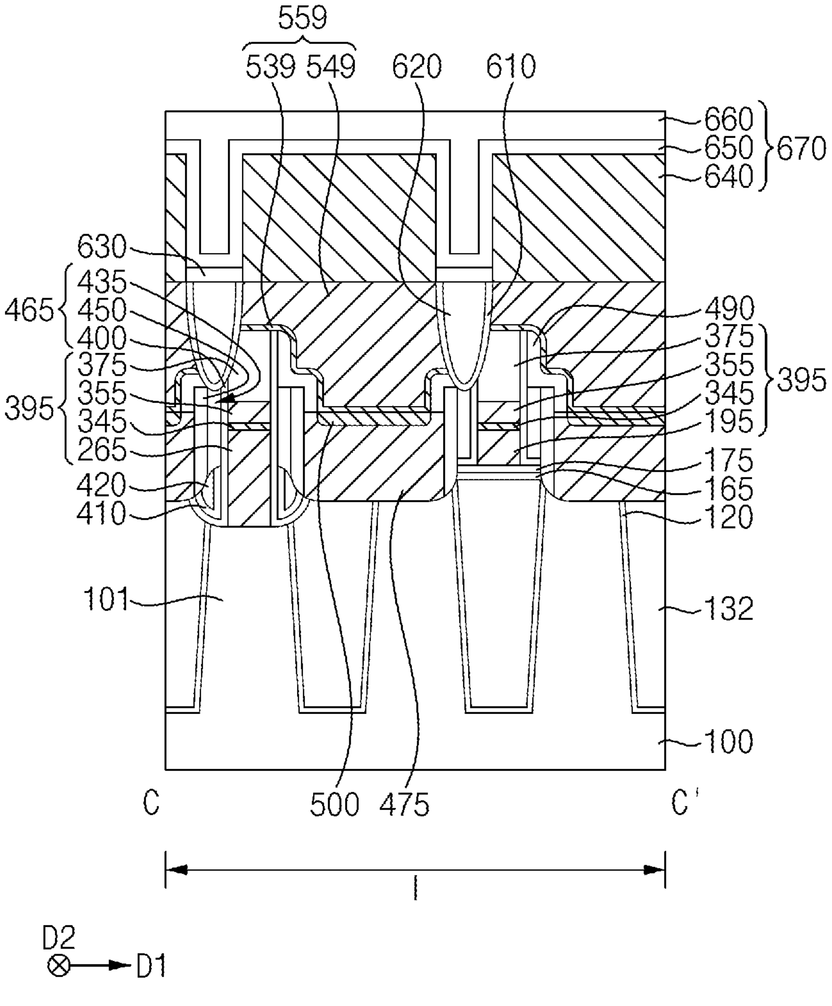
FIG. 4 is a cross-sectional view taken along line C-C' of FIG. 1.

FIG. 1 is a plan view illustrating a semiconductor device in accordance with example embodiments, FIG. 2 is a cross-sectional view taken along line A-A' of FIG. 1, FIG. 3 is a cross-sectional view taken along line B-B' of FIG. 1, and FIG. 4 is a cross-sectional view taken along line C-C' of FIG. 1.

Referring to FIGS. 1 to 4, the semiconductor device may include first and second active patterns 101 and 105, first and second gate structures 150 and 320, a source/drain layer 220, a bit line structure 395, a contact plug structure, and a capacitor 670.

The semiconductor device may further include a polysilicon layer 120, an isolation structure 130, a spacer structure 465, first and sixth spacers 210 and 490, a fence pattern 480, a buffer pattern 165, a first etch stop pattern 175, a first insulating interlayer 230, a protection pattern 330, a fifth capping pattern 377, first to third contact plugs 552, 554 and 556, a wiring 551, a third etch stop layer 630, and first to third insulation pattern structures.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The substrate 100 may include a first region I and a second region II surrounding the first region I, and FIGS. 1 to 4 show portions of the first and second regions I and II of the substrate 100. The first region I of the substrate 100 may be a cell region in which memory cells are formed, and the second region II of the substrate 100 may be a peripheral circuit region in which peripheral circuits for driving the memory cells are formed.

The first and second active patterns 101 and 105 may be formed by removing upper portions of the first and second regions I and II, respectively, of the substrate 100, and thus may include substantially the same material of the substrate 100.

The first active pattern 101 may extend in the third direction D3 in the first region I of the substrate 100, and a plurality of first active patterns 101 may be spaced apart from each other in the first and second directions D1 and D2.

The second active pattern 105 may protrude from an upper portion of the second region II of the substrate 100, and may also be referred to as an active fin.

In an example embodiment, the second active pattern 105 may extend in the first direction D1 in the second region II of the substrate 100, and a plurality of second active patterns 105 may be spaced apart from each other in the second direction D2. However, the inventive concepts are not limited thereto. In another example embodiment, the second active pattern 105 may extend in the second direction D2 in the second region II of the substrate 100, and a plurality of second active patterns 105 may be spaced apart from each other in the first direction D1.

In example embodiments, a lower surface of the first active pattern 101 may be lower than a lower surface of the second active pattern 105. For example, a lower surface of the first active pattern 101 may be lower than a lower surface of the second active pattern 105, with a lower surface of the substrate 100 providing a base reference plane.

The polysilicon layer 120 may be formed on a sidewall of the first active pattern 101, a lower sidewall of the second active pattern 105 and an upper surface of the substrate 100.

The isolation structure 130 may be formed on the polysilicon layer 120. In example embodiments, the isolation structure 130 may include first, second and third isolation patterns 132, 134 and 136. The first isolation pattern 132 may be formed between the first active patterns 101 on the first region I of the substrate 100. The first to third isolation patterns 132, 134 and 136 may be sequentially stacked between the second active patterns 105 on the second region II of the substrate 100.

An upper surface of the first isolation pattern 132 surrounding the first active pattern 101 may be substantially coplanar with an uppermost surface of the first active pattern 101. In example embodiments, an upper surface of a portion of the isolation structure 130 adjacent to the second active pattern 105 in the second direction D2 may be lower than an upper surface of the second active pattern 105, and thus an upper sidewall of the second active pattern 105 may not be covered by the isolation structure 130 (e.g., see FIG. 2).

Each of the first and third isolation patterns 132 and 136 may include an oxide, e.g., silicon oxide, and the second isolation pattern 134 may include an insulating nitride, e.g., silicon nitride.

The first gate structure 150 may extend in the first direction D1 through upper portions of the first active pattern 101, the polysilicon layer 120 and the first isolation pattern 132 in the first region I of the substrate 100. In example embodiments, a plurality of first gate structures 150 may be spaced apart from each other in the second direction D2 in the first region I of the substrate 100. For example, the first gate structure 150 may extend through an upper portion of the isolation structure 130 (e.g., may extend through an upper portion of the first isolation pattern 132).

The first gate structure 150 may include a first conductive pattern 144, a second conductive pattern 146 and a first gate mask 148 sequentially stacked in the vertical direction, and a first gate insulation pattern 142 covering sidewalls of the first conductive pattern 144, the second conductive pattern 146 and the first gate mask 148, and the first and second conductive patterns 144 and 146 may collectively form a first gate electrode.

The first gate insulation pattern 142 may include an oxide, e.g., silicon oxide, the first conductive pattern 144 may include a metal, a metal nitride, a metal silicide, etc., the second conductive pattern 146 may include, e.g., polysilicon doped with n-type impurities, and the first gate mask 148 may include an insulating nitride, e.g., silicon nitride.

The second gate structure 320 may extend in the second direction D2 on the second active pattern 105, the polysilicon layer 120 and the isolation structure 130 on the second region II of the substrate 100, and a plurality of second gate structures 320 may be spaced apart from each other in the first direction D1. However, the inventive concepts are not limited thereto, and if the second active pattern 105 extends in the second direction D2, the second gate structure 320 may extend in the first direction D1, and a plurality second gate structures 320 may be spaced apart from each other in the second direction D2.

The second gate structure 320 may include an interface pattern 290 on an upper surface and an upper sidewall of the second active pattern 105, and a high-k dielectric pattern 300 and a fourth conductive pattern 310 (also referred to as a second gate electrode 310) sequentially stacked on the interface pattern 290. The interface pattern 290 and the high-k dielectric pattern 300 may collectively form a second gate insulation pattern. In some embodiments, the interface pattern 290 may also be formed on an upper surface of the isolation structure 130 as well as the upper surface and the upper sidewall of the second active pattern 105.

The interface pattern 290 may include an oxide, e.g., silicon oxide, the high-k dielectric pattern 300 may include a metal oxide having a high-k dielectric constant, e.g., hafnium oxide, zirconium oxide, etc., and the fourth conductive pattern 310 may include a metal, a metal nitride, a metal silicide, etc.

The source/drain layer 220 may be formed on a portion of the second active pattern 105 adjacent to the second gate structure 320 in the first direction D1. An upper surface of the portion of the second active pattern 105 may be lower than an upper surface of a portion of the second active pattern 105 under the second gate structure 320. For example, an upper surface of a first portion of the second active pattern 105 that is under the source/drain layer 220 may be lower than an upper surface of a second portion of the second active pattern 105 that is under the second gate structure 320, with a lower surface of the substrate 100 providing a base reference plane.

In example embodiments, a cross-section of the source/drain layer 220 in the second direction D2 may have a shape of, e.g., a rhombus or a pentagon. The source/drain layer 220 may include single crystalline silicon doped with p-type or n-type impurities.

In example embodiments, in a portion of the isolation structure 130 adjacent to the source/drain layer 220 in the second direction D2, the second isolation pattern 134 may protrude in the vertical direction from the first and third isolation patterns 132 and 136 (e.g., see FIG. 3). In an example embodiment, an uppermost surface of the portion of the isolation structure 130 adjacent to the source/drain layer 220 in the second direction D2 (e.g., an uppermost surface of the second isolation pattern 134) may be substantially coplanar with an upper surface of a portion of the second active pattern 105 under the second gate structure 320.

The second gate structure 320 and the source/drain layer 220 may collectively form a transistor, and the second gate structure 320 may be on (e.g., may cover) an upper portion of the second active pattern 105 protruding from the second region II of the substrate 100. Thus, the transistor may be a fin field-effect transistor (FinFET).

The second insulation pattern structure may include a buffer pattern 165 and a first etch stop pattern 175 stacked in the vertical direction. The second insulation pattern structure may be formed on the first isolation pattern 132, the first gate structure 150 and the first active pattern 101 on the first region I of the substrate 100 and a portion of the second region II adjacent to the first region I of the substrate 100. In example embodiments, a plurality of buffer patterns 165 may be spaced apart from each other in the first and second directions D1 and D2, and a plurality of first etch stop patterns 175 may be spaced apart from each other in the first and second directions D1 and D2. The buffer pattern 165 may include an oxide, e.g., silicon oxide, and the first etch stop pattern 175 may include an insulating nitride, e.g., silicon nitride.

The bit line structure 395 may extend in the second direction D2 on the first region I of the substrate 100 and a portion of the second region II adjacent to the first region I of the substrate 100, and a plurality of bit line structures 395 may be spaced apart from each other in the first direction D1. In example embodiments, the bit line structure 395 may overlap a central portion in the third direction D3 of each of the first active patterns 101 that are disposed in the second direction D2. For example, the bit line structure 395 may overlap the second gate structure 320 in the second direction D2. As used herein, "an element A overlaps an element B in a direction X" (or similar language) means that there is at least one line that extends in the direction X and intersects both the elements A and B.

The bit line structure 395 may include a third conductive pattern 195, a bit line contact plug 265, a first barrier pattern 345, a fifth conductive pattern 355, and a fourth capping pattern 375. The first barrier pattern 345, the fifth conductive pattern 355, and the fourth capping pattern 375 may be sequentially stacked on the bit line contact plug 265 and the third conductive pattern 195.

The bit line contact plug 265 may contact an upper surface of the central portion in the third direction D3 of each of the first active patterns 101 that are disposed in the second direction D2, and may be disposed between neighboring ones of the second insulation pattern structure (e.g., including the buffer pattern 165 and the first etch stop pattern 175) disposed in the second direction D2. Thus, a plurality of bit line contact plugs 265 may be spaced apart from each other in the first and second directions D1 and D2 on the first region I of the substrate 100. In example embodiments, a lowermost surface of the bit line contact plug 265 and the upper surface of the central portion of the first active pattern 101 may be lower than a lower surface of the second insulation pattern structure (e.g., with a lower surface of the substrate 100 providing a base reference plane).

The third conductive pattern 195 may be formed on the second insulation pattern structure. Each of the bit line contact plug 265 and the third conductive pattern 195 may include, e.g., polysilicon doped with n-type impurities, and thus, in some embodiments, the bit line contact plug 265 and the third conductive pattern 195 may be merged with each other. The merged bit line contact plug 265 and the third conductive pattern 195 may extend in the second direction D2.

Each of the first barrier pattern 345, the fifth conductive pattern 355 and the fourth capping pattern 375 may extend in the second direction D2 on the first region I of the substrate 100 and the portion of the second region II adjacent to the first region I of the substrate 100. A sidewall of an end portion in the second direction D2 of the fifth conductive pattern 355 may be covered by the first barrier pattern 345, and thus a cross-section in the second direction D2 of the first barrier pattern 345 may have an "L" shape (e.g., see FIGS. 2 and 3). For example, an end portion of the first barrier pattern 345 in the second direction D2 may have an "L" shape in a cross-sectional view. For example, a cross-section in the second direction D2 of the first barrier pattern 345 on the second region II of the substrate 100 may have an "L" shape.

In an example embodiment, an upper surface of an end portion in the second direction D2 of the third conductive pattern 195 may be free of the first barrier pattern 345 thereon (e.g., may not be covered by the first barrier pattern 345), and thus the first barrier pattern 345 and the third conductive pattern 195 may have a staircase shape in the second direction D2 (e.g., see FIGS. 2 and 3). That is, the first barrier pattern 345 and the third conductive pattern 195 may collectively have a stepped profile in the second direction D2. However, the inventive concepts are not limited thereto, and sidewalls of the end portions in the second direction D2 of the first barrier pattern 345 and the third conductive pattern 195 may be aligned with each other in the vertical direction.

The first barrier pattern 345 may include a metal silicon nitride, e.g., titanium silicon nitride, the fifth conductive pattern 355 may include a metal, e.g., tungsten, and the fourth capping pattern 375 may include an insulating nitride, e.g., silicon nitride.

The first spacer 210 may be formed on the portion of the second region II adjacent to the first region I of the substrate 100, and may extend in the first direction D1. The first spacer 210 may contact an upper sidewall of the isolation structure 130, a sidewall of the second insulation pattern structure in the second direction D2 (e.g., sidewalls of the buffer pattern 165 and the first etch stop pattern 175 in the second direction D2), and a sidewall of the third conductive pattern 195 in the second direction D2.

The spacer structure 465 may be formed on each of opposite sidewalls in the first direction D1 of the bit line structure 395, and may include a third spacer 400, an air spacer 435 and a fifth spacer 450 sequentially stacked in the first direction D1 (e.g., see FIG. 4).

The third spacer 400 may cover each of opposite sidewalls in the first direction D1 of the bit line structure 395 and an upper surface of the second insulation pattern structure, the air spacer 435 may be formed on an outer sidewall of the third spacer 400, and the fifth spacer 450 may be on (e.g., may cover) an outer sidewall of the air spacer 435 and a sidewall of the second insulation pattern structure. In example embodiments, an uppermost surface of the third spacer 400 may be higher than uppermost surfaces of the air spacer 435 and the fifth spacer 450 (e.g., with a lower surface of the substrate 100 providing a base reference plane).

The sixth spacer 490 may be on (e.g., may cover) an outer sidewall of a portion of the third spacer 400 on an upper sidewall of the bit line structure 395, a top end of the air spacer 435, and an upper surface and an upper outer sidewall of the fifth spacer 450 (e.g., see FIG. 4).

Each of the first, third, fifth and sixth spacers 210, 400, 450 and 490 may include an insulating nitride, e.g., silicon nitride, and the air spacer 435 may include air.

The first insulation pattern structure may include first and second insulation patterns 410 and 420 sequentially stacked on an outer sidewall of a portion of the third spacer 400 that is disposed on a lower sidewall of the bit line contact plug 265 (e.g., see FIG. 4). The first insulation pattern structure may contact a bottom end of the air spacer 435 and a lower surface of the fifth spacer 450. The first insulation pattern 410 may include an oxide, e.g., silicon oxide, and the second insulation pattern 420 may include an insulating nitride, e.g., silicon nitride.

The first insulating interlayer 230 may be formed on the isolation structure 130 on the second region II of the substrate 100, and may contact a sidewall of the second gate structure 320, a sidewall of the source/drain layer 220, a sidewall of the first spacer 210, and a lower portion of a sidewall in the second direction D2 of the first barrier pattern 345. The first insulating interlayer 230 may include an oxide, e.g., silicon oxide.

The protection pattern 330 may contact upper surfaces of the first insulating interlayer 230 and the second gate structure 320 and an upper portion of the sidewall in the second direction D2 of the first barrier pattern 345. The protection pattern 330 may include an insulating nitride, e.g., silicon nitride.

The fifth capping pattern 377 may be formed on the protection pattern 330 on the second region II of the substrate 100, and may contact sidewalls of the fourth capping pattern 375 and the fence pattern 480 on the first region I of the substrate 100. The fifth capping pattern 377 may include substantially the same material as the fourth capping pattern 375, and in some embodiments, the fourth and fifth capping patterns 375 and 377 may not be differentiated from each other.

The contact plug structure may include a lower contact plug 475, an ohmic contact pattern 500 and an upper contact plug 559 sequentially stacked in the vertical direction on the first active pattern 101 and the first isolation pattern 132 (e.g., see FIG. 4).

The lower contact plug 475 may contact an upper surface of each of opposite end portions in the third direction D3 of the first active pattern 101. For example, the contact plug structure may be on opposing end portions in the third direction D3 of the first active pattern 101. In example embodiments, a plurality of lower contact plugs 475 may be spaced apart from each other in the second direction D2 between neighboring ones of the bit line structures 395 in the first direction D1, and the fence pattern 480 may be formed between neighboring ones of the lower contact plugs 475 in the second direction D2. The fence pattern 480 may include an insulating nitride, e.g., silicon nitride.

The lower contact plug 475 may include, e.g., doped polysilicon, and the ohmic contact pattern 500 may include a metal silicide, e.g., titanium silicide, cobalt silicide, nickel silicide, etc.

The upper contact plug 559 may include an eleventh conductive pattern 549 and a sixth barrier pattern 539 on (e.g., covering) a lower surface of the eleventh conductive pattern 549. The eleventh conductive pattern 549 may include a metal, e.g., tungsten, and the sixth barrier pattern 539 may include a metal nitride, e.g., titanium nitride.

In example embodiments, a plurality of upper contact plugs 559 may be spaced apart from each other in the first and second directions D1 and D2 on the first region I of the substrate 100, and may be arranged in a honeycomb pattern or a lattice pattern in a plan view. Each of the upper contact plugs 559 may have a shape of, e.g., a circle, an ellipse, a polygon, etc.

The first contact plug 552 may be formed on the portion of the second region II adjacent to the first region I of the substrate 100, and may extend through the fourth capping pattern 375 to contact an upper surface of the fifth conductive pattern 355. The second contact plug 554 may be formed on the second region II of the substrate 100, and may extend through the fifth capping pattern 377 and the protection pattern 330 to contact an upper surface of the second gate electrode 310 (e.g., see FIG. 2). The third contact plug 556 may be formed on the second region II of the substrate 100, and may extend through the fifth capping pattern 377 and the protection pattern 330 to contact an upper surface of the source/drain layer 220 (e.g., see FIG. 3).

The first contact plug 552 may include an eighth conductive pattern 542 and a third barrier pattern 532 on (e.g., covering) a lower surface and a sidewall of the eighth conductive pattern 542. The second contact plug 554 may include a ninth conductive pattern 544 and a fourth barrier pattern 534 on (e.g., covering) a lower surface and a sidewall of the ninth conductive pattern 544. The third contact plug 556 may include a tenth conductive pattern 546 and a fifth barrier pattern 536 on (e.g., covering) a lower surface and a sidewall of the tenth conductive pattern 546.

The wiring 551 may be formed on the second region II of the substrate 100, and may contact an upper surface of the first contact plug 552. The wiring 551 may also contact an upper surface of the second contact plug 554 and/or an upper surface of the third contact plug 556. In an example embodiment, the wiring 551 may extend in the second direction D2, and a plurality of wirings 551 may be spaced apart from each other in the first direction D1. However, the inventive concepts are not limited thereto, and the wirings 551 may have various layouts. The wiring 551 may include a seventh conductive pattern 541 and a second barrier pattern 531 on (e.g., covering) a lower surface of the seventh conductive pattern 541.

Each of the second to fifth barrier patterns 531, 532, 534 and 536 may include, e.g., a metal nitride, and each of the seventh to tenth conductive patterns 541, 542, 544 and 546 may include, e.g., a metal.

Referring to FIGS. 1 to 4 together with FIGS. 44 to 47, the third insulation pattern structure may include a sixth insulation pattern 610 on an eleventh opening 567, which may extend through the wiring 551 and a portion of the fifth capping pattern 377, a sixth insulation pattern 610 on an inner wall of a twelfth opening 569, which may extend through the upper contact plug 559, the fourth capping pattern 375, the spacer structure 465 and a portion of the sixth spacer 490 to surround the upper contact plug 559 in a plan view, and a seventh insulation pattern 620 on the sixth insulation pattern 610 and filling a remaining portion of the eleventh and twelfth openings 567 and 569. The top end of the air spacer 435 may be closed by the sixth insulation pattern 610.

The sixth and seventh insulation patterns 610 and 620 may include an insulating nitride, e.g., silicon nitride.

The third etch stop layer 630 may be formed on the wiring 551, the upper contact plug 559 and the third insulation pattern structure (e.g., including the sixth and seventh insulation patterns 610 and 620). The third etch stop layer 630 may include an insulating nitride, e.g., silicon boronitride.

The capacitor 670 may include a lower electrode 640 extending through the third etch stop layer 630 to contact an upper surface of the upper contact plug 559, a dielectric layer 650, and an upper electrode 660 on the dielectric layer 650. In example embodiments, a plurality of lower electrodes 640 may be spaced apart from each other in the first and second directions D1 and D2, and may be arranged in a honeycomb pattern in a plan view.

The semiconductor device may include a transistor on the second region II of the substrate 100, and the second gate structure 320 included in the transistor may contact the upper sidewall of the second active pattern 105 as well as the upper surface of the second active pattern 105 (e.g., see FIG. 2). That is, the transistor may not be a planar transistor but instead a FinFET. Accordingly, a controllability of the second gate structure 320 on a channel in the second active pattern 105 may be enhanced in the transistor, and a GIDL or GIJL phenomenon may decrease.

FIGS. 5 to 47 are plan views and cross-sectional views illustrating a method of manufacturing a semiconductor device in accordance with example embodiments. In particular, FIGS. 5, 7, 10, 14, 16, 18, 20, 23, 29, 34, 38 and 44 are plan views, FIGS. 6, 8-9, 11-13, 15, 17, 21, 24, 26, 28, 30-33, 35, 41 and 45 are cross-sectional views taken along lines A-A' of corresponding plan views, respectively, FIGS. 19, 22, 42 and 46 are cross-sectional views taken along lines B-B' of corresponding plan views, respectively, and FIGS. 25, 27, 36-37, 39-40, 43 and 47 are cross-sectional views taken along lines C-C' of corresponding plan views, respectively.

Figure 5:
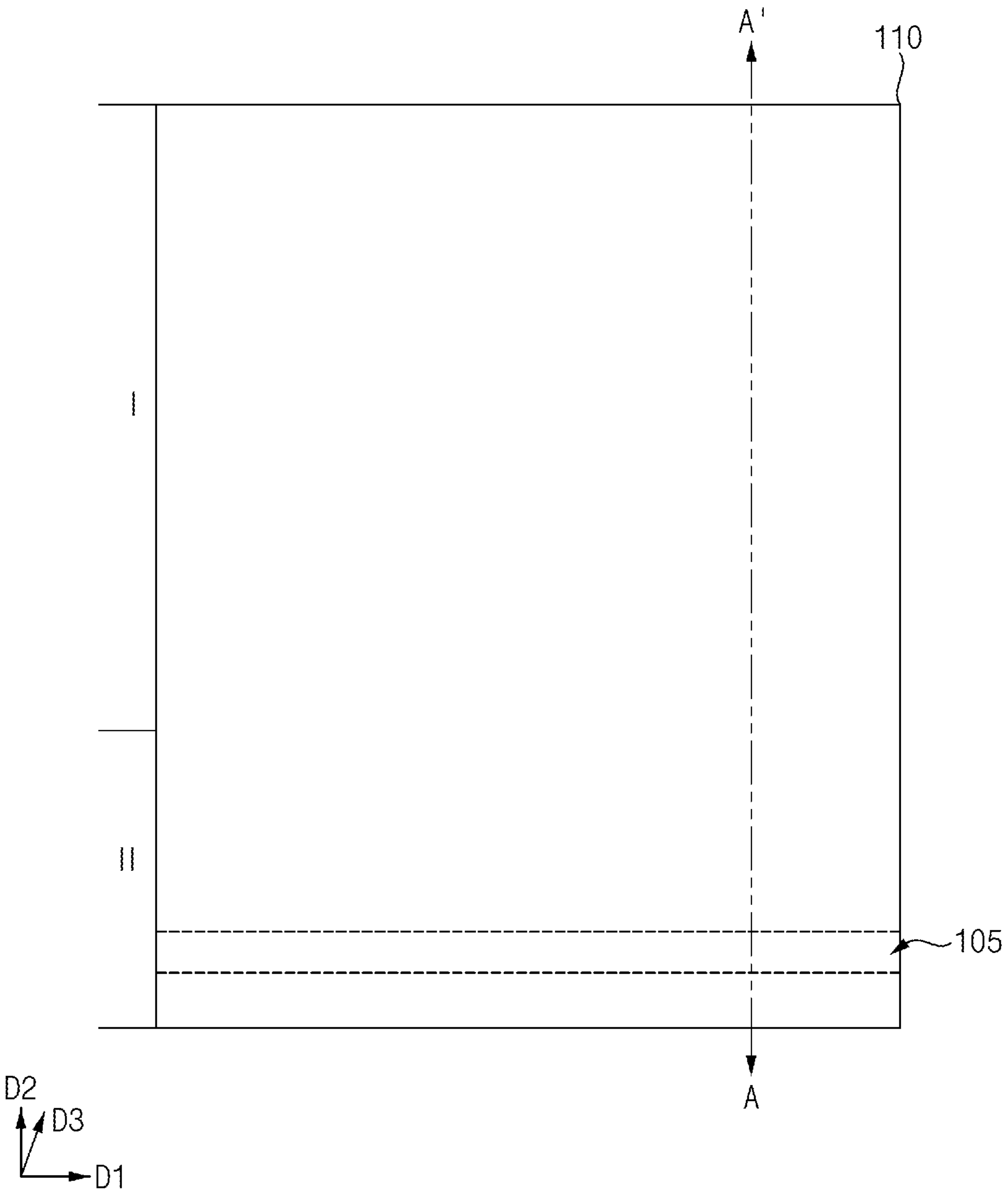
FIGS. 5 to 47 are plan views and cross-sectional views illustrating a method of manufacturing a semiconductor device in accordance with example embodiments.
Figure 6:
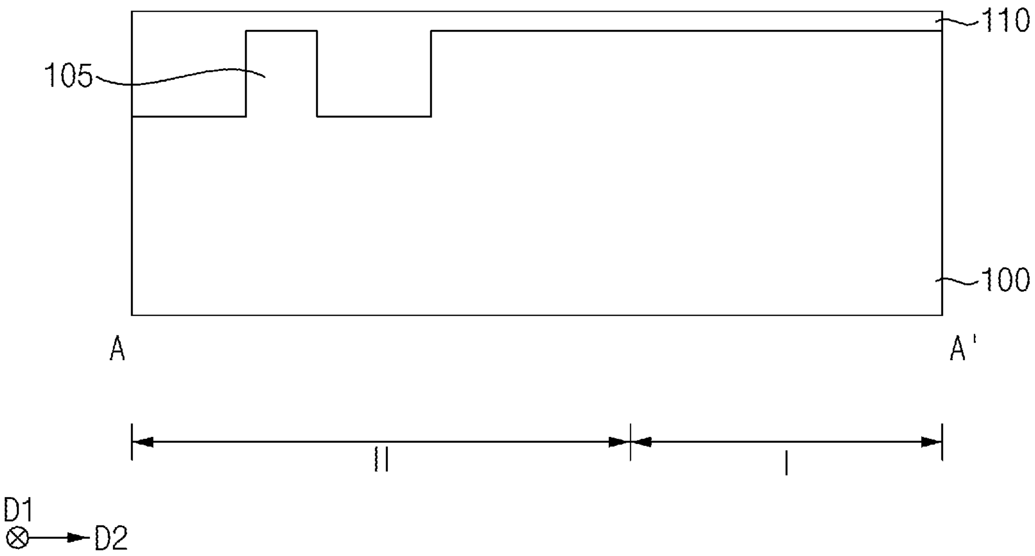

Referring to FIGS. 5 and 6, a second active pattern 105 may be formed on a substrate 100 including first and second regions I and II, and a first sacrificial insulation layer 110 may be formed on the first and second regions I and II of the substrate 100 to cover the second active pattern 105.

The second active pattern 105 may be formed by removing an upper portion of the second region II of the substrate 100 to form a first recess. In example embodiments, the second active pattern 105 may extend in the first direction D1 on the second region II of the substrate 100, and a plurality of second active patterns 105 may be spaced apart from each other in the second direction D2. FIG. 5 shows a single second active pattern 105 among the plurality of second active patterns 105. As another example, the second active pattern 105 may extend in the second direction D2 on the second region II of the substrate 100, and a plurality of second active patterns 105 may be spaced apart from each other in the first direction D1.

The first sacrificial insulation layer 110 may be on (e.g., may cover) an upper surface and a sidewall of the second active pattern 105 and an upper surface of the first region I of the substrate 100, and may include silicon oxide, e.g., tonen silazene (TOSZ).

Figure 7:
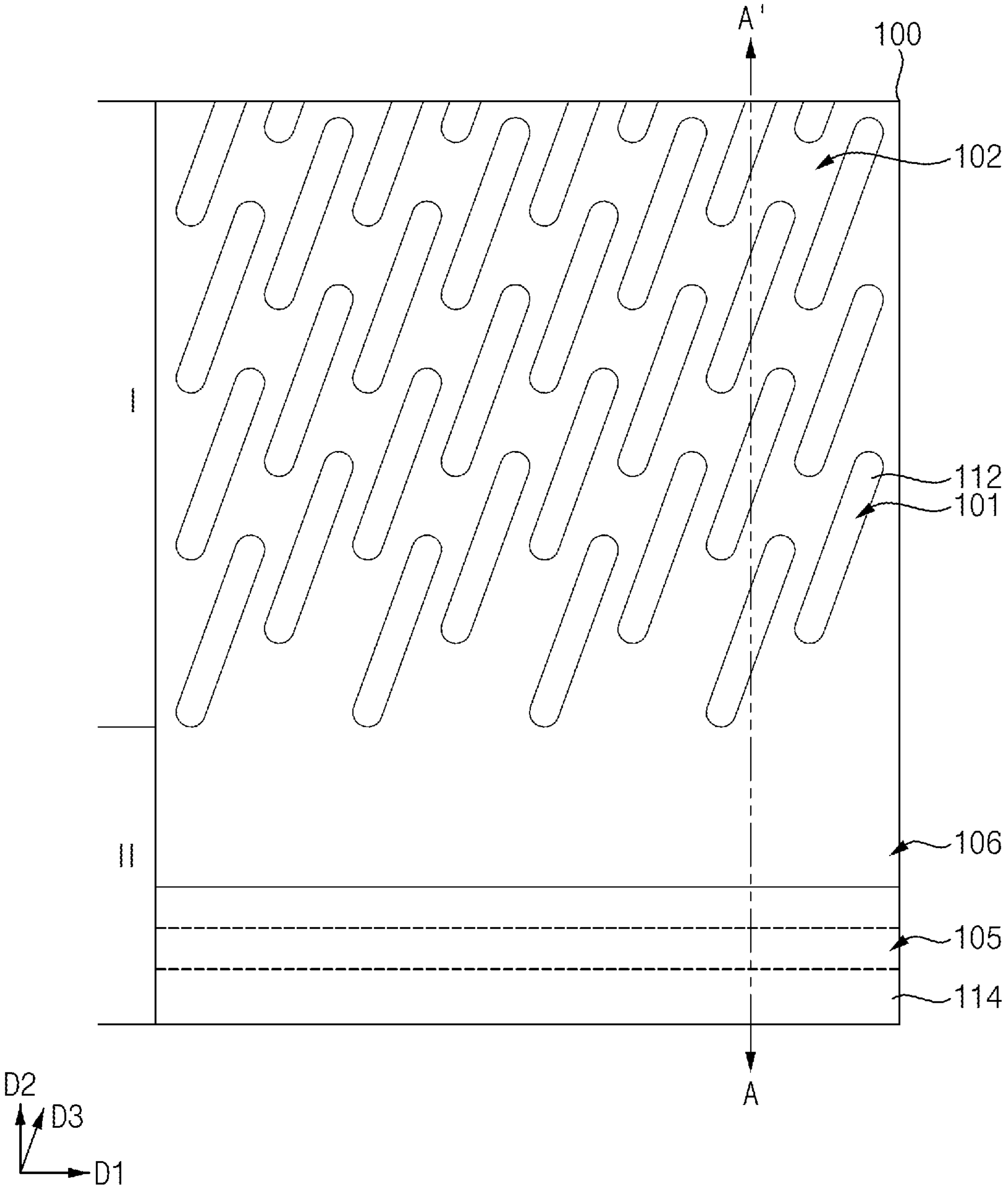
Figure 8:
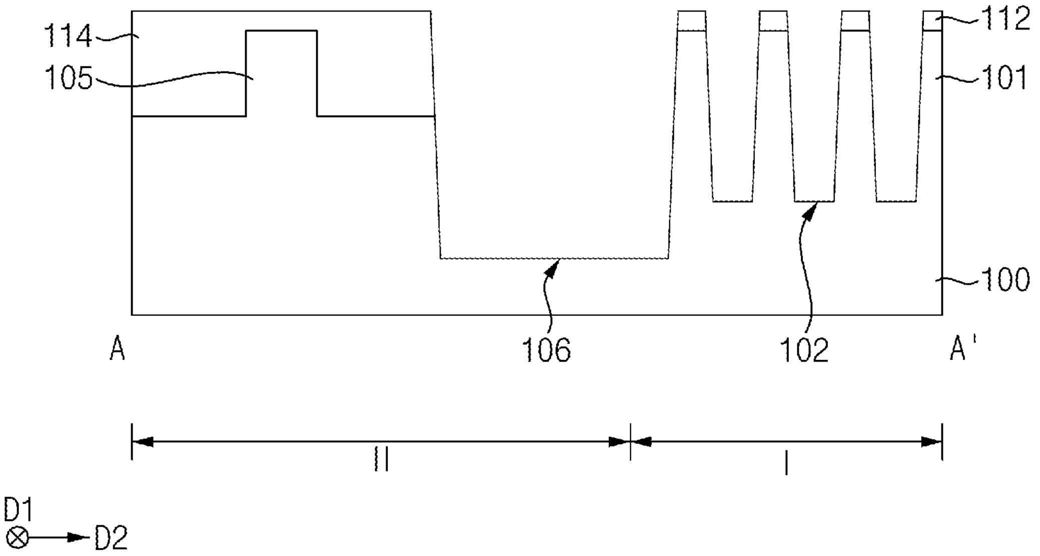

Referring to FIGS. 7 and 8, a first etching mask may be formed on the first sacrificial insulation layer 110, and an etching process may be performed using the first etching mask to partially etch the first sacrificial insulation layer 110 and an upper portion of the substrate 100 so that second and third recesses 102 and 106 may be formed in the first region I of the substrate 100 and a boundary between the first and second regions I and II of the substrate 100, respectively.

By the etching process, the first sacrificial insulation layer 110 may be transformed into first and second sacrificial insulation patterns 112 and 114 on the first and second regions I and II, respectively, of the substrate 100, and a first active pattern 101 may be formed on the first region I of the substrate 100.

In example embodiments, the first active pattern 101 may extend in the third direction D3 on the first region I of the substrate 100, and a plurality of first active patterns 101 may be spaced apart from each other in the first and second directions D1 and D2. In example embodiments, the third recess 106 may have a width and a depth greater than a width and a depth, respectively, of the second recess 102.

The first etching mask may be removed.

Figure 9:
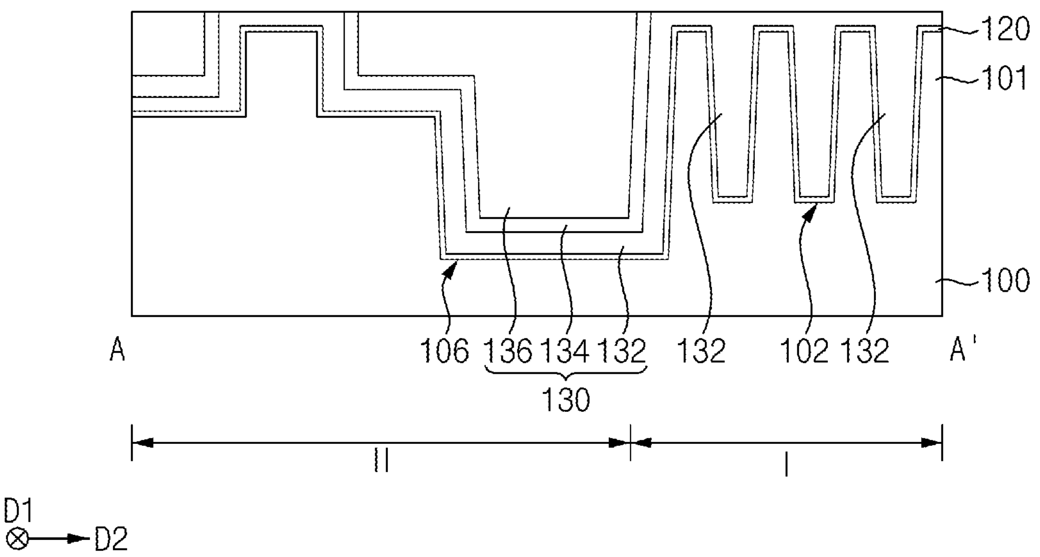

Referring to FIG. 9, the first and second sacrificial insulation patterns 112 and 114 may be removed by, e.g., a stripping process, and a polysilicon layer 120 may be conformally formed on the first and second regions I and II of the substrate 100 having the first and second active patterns 101 and 105 thereon.

An isolation structure 130 may be formed on the polysilicon layer 120. The isolation structure 130 may be formed by sequentially forming first, second and third isolation layers on the polysilicon layer 120 and performing a planarization process on the first to third isolation layers until an upper surface of a portion of the first isolation layer on each of the first and second active patterns 101 and 105 is exposed. Each of the first and third isolation layers may include an oxide, e.g., silicon oxide, and the second isolation layer may include an insulating nitride, e.g., silicon nitride.

The planarization process may include, e.g., a chemical mechanical polishing (CMP) process and/or an etch back process. In example embodiments, the isolation structure 130 may include first, second and third isolation patterns 132, 134 and 136 sequentially stacked on inner walls of the first recess and the third recess 106. However, only the first isolation pattern 132 may be formed in the second recess 102 having a width smaller than a width of the third recess 106.

Figure 10:
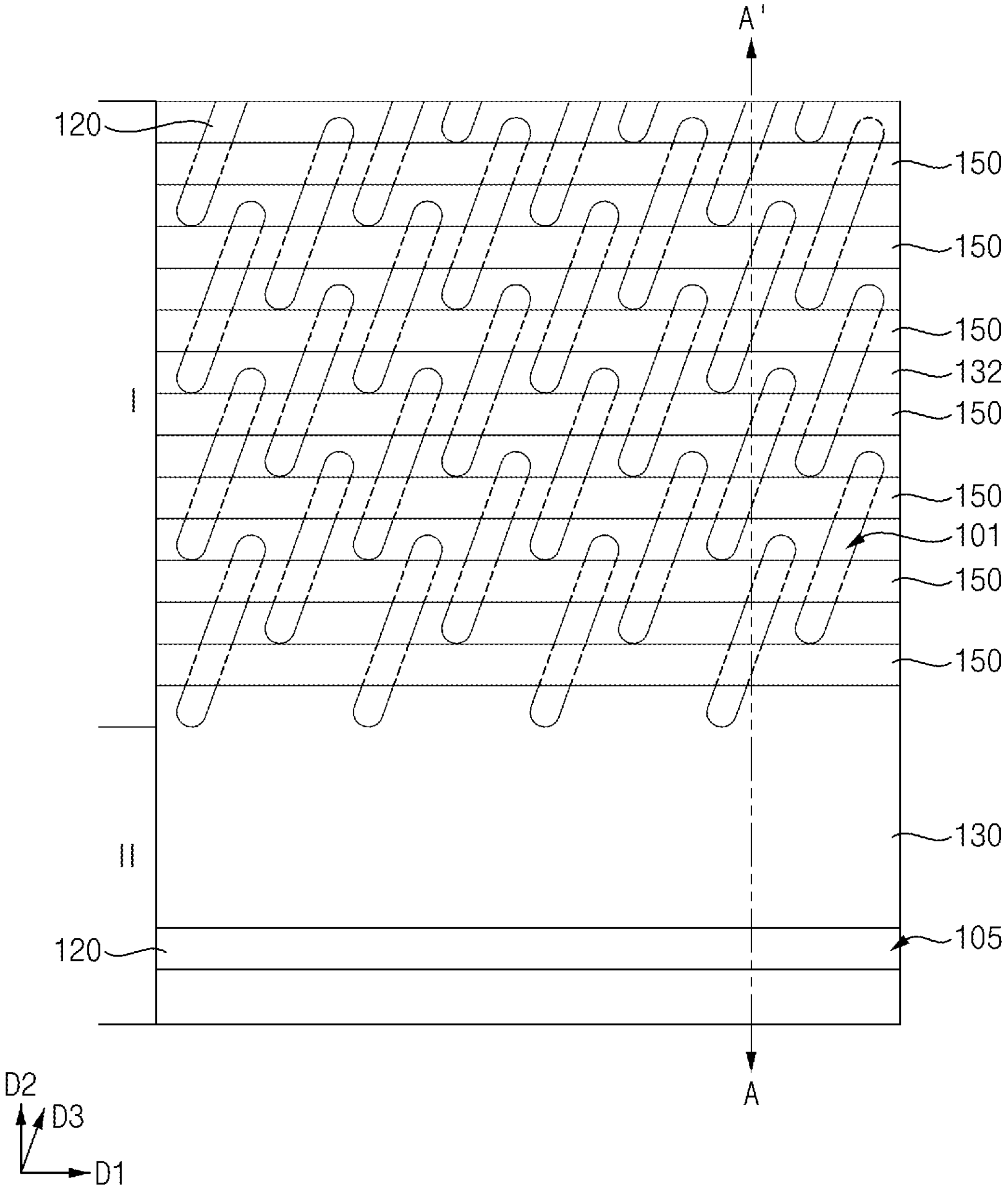
Figure 11:
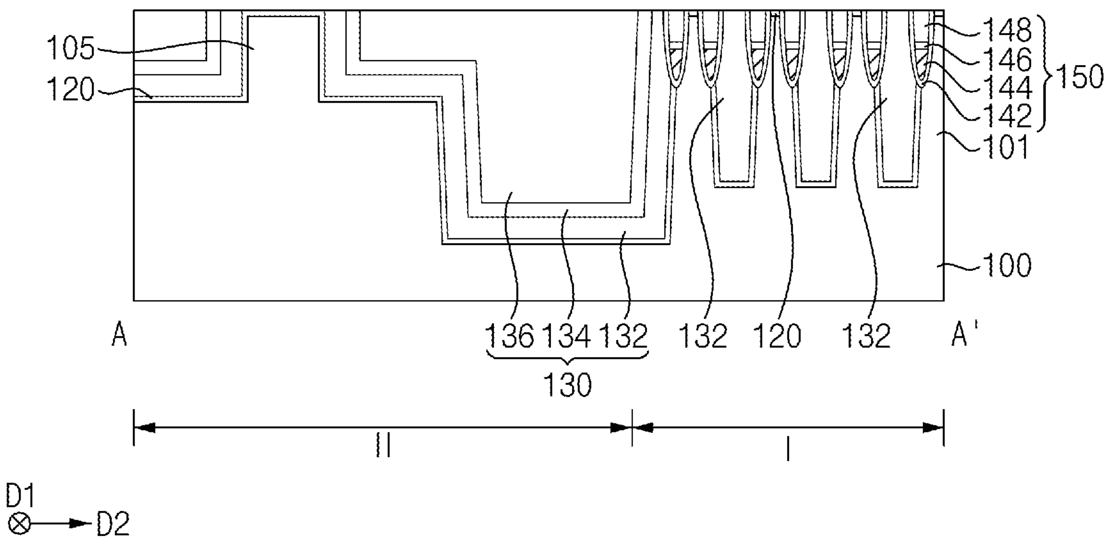

Referring to FIGS. 10 and 11, the first active pattern 101 and the isolation structure 130 on the first region I of the substrate 100 may be etched by an etching process to form a fourth recess extending in the first direction D1, and a first gate structure 150 may be formed in the fourth recess.

The first gate structure 150 may include a first gate insulation pattern 142 on an inner wall of the fourth recess, and a first conductive pattern 144, a second conductive pattern 146 and a first gate mask 148 sequentially stacked on the first gate insulation pattern 142 in the vertical direction, and the first conductive pattern 144 and the second conductive pattern 146 may collectively form a first gate electrode. In example embodiments, the first gate structure 150 may extend in the first direction D1, and a plurality of first gate structures 150 may be spaced apart from each other in the second direction D2.

Figure 12:
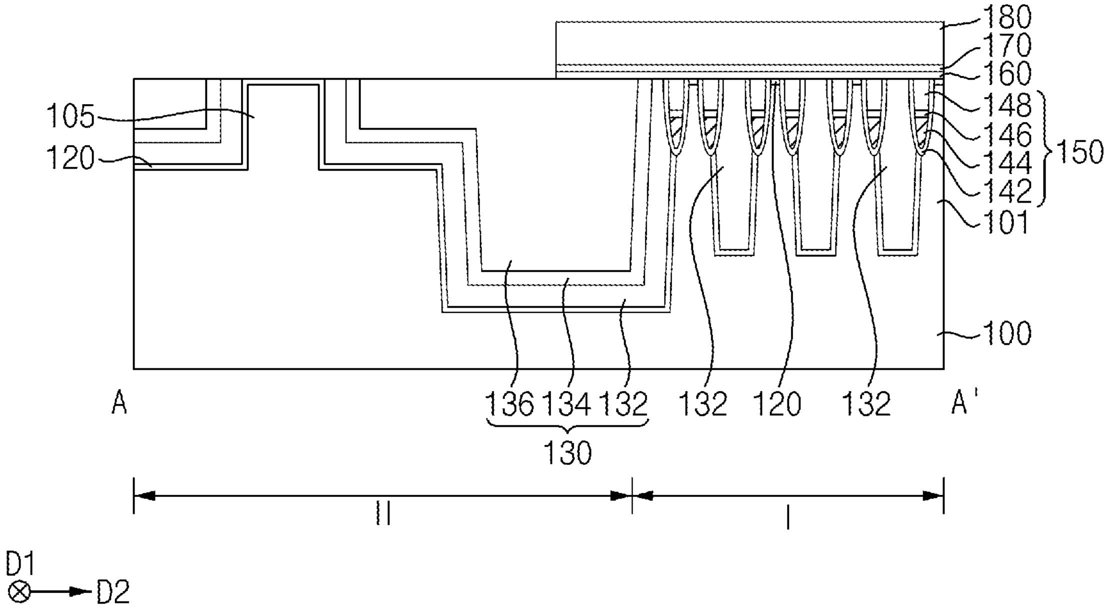

Referring to FIG. 12, a buffer layer 160, a first etch stop layer 170 and a third sacrificial insulation layer 180 may be sequentially stacked on the first gate structure 150, the isolation structure 130 and the polysilicon layer 120, a second etching mask may be formed on the second region II of the substrate 100, and an etching process may be performed using the second etching mask to remove the buffer layer 160, the first etch stop layer 170 and the third sacrificial insulation layer 180 on the second region II of the substrate 100.

Each of the buffer layer 160 and the third sacrificial insulation layer 180 may include an oxide, e.g., silicon oxide, and the first etch stop layer 170 may include an insulating nitride, e.g., silicon nitride.

In an example embodiment, the third sacrificial insulation layer 180 and the buffer layer 160 may be removed by a wet etching process, and the first etch stop layer 170 may be removed by a stripping process using, e.g., phosphoric acid ($H_3PO_4$).

The second etching mask may be removed.

Figure 13:
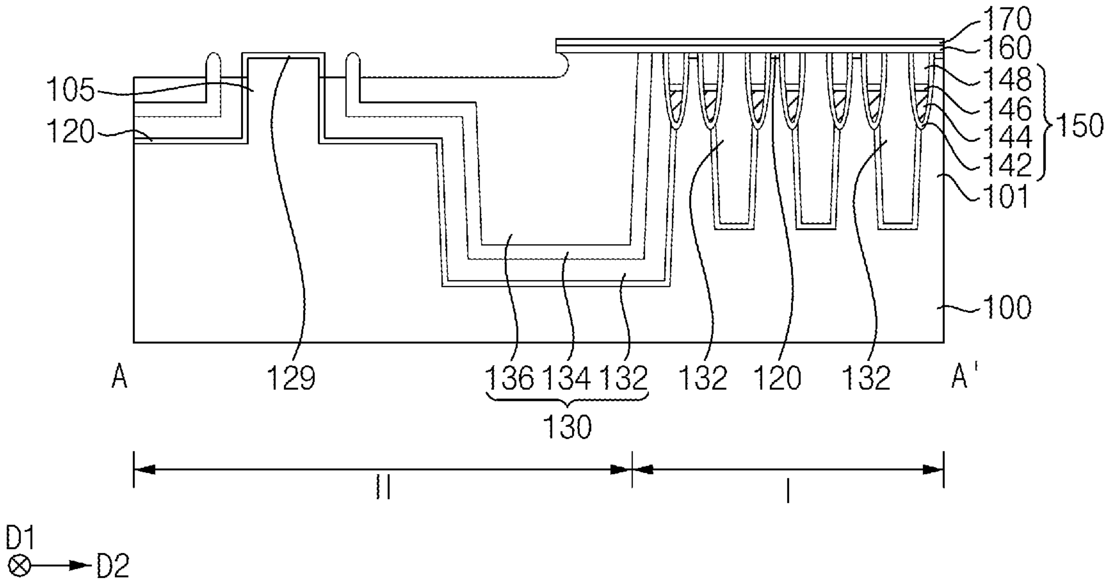

Referring to FIG. 13, a wet etching process may be performed using, e.g., HF, and thus upper portions of the first and third isolation patterns 132 and 136 included in the isolation structure 130 and the third sacrificial insulation layer 180 may be removed.

By the wet etching process, a portion of the polysilicon layer 120 on the upper surface and the upper sidewall of the second active pattern 105 may be exposed, and a plasma oxidation process may be performed on the exposed portion of the polysilicon layer 120. Thus, the exposed portion of the polysilicon layer 120 may be converted into an oxide pattern 129.

A portion of the second isolation pattern 134 adjacent to the second active pattern 105 may include a protrusion portion that protrudes in the vertical direction from upper surfaces of the first and third isolation patterns 132 and 136.

Figure 14:
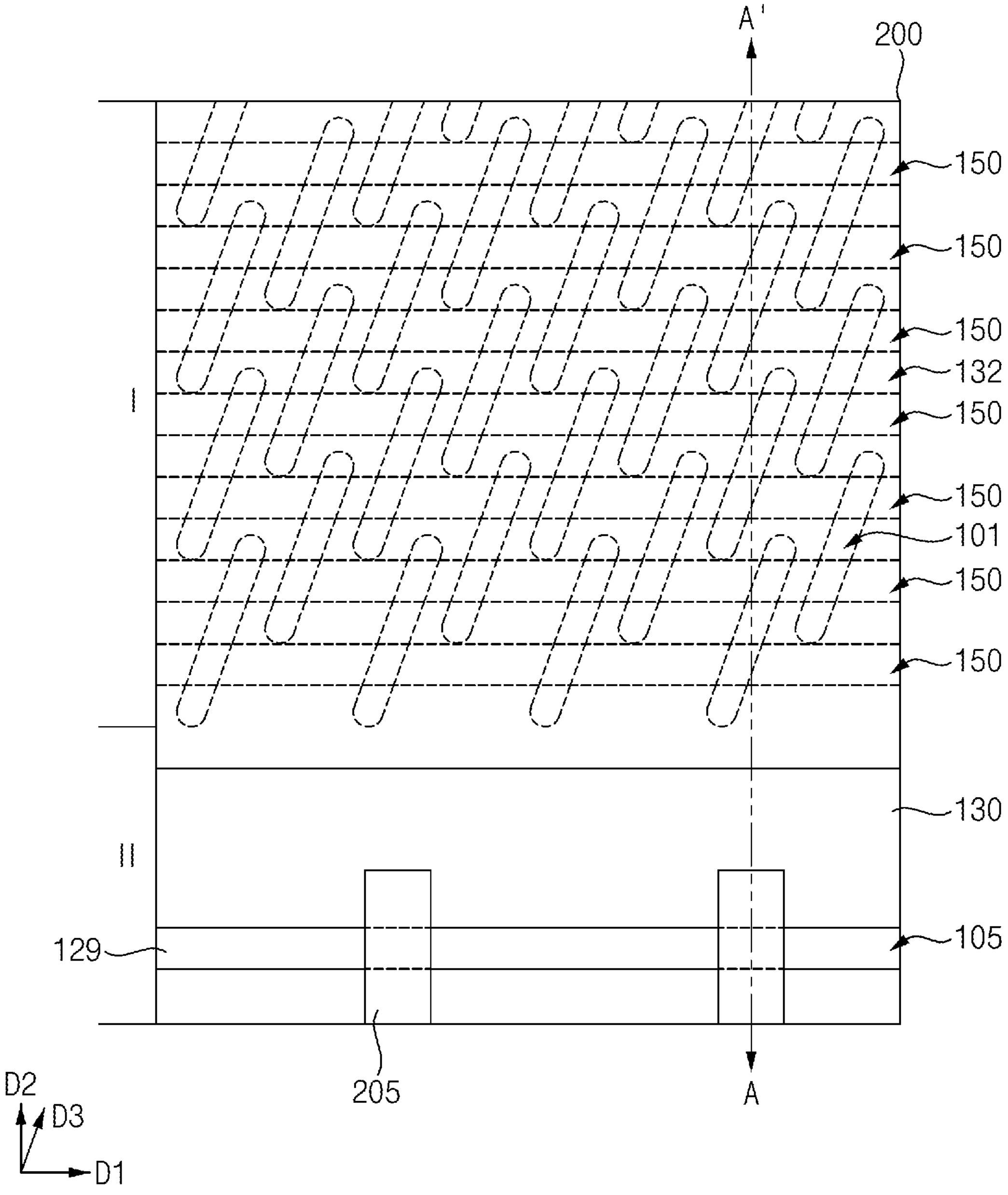
Figure 15:
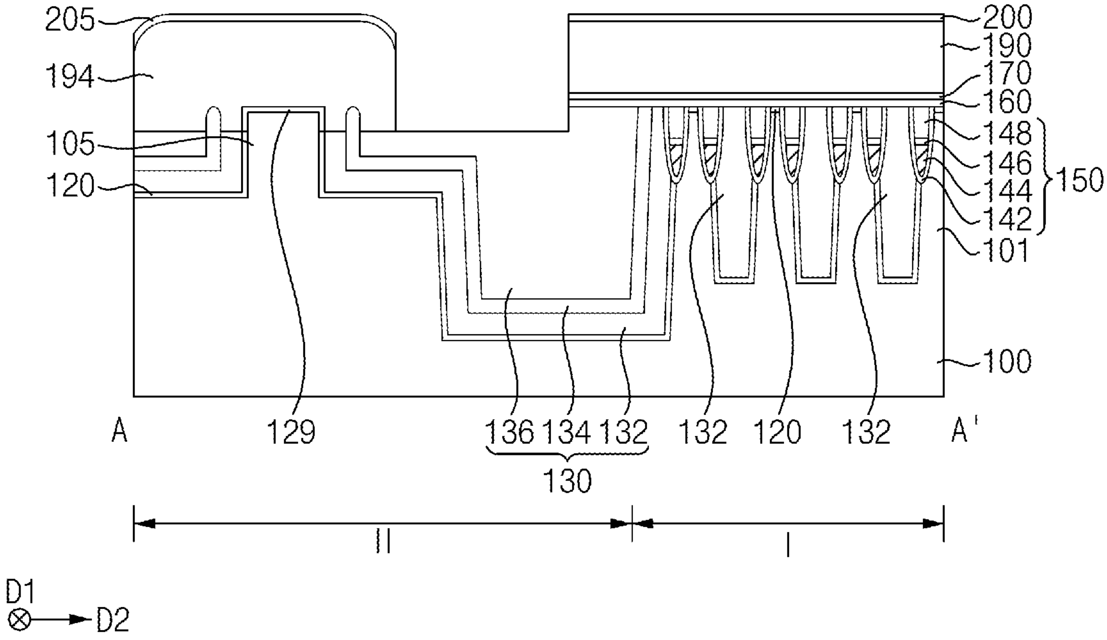

Referring to FIGS. 14 and 15, a dummy gate electrode layer and a dummy gate mask layer may be sequentially stacked on the first etch stop layer 170, the isolation structure 130 and the oxide pattern 129, and may be partially removed to form a dummy gate structure on the second region II of the substrate 100, and a preliminary bit line structure may be formed on the first region I of the substrate 100 and a portion of the second region II adjacent to the first region I of the substrate 100.

The dummy gate electrode layer may include, e.g., polysilicon, and the dummy gate mask layer may include an insulating nitride, e.g., silicon nitride.

The dummy gate structure may include a dummy gate electrode 194 and a dummy gate mask 205 sequentially stacked in the vertical direction, and the preliminary bit line structure may include a preliminary third conductive layer 190 and a sacrificial mask layer 200 sequentially stacked in the vertical direction.

In example embodiments, the dummy gate structure may extend in the second direction D2 on the second region II of the substrate 100 to partially overlap the second active pattern 105 in the vertical direction, and a plurality of dummy gate structures may be spaced apart from each other in the first direction D1. Alternatively, if the second active pattern 105 extends in the second direction D2, the dummy gate structure may extend in the first direction D1, and a plurality of dummy gate structures may be spaced apart from each other in the second direction D2.

The preliminary bit line structure may be on (e.g., may cover) the first region I of the substrate 100 and the portion of the second region II adjacent to the first region I of the substrate 100.

Figure 16:
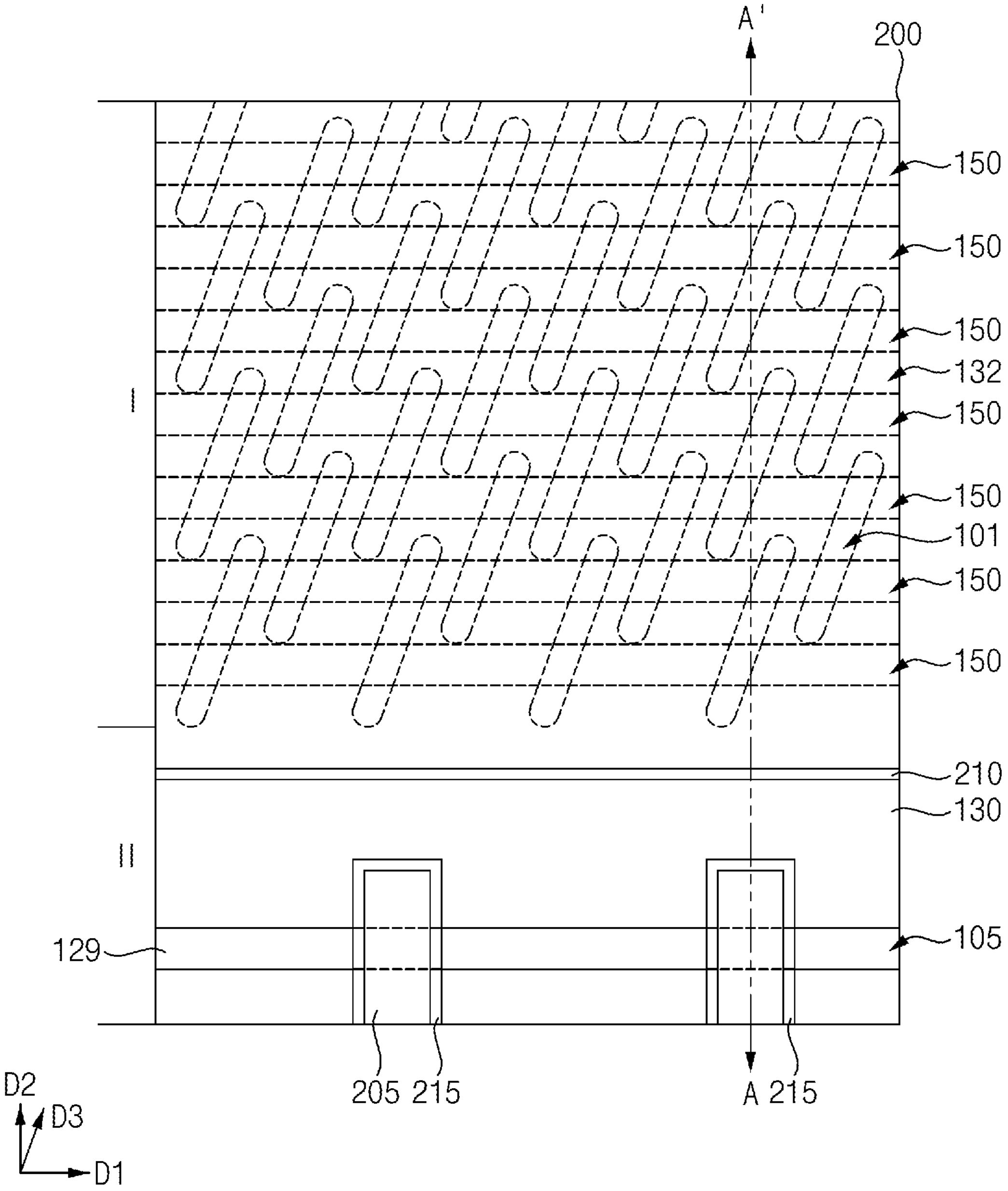
Figure 17:
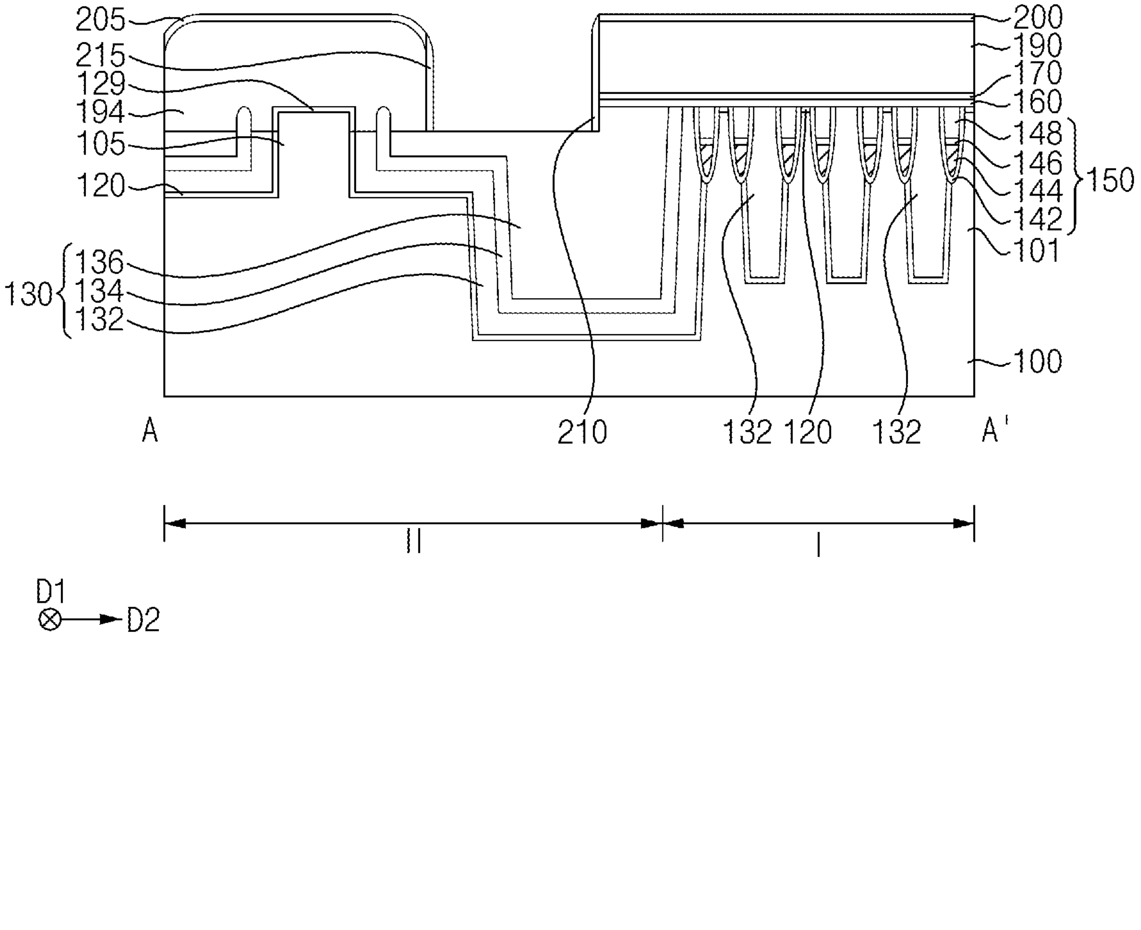

Referring to FIGS. 16 and 17, a first spacer layer may be formed on the dummy gate structure, the preliminary bit line structure, the isolation structure and the oxide pattern 129, and may be anisotropically etched to form first and second spacers 210 and 215 on a sidewall of the preliminary bit line structure and a sidewall of the dummy gate structure, respectively.

In example embodiments, the first spacer layer may include a material substantially the same as a material of the dummy gate mask layer, e.g., an insulating nitride such as silicon nitride, and thus, in some embodiments, the first and second spacers 210 and 215 may be merged with the sacrificial mask layer 200 and the dummy gate mask 205, respectively.

Figure 18:
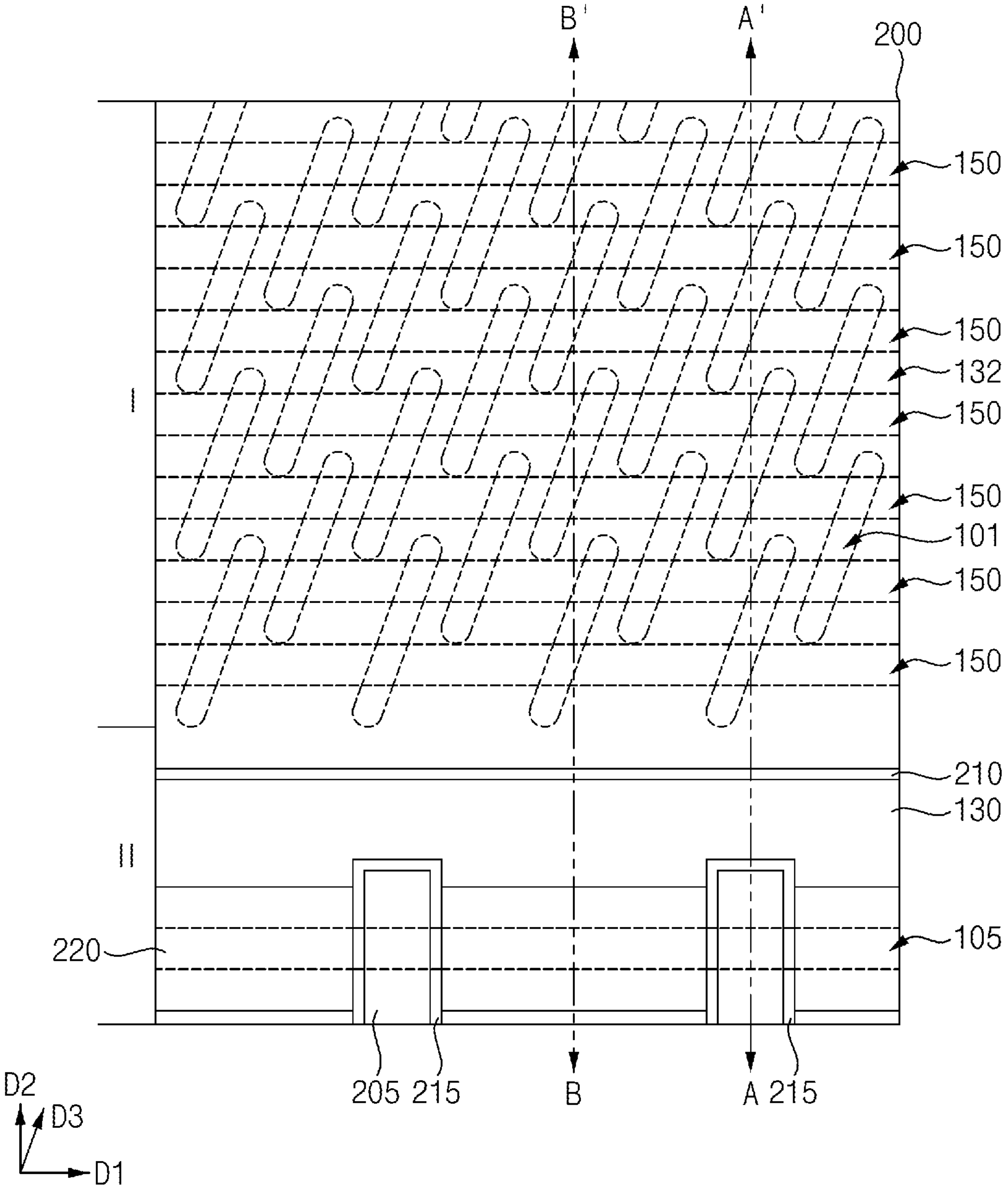
Figure 19:
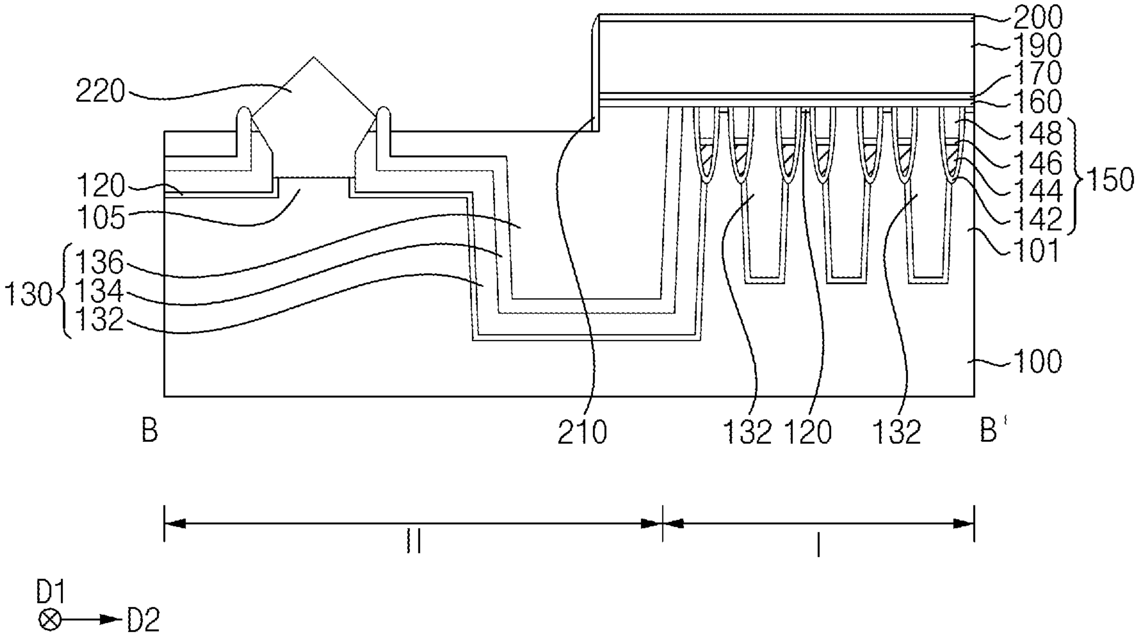

Referring to FIGS. 18 and 19, a portion of the oxide pattern 129 on an upper surface and an upper sidewall of the second active pattern 105 that is not covered by the dummy gate structure and the second spacer 215 and an upper portion of the second active pattern 105 under the portion of the oxide pattern 129 may be removed to form a fifth recess, and a selective epitaxial growth (SEG) process may be performed using an upper surface of a portion of the second active pattern 105 under the fifth recess to form a source/drain layer 220.

In example embodiments, a cross-section in the second direction D2 of the source/drain layer 220 may have a shape of, e.g., a rhombus or a pentagon. If a distance between the second active patterns 105 disposed in the second direction D2 is small, the source/drain layers 220 on neighboring ones of the second active patterns 105 in the second direction D2 may be merged with each other.

Figure 20:
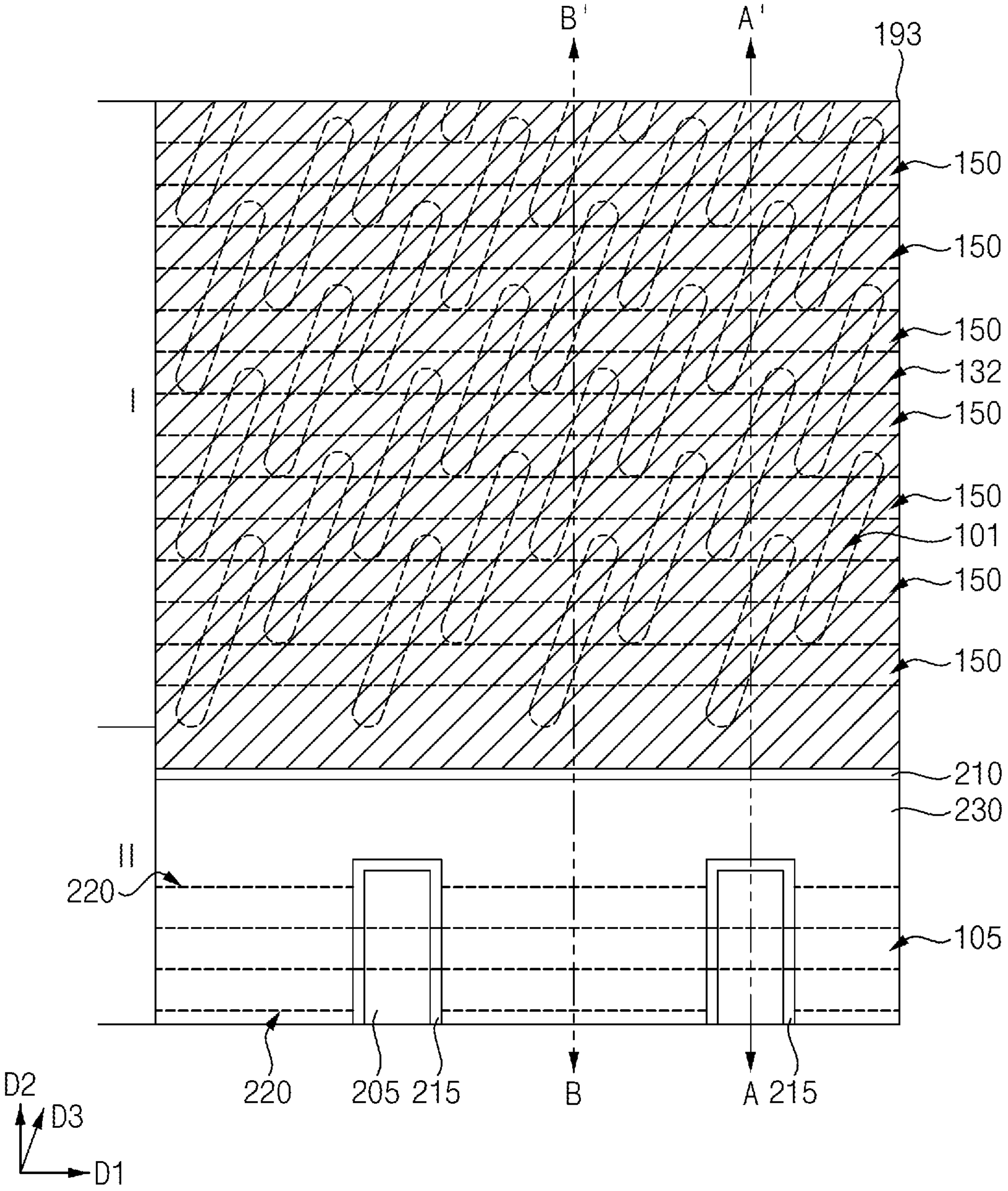
Figure 21:
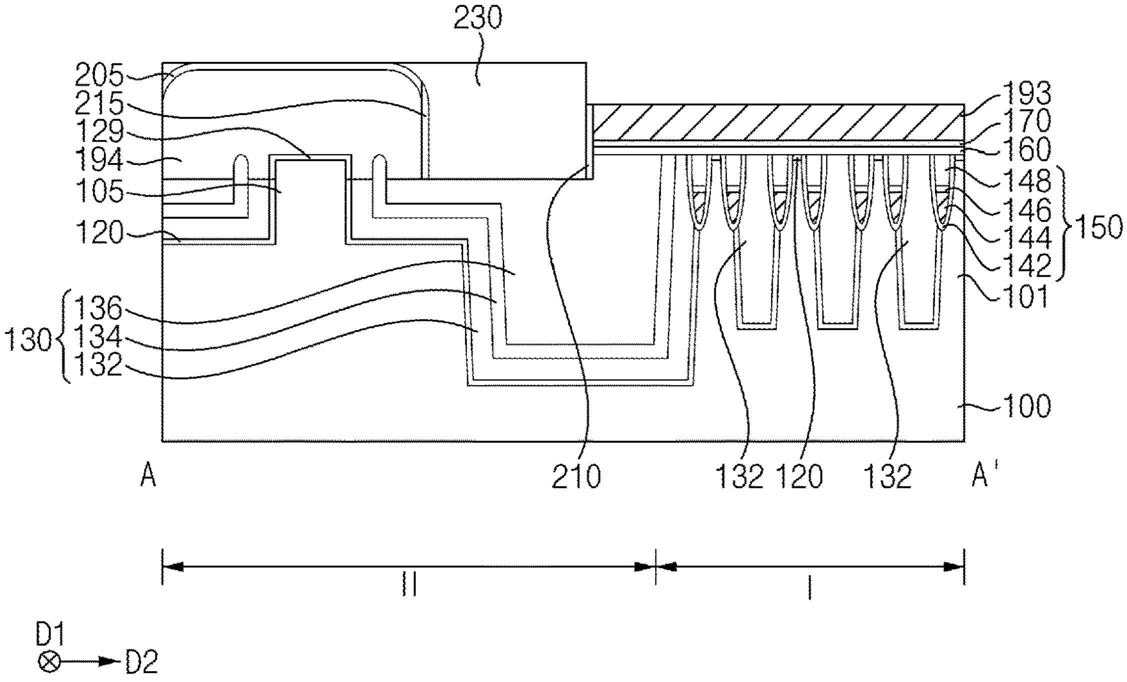
Figure 22:
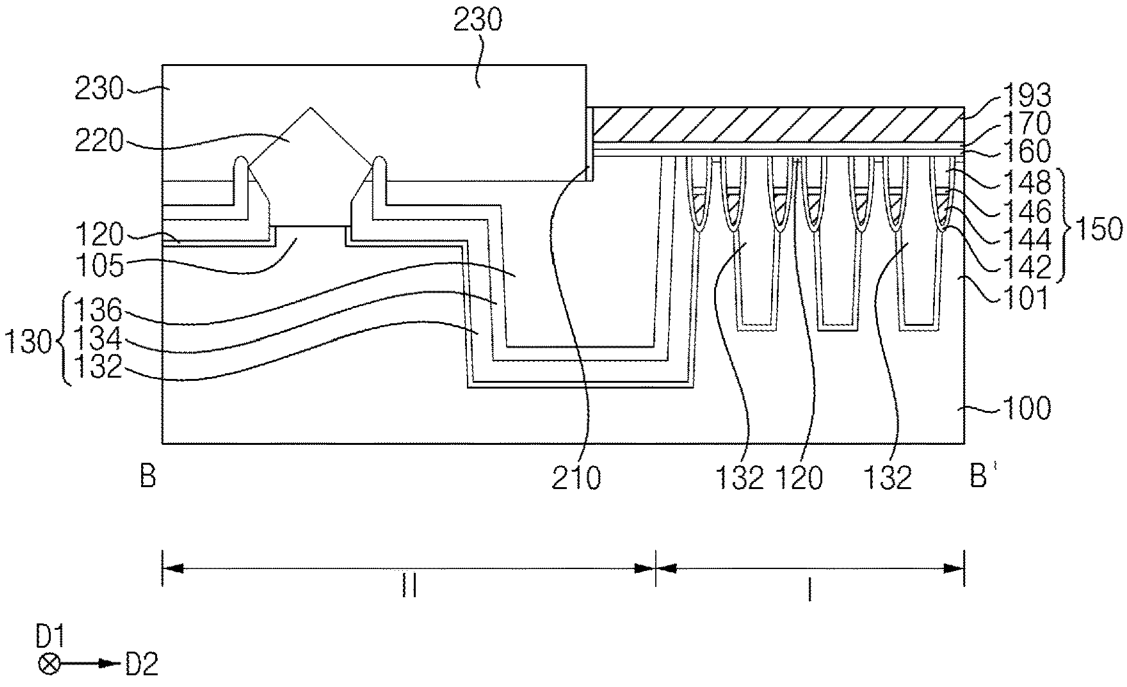

Referring to FIGS. 20 to 22, a first insulating interlayer 230 may be formed on the dummy gate structure, the preliminary bit line structure, the first and second spacers 210 and 215, the isolation structure 130 and the source/drain layer 220, and a planarization process may be performed on the first insulating interlayer 230 until an upper surface of the dummy gate mask is exposed.

The first insulating interlayer 230 may include an oxide, e.g., silicon oxide, and the planarization process may include, e.g., a CMP process and/or an etch back process.

A third etching mask covering the second region II of the substrate 100 may be formed, and the sacrificial mask layer 200 and an upper portion of the preliminary third conductive layer 190 may be removed so that a thickness of the preliminary third conductive layer 190 may decrease.

An ion implantation process may be performed on the preliminary third conductive layer 190 to form a third conductive layer 193 including, e.g., n-type impurities.

The third etching mask may be removed.

Figure 23:
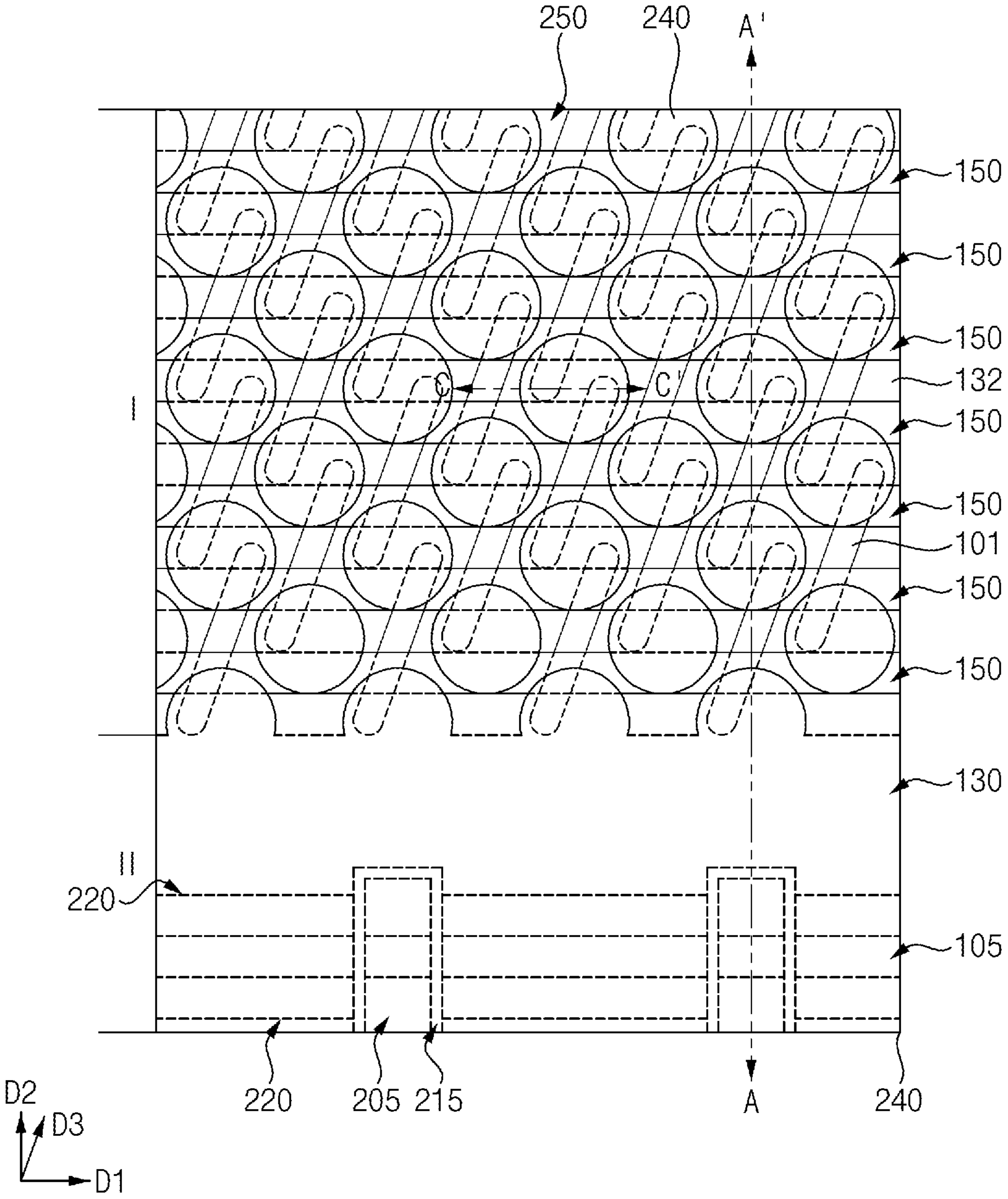
Figure 24:
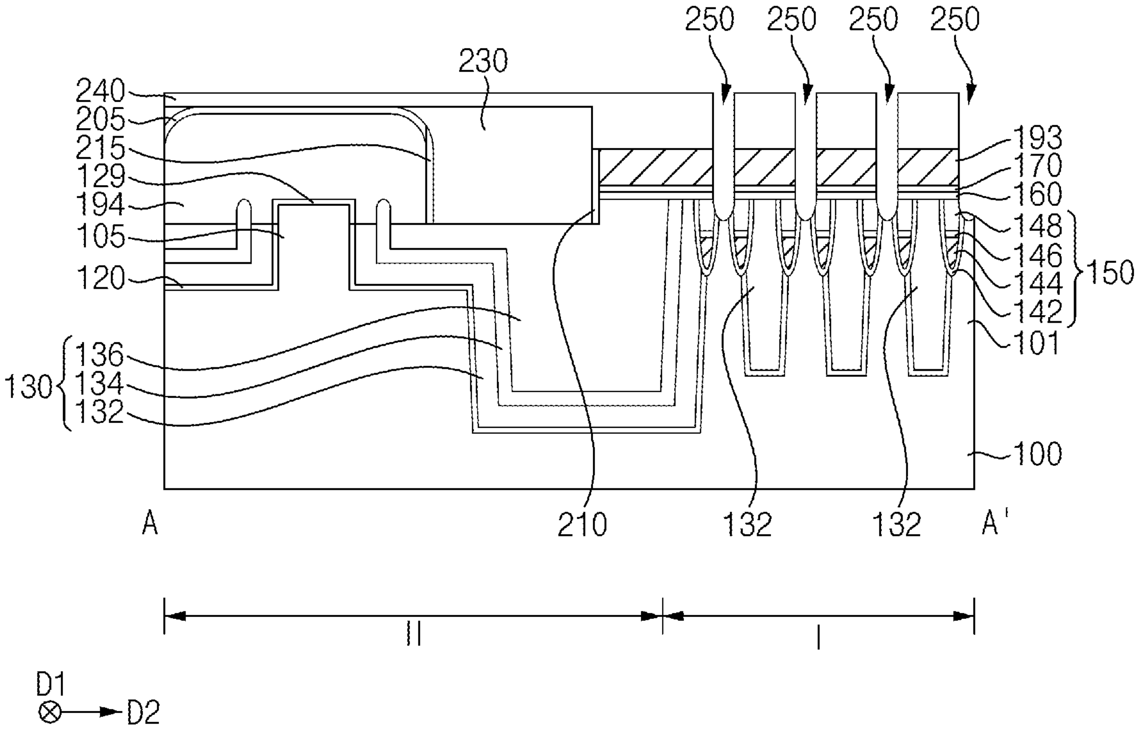
Figure 25:
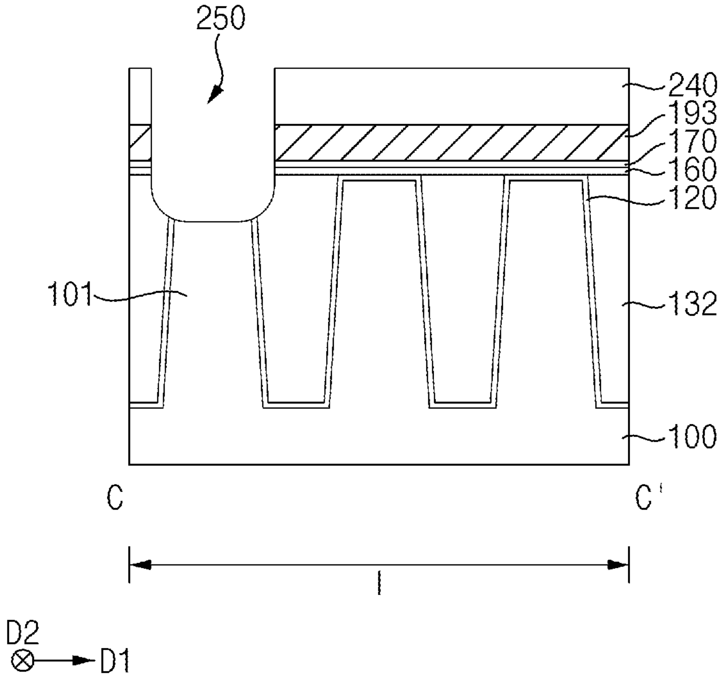

Referring to FIGS. 23 to 25, a second insulating interlayer 240 may be formed on the dummy gate mask 205, the first insulating interlayer 230, the first spacer 210 and the third conductive layer 193, a fourth etching mask may be formed on the second insulating interlayer 240, and an etching process may be performed using the fourth etching mask to pattern a portion of the second insulating interlayer 240 on the first region I of the substrate 100, the third conductive layer 193, the first etch stop layer 170, the buffer layer 160, the polysilicon layer 120 and the first active pattern 101, so that a first opening 250 may be formed.

In example embodiments, after the etching process, a portion of the second insulating interlayer 240 remaining on the first region I of the substrate 100 may have a shape of, e.g., a circle or an ellipse in a plan view, and a plurality of second insulating interlayers 240 may be spaced apart from each other in the first and second directions D1 and D2. Each of the second insulating interlayers 240 may overlap, in the vertical direction, end portions in the third direction D3 of neighboring ones of the first active patterns 101 in the second direction D2. The second insulating interlayer 240 may include an oxide, e.g., silicon oxide, and in some embodiments, the second insulating interlayer 240 may be merged with the first insulating interlayer 230.

The fourth etching mask may be removed.

Figure 26:
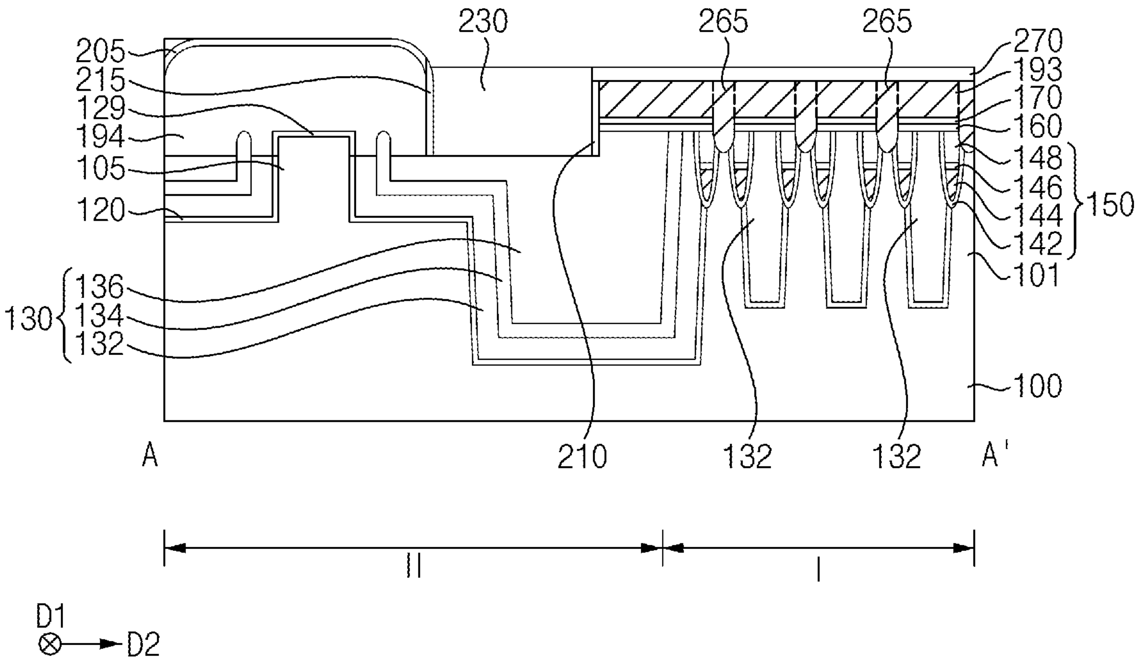
Figure 27:
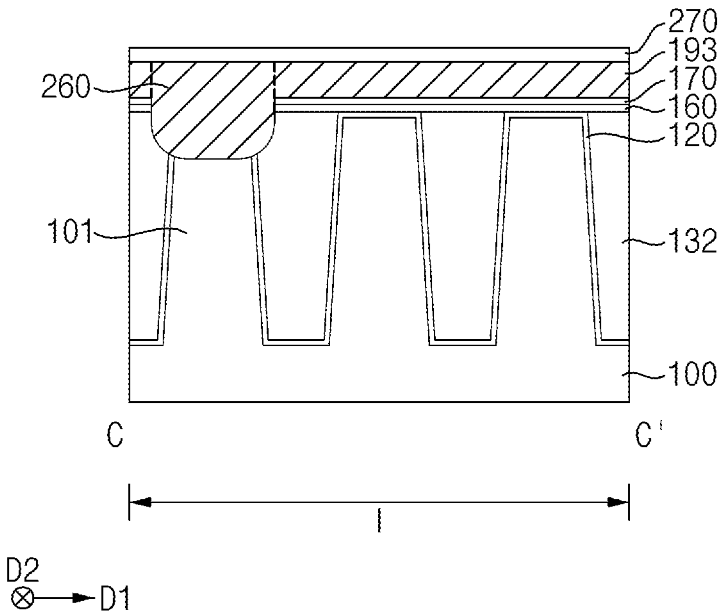

Referring to FIGS. 26 and 27, a bit line contact plug layer may be formed on the first active pattern 101 and the second insulating interlayer 240 to fill the first opening 250, and for example, an etch back process may be performed on the bit line contact plug layer to form a bit line contact plug 265 in a lower portion of the first opening 250.

In example embodiments, an upper surface of the bit line contact plug 265 may be substantially coplanar with an upper surface of the third conductive layer 193. The bit line contact plug 265 may include, e.g., polysilicon doped with n-type impurities, and in some embodiments, the bit line contact plug 265 may be merged with the third conductive layer 193.

A third insulating interlayer may be formed on the bit line contact plug 265 and the second insulating interlayer 240 to fill an upper portion of the first opening 250, and a planarization process may be performed on the third insulating interlayer, the second insulating interlayer 240 and the first insulating interlayer 230.

In example embodiments, after the planarization process, upper surfaces of the third insulating interlayer, the second insulating interlayer 240 and the first insulating interlayer 230 may be lower than an upper surface of the dummy gate electrode 194 (e.g., with a lower surface of the substrate 100 providing a base reference plane).

The third insulating interlayer may include a material substantially the same as a material of the second insulating interlayer 240, e.g., an oxide such as silicon oxide, and in some embodiments, the third insulating interlayer may be merged with the second insulating interlayer 240. Hereinafter, after an upper portion of the merged structure including the third insulating interlayer and the second insulating interlayer 240 is removed, a remaining portion of the merged structure may be referred to as a fourth insulating interlayer 270.

Figure 28:
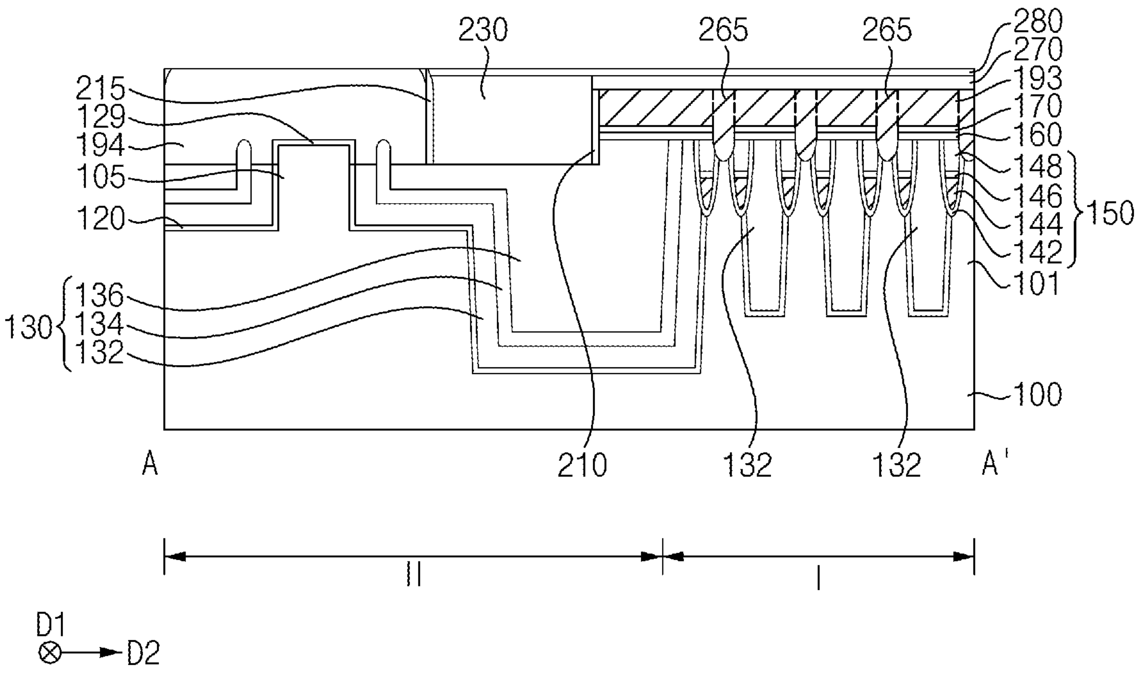

Referring to FIG. 28, a second etch stop layer 280 may be formed on the dummy gate mask 205 and the first and fourth insulating interlayers 230 and 270, and a planarization process may be performed on the second etch stop layer 280.

The second etch stop layer 280 may include a material substantially the same as a material of the dummy gate mask 205, e.g., an insulating nitride such as silicon nitride, and the planarization process may be performed until the upper surface of the dummy gate electrode 194 is exposed. Thus, the second etch stop layer 280 may remain on the first and fourth insulating interlayers 230 and 270.

Figure 29:
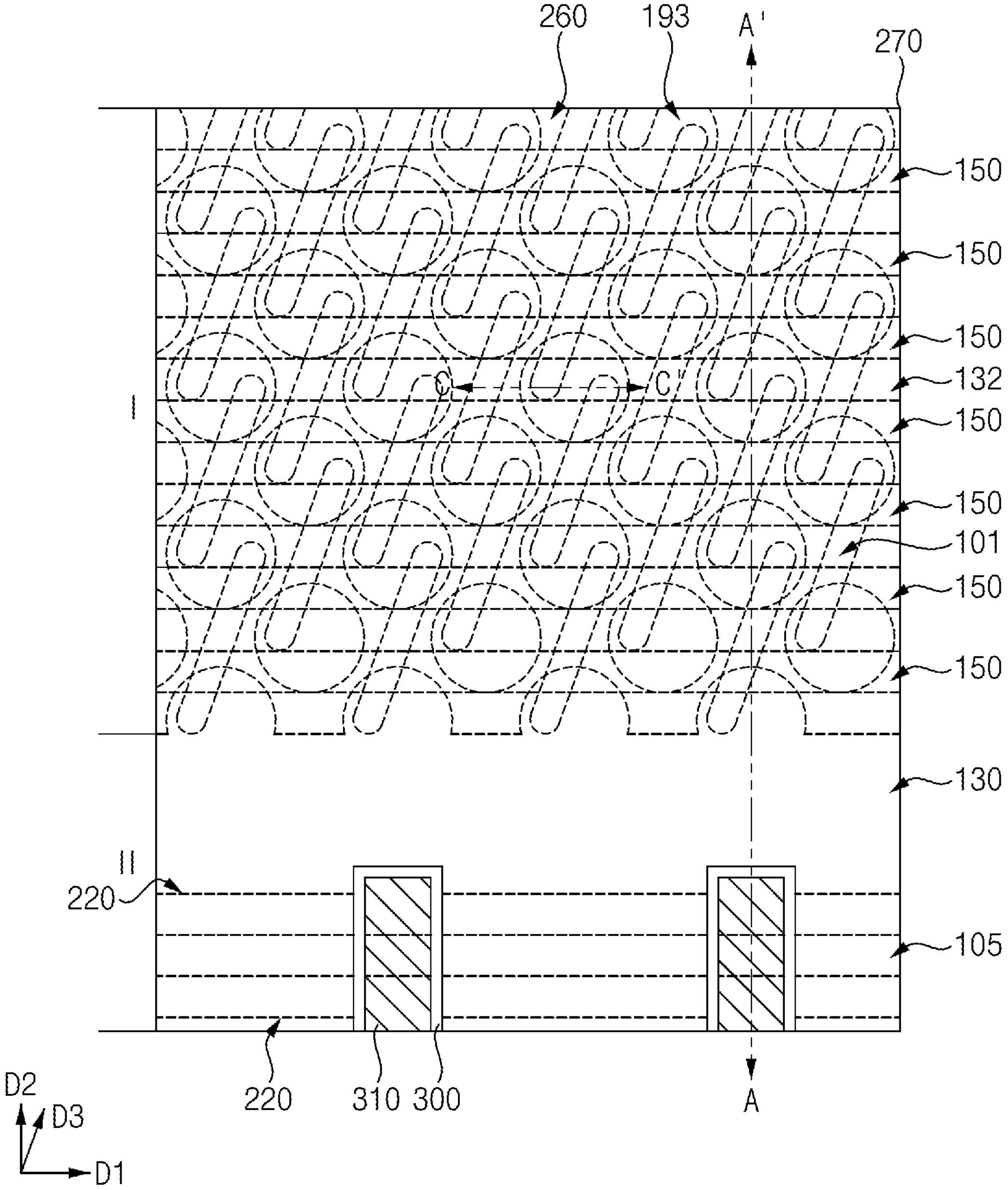
Figure 30:
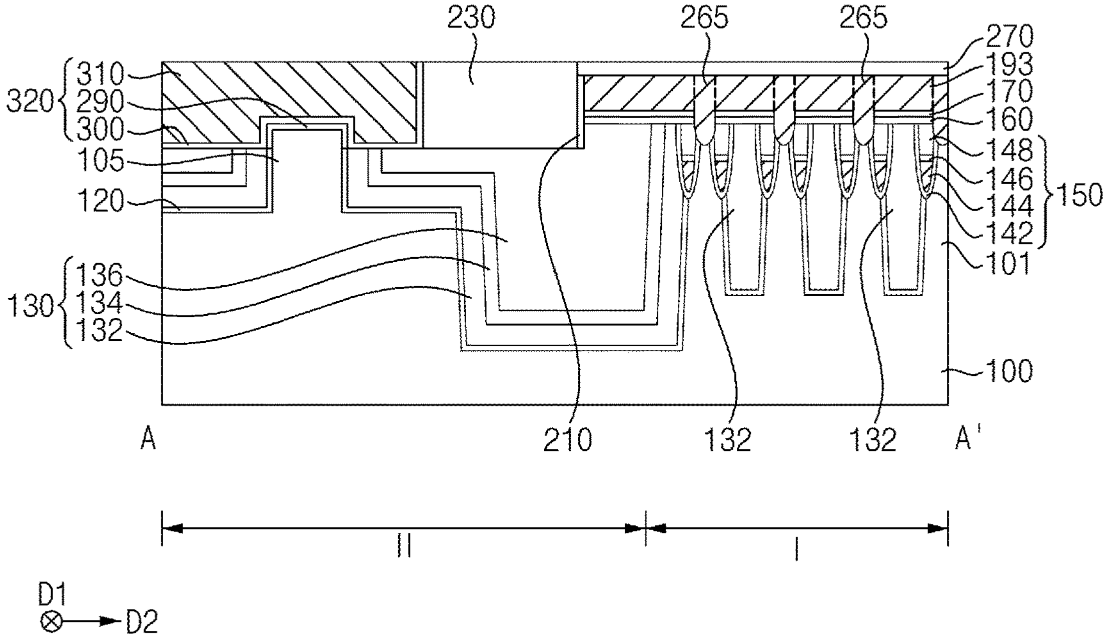

Referring to FIGS. 29 and 30, the exposed dummy gate electrode 194 and the oxide pattern 129 thereunder may be removed by, e.g., a wet etching process and/or a dry etching process to form a second opening, and thus the upper surface and the upper sidewall of the second active pattern 105 may be exposed.

The second etch stop layer 280 may be removed by, e.g., a stripping process using phosphoric acid ($H_3PO_4$), and thus upper surface of the first and fourth insulating interlayers 230 and 270 may be exposed. During the stripping process, the second spacer 215 and the protrusion portion of the second isolation pattern 134 exposed by the second opening may also be removed.

An oxidation process may be performed on the upper surface and the upper sidewall of the second active pattern 105 to form an interface pattern 290. A deposition process may be performed on the interface pattern 290, the isolation structure 130, a sidewall and the upper surface of the first insulating interlayer 230 and the upper surface of the fourth insulating interlayer 270 to form a high-k dielectric layer, and a fourth conductive layer may be formed on the high-k dielectric layer to fill the second opening.

A planarization process may be performed on the fourth conductive layer and the high-k dielectric layer until the upper surfaces of the first and fourth insulating interlayers 230 and 270 are exposed, and thus a fourth conductive pattern 310 and a high-k dielectric pattern 300 may be formed in the second opening.

The planarization process may include a CMP process and/or an etch back process. The interface pattern 290, the high-k dielectric pattern 300 and the fourth conductive pattern 310 may collectively form a second gate structure 320, and the interface pattern 290 and the high-k dielectric pattern 300 may collectively form a second gate insulation pattern.

Alternatively, the interface pattern 290 may be formed not by an oxidation process but by a deposition process, and in this case, the interface pattern 290 may be formed on the upper surface of the isolation structure 130 and the sidewall of the first insulating interlayer 230 as well as the upper surface and the upper sidewall of the second active pattern 105.

Figure 31:
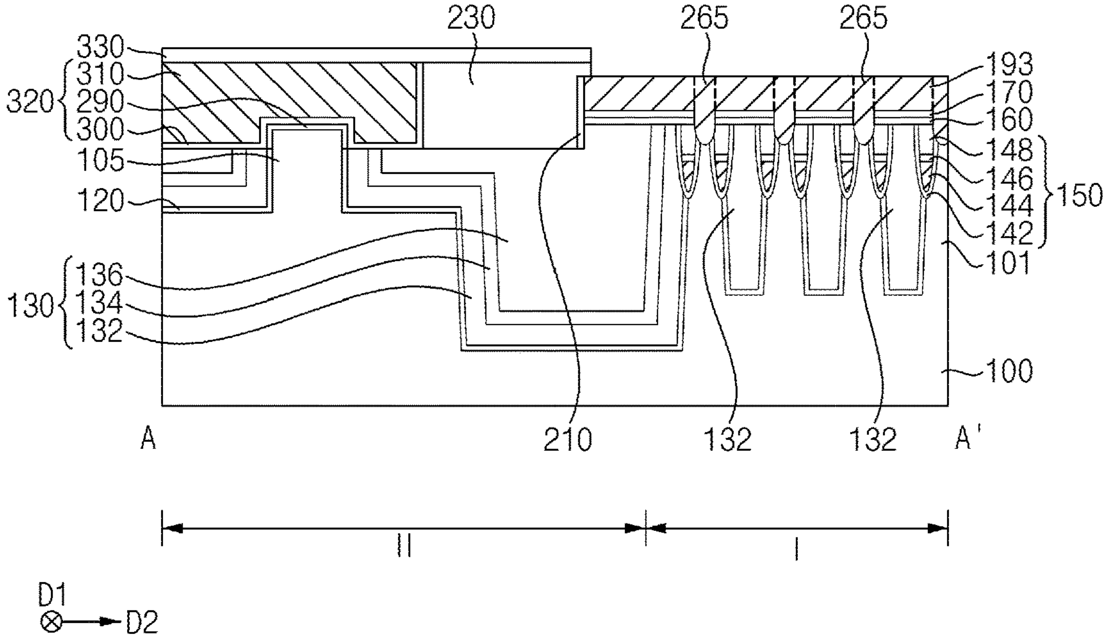

Referring to FIG. 31, a protection layer may be formed on the second gate structure 320 and the first and fourth insulating interlayers 230 and 270, a fifth etching mask may be formed on the protection layer to cover the second region II of the substrate 100, and the protection layer and the fourth insulating interlayer 270 may be etched using the fifth etching mask so that the protection layer may be transformed into a protection pattern 330 and most of the fourth insulating interlayer 270 may be removed to expose an upper surface of the third conductive layer 193.

Hereinafter, a portion of the fourth insulating interlayer 270 remaining on the first spacer 210 after the etching process is considered to be merged with the first insulating interlayer 230 adjacent thereto. The protection pattern 330 may be on (e.g., may cover) upper surfaces of the second gate structure 320 and the first insulating interlayer 230.

The fifth etching mask may be removed.

Figure 32:
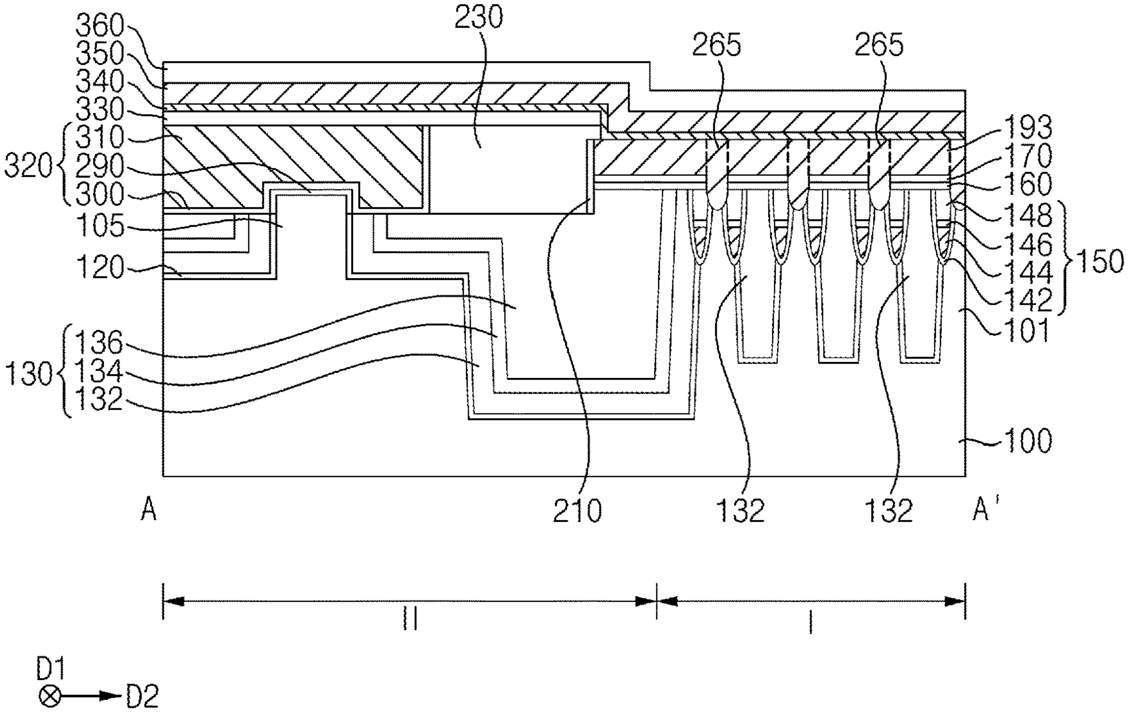

Referring to FIG. 32, a first barrier layer 340, a fifth conductive layer 350 and a second capping layer 360 may be sequentially stacked on the protection pattern 330 and the third conductive layer 193.

The second capping layer 360 may include an insulating nitride, e.g., silicon nitride.

Figure 33:
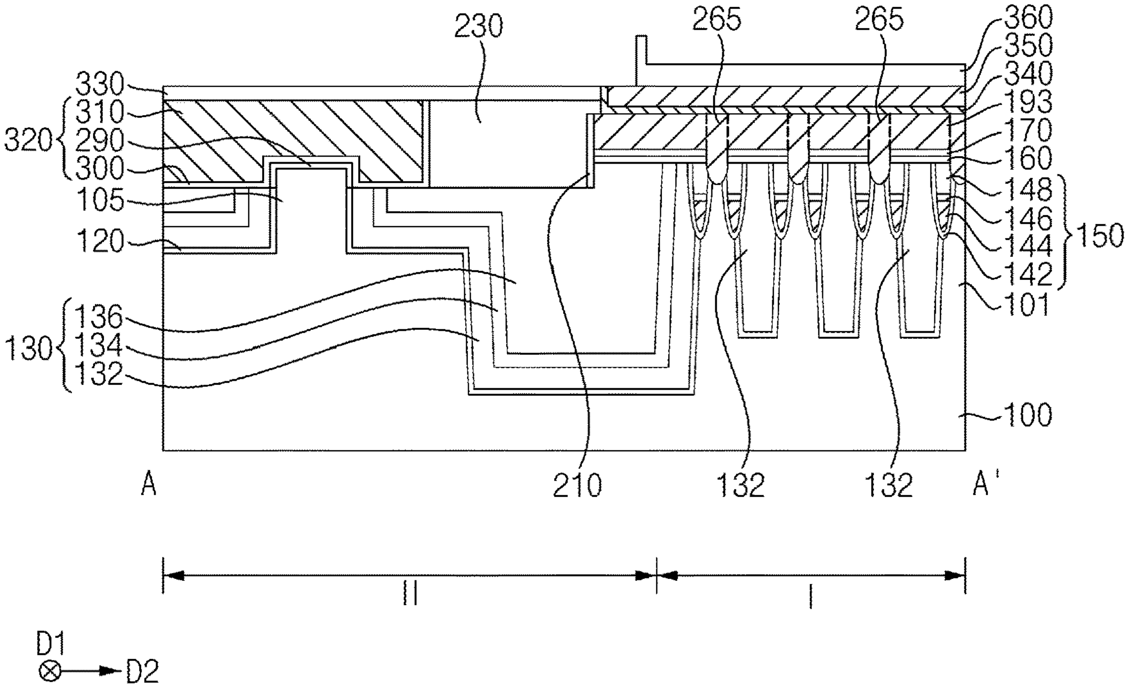

Referring to FIG. 33, a sixth etching mask may be formed on the second capping layer 360 to cover the first region I of the substrate 100 and the portion of the second region II adjacent to the first region I of the substrate 100, and the second capping layer 360, the fifth conductive layer 350 and the first barrier layer 340 may be etched using the sixth etching mask.

Thus, the second capping layer 360, the fifth conductive layer 350 and the first barrier layer 340 may remain on the first region I of the substrate 100 and the portion of the second region II adjacent to the first region I of the substrate 100, and an upper surface of the protection pattern 330, and upper surfaces of portions of the first barrier layer 340 and the fifth conductive layer 350 adjacent to the protection pattern 330 may be exposed.

The sixth etching mask may be removed.

Figure 34:
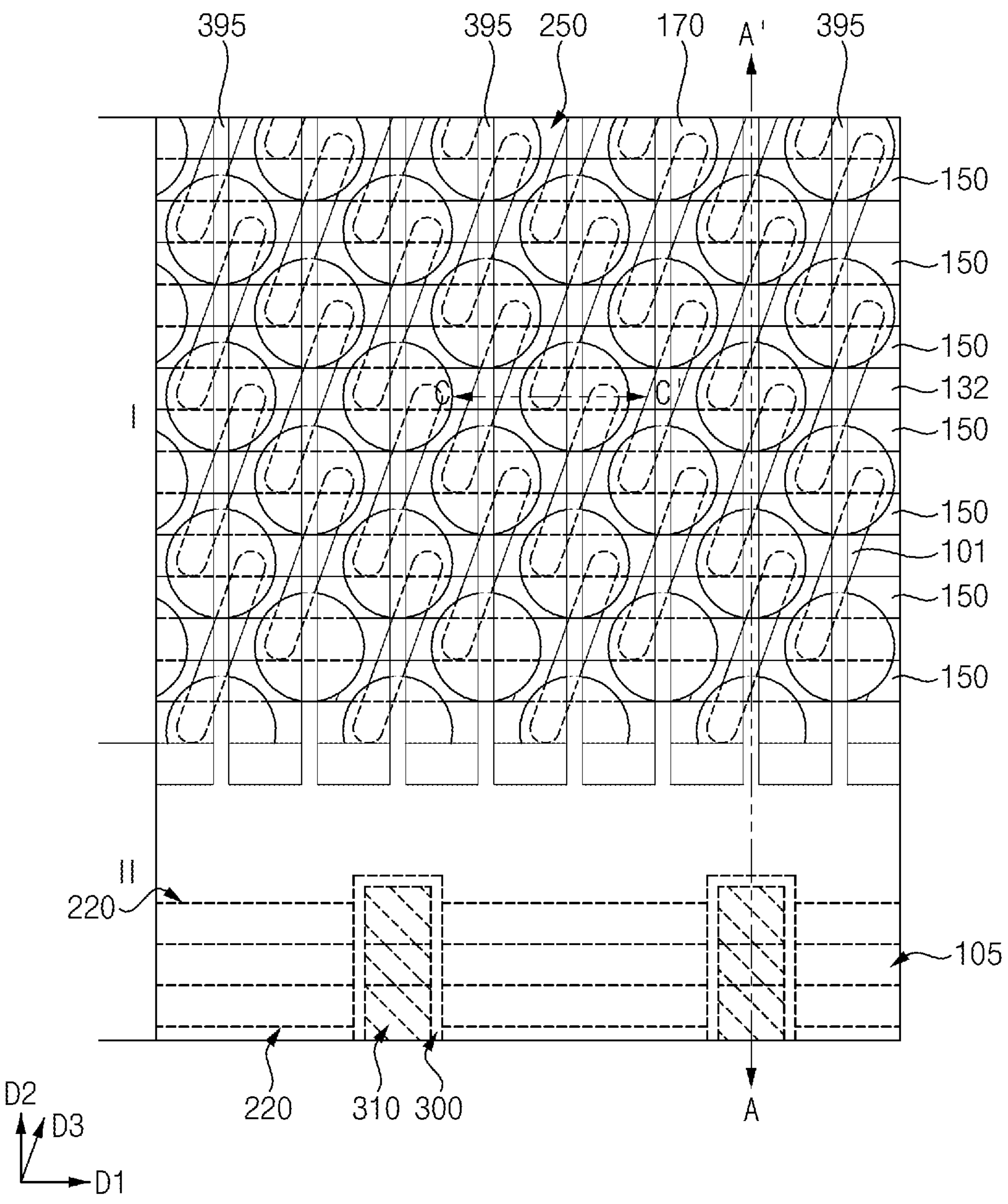
Figure 35:
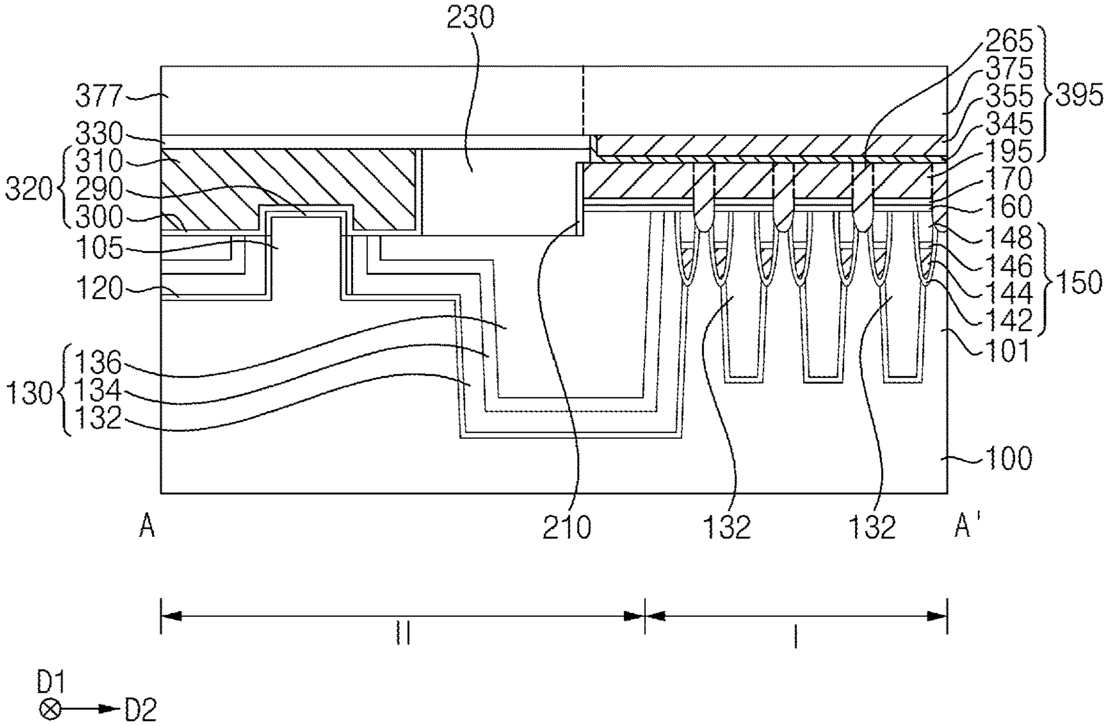
Figure 36:
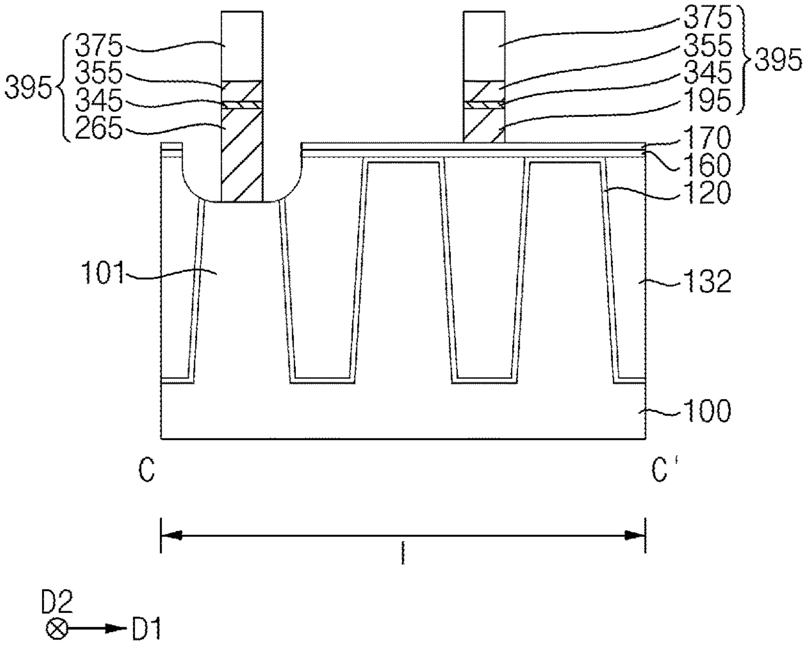

Referring to FIGS. 34 to 36, a third capping layer may be formed on the protection pattern 330, the second capping layer 360, and the exposed portions of the first barrier layer 340 and the fifth conductive layer 350, and a planarization process may be performed on the third capping layer.

The third capping layer may include an insulating nitride, e.g., silicon nitride. In some embodiments, the third capping layer and the second capping layer 360 may be merged with each other, which may be collectively referred to as a fourth capping layer.

A portion of the fourth capping layer on the first region I of the substrate 100 may be patterned to form a fourth capping pattern 375, and a remaining portion of the fourth capping layer on the second region II of the substrate 100 may be referred to as a fifth capping pattern 377. In example embodiments, the fourth capping pattern 375 may extend in the second direction D2, and a plurality of fourth capping patterns 375 may be spaced apart from each other in the first direction D1. Each of the fourth capping patterns 375 may overlap, in the vertical direction, a central portion in the third direction D3 of a corresponding one of the first active patterns 101.

The fifth conductive layer 350, the first barrier layer 340, the third conductive layer 193 and the bit line contact plug 265 on the first region I of the substrate 100 and the portion of the second region II adjacent to the first region I of the substrate 100 may be patterned by an etching process using the fourth and fifth capping patterns 375 and 377 as an etching mask.

Thus, the lower portion of the first opening 250 may be formed again, a bit line contact plug 265, a first barrier pattern 345, a fifth conductive pattern 355 and a fourth capping pattern 375 sequentially stacked in the vertical direction may be formed on the first active pattern 101 exposed by the first opening 250, and a third conductive pattern 195, the first barrier pattern 345, the fifth conductive pattern 355 and the fourth capping pattern 375 sequentially stacked in the vertical direction may be formed on the first etch stop layer 170. The bit line contact plug 265, the third conductive pattern 195, the first barrier pattern 345, the fifth conductive pattern 355 and the fourth capping pattern 375 may collectively form a bit line structure 395.

In example embodiments, the bit line structure 395 may extend in the second direction D2 on the first region I of the substrate 100 and the portion of the second region II adjacent to the first region I of the substrate 100, and a plurality of bit line structures 395 may be spaced apart from each other in the first direction D1.

Figure 37:
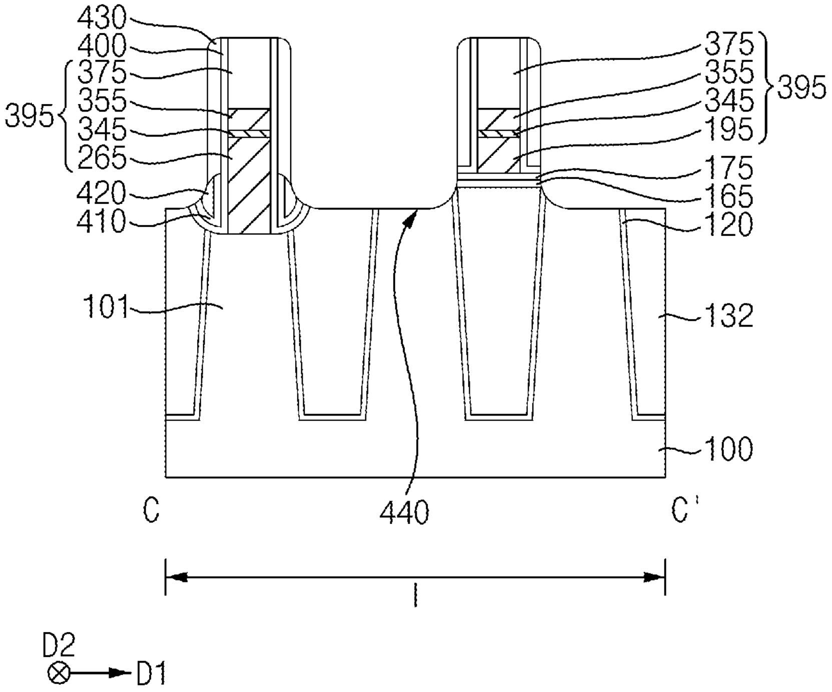

Referring to FIG. 37, a third spacer layer may be formed on an upper surface and a sidewall of the bit line structure 395, an upper surface of the fifth capping pattern 377, an upper surface of the first etch stop layer 170 and an inner wall of the first opening 250, and first and second insulation layers may be sequentially formed on the third spacer layer.

The first and second insulation layers may be etched by an etching process. In example embodiments, the etching process may be performed by a wet etching process using an etching solution, e.g., phosphoric acid ($H_3PO_4$), SC1, HF, etc., and all portions of the first and second insulation layers except for portions of the first and second insulation layers in the first opening 250 may be removed. Thus, most of a surface of the third spacer layer, that is, all portions of the surface of the third spacer layer except for a portion of the surface of the third spacer layer in the first opening 250 may be exposed, and portions of the first and second insulation layers remaining in the first opening 250 may form first and second insulation patterns 410 and 420, respectively. The first and second insulation patterns 410 and 420 may collectively form a first insulation pattern structure.

A fourth spacer layer may be formed on the exposed surface of the third spacer layer and the first and second insulation patterns 410 and 420 in the first opening 250, and may be anisotropically etched to form a fourth spacer 430 on the surface of the third spacer layer and the first and second insulation patterns 410 and 420 to be on (e.g., to cover) a sidewall of the bit line structure 395.

For example, a dry etching process may be further performed to form a third opening 440 exposing the upper surface of the first active pattern 101, and upper surfaces of the first isolation pattern 132, an upper surface of the first gate mask 148 and an uppermost surface of the polysilicon layer 120 may also be exposed by the third opening 440.

By the dry etching process, a portion of the third spacer layer on upper surfaces of the bit line structure 395, the fifth capping pattern 377 and the first etch stop layer 170 may be removed, and thus a third spacer 400 may be formed on the sidewall of the bit line structure 395.

During the dry etching process, the buffer layer 160 and the first etch stop layer 170 may also be partially removed to form a buffer pattern 165 and a first etch stop pattern 175, respectively, under the bit line structure 395, which may collectively form a second insulation pattern structure.

Figure 38:
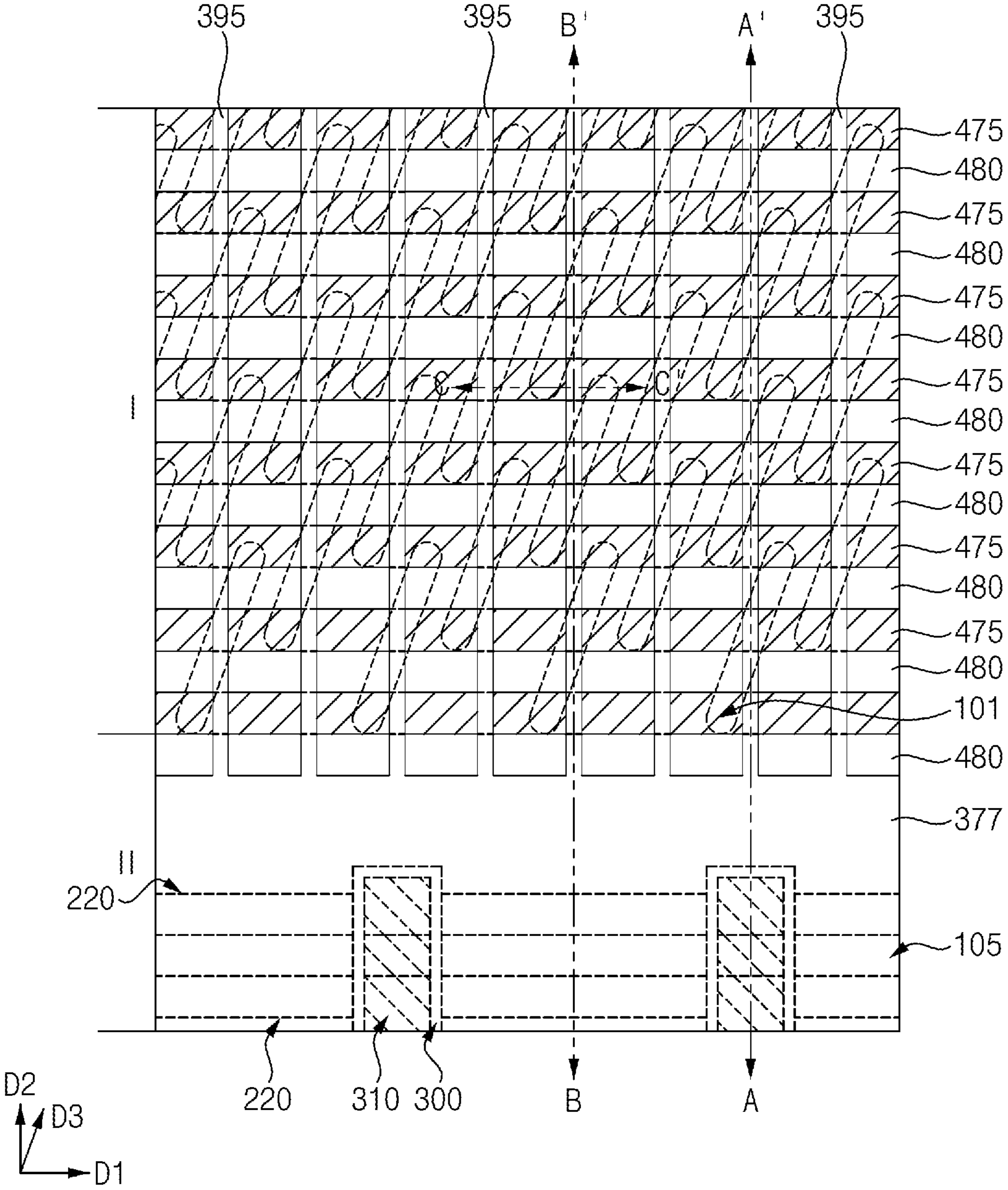
Figure 39:
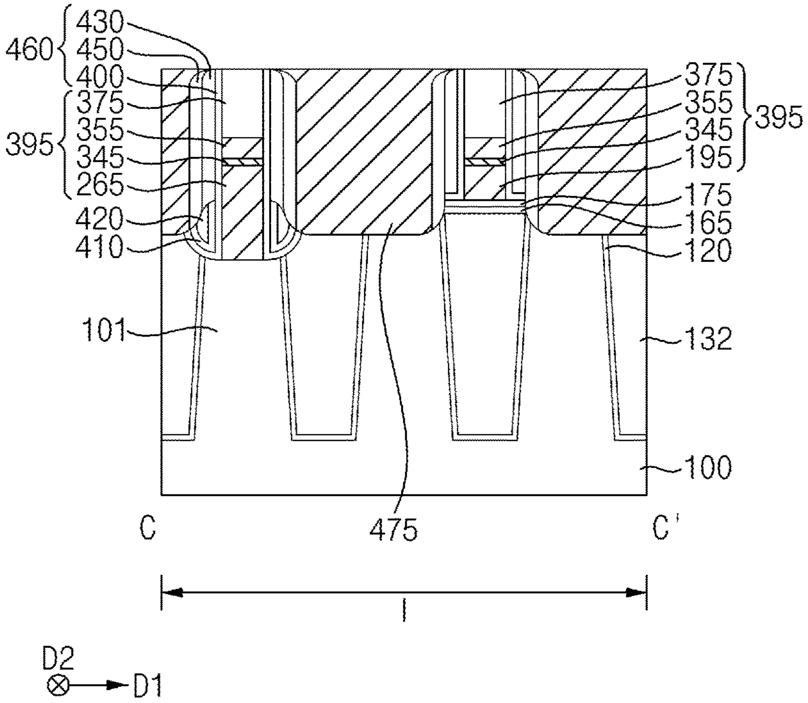

Referring to FIGS. 38 and 39, a fifth spacer layer may be formed on the upper surfaces of the bit line structure 395, the fifth capping pattern 377 and the third spacer 400, an upper surface and an outer sidewall of the fourth spacer 430, a portion of an upper surface of the first insulation pattern structure, and the upper surfaces of the first active pattern 101, the first isolation pattern 132 and the first gate mask 148 exposed by the third opening 440, and may be anisotropically etched to form a fifth spacer 450 on (e.g., covering) an outer sidewall of the fourth spacer 430 on the sidewall of the bit line structure 395.

The third to fifth spacers 400, 430 and 450 sequentially stacked on the sidewall of the bit line structure 395 in the horizontal direction may be collectively referred to as a preliminary spacer structure 460.

A sixth conductive layer may be formed on the substrate 100 to fill the third opening 440, and may be planarized until the upper surfaces of the bit line structure 395 and the fifth capping pattern 377 are exposed to form a lower contact plug 475.

The lower contact plug 475 may extend in the second direction D2 between neighboring ones of the bit line structures 395 in the first direction D1 on the first region I of the substrate 100, and a plurality of lower contact plugs 475 may be spaced apart from each other in the first direction D1. Each of the lower contact plugs 475 may contact an upper surface of an end portion in the third direction D3 of a corresponding first active pattern 101.

A seventh etching mask having fourth openings, each of which may extend in the first direction D1, spaced apart from each other in the second direction D2 may be formed on the bit line structure 395, the fifth capping pattern 377 and the lower contact plug 475, and the lower contact plug 475 may be etched using the seventh etching mask to form a fifth opening.

In example embodiments, each of the fourth openings may overlap the first gate structure 150 in the vertical direction, and thus the fifth opening may expose the upper surface of the first gate mask 148 of the first gate structure 150. As the fifth opening is formed, the lower contact plug 475 extending in the second direction D2 may be divided into a plurality of pieces spaced apart from each other in the second direction D2.

After removing the seventh etching mask, a fence pattern 480 may be formed in the fifth opening. In example embodiments, a plurality of fence patterns 480 may be spaced apart from each other in the second direction D2 between neighboring ones of the bit line structures 395 in the first direction D1.

The lower contact plugs 475 and the fence patterns 480 may be alternately arranged in the second direction D2 by forming the lower contact plug 475 extending in the second direction D2 between neighboring ones of the bit line structures 395 in the first direction D1, forming the fifth openings spaced apart from each other in the second direction D2 through the lower contact plug 475, and forming the fence patterns 480 in the fifth openings, respectively, however, the inventive concepts are not limited thereto.

In other example embodiments, the lower contact plugs 475 and the fence patterns 480 may be alternately arranged in the second direction D2 by forming a fence layer extending in the second direction D2 between neighboring ones of the bit line structures 395 in the first direction D1, forming sixth openings spaced apart from each other in the second direction D2 through the fence layer, and forming the lower contact plugs 475 in the sixth openings, respectively.

In still other example embodiments, the lower contact plugs 475 and the fence patterns 480 may be alternately arranged in the second direction D2 by forming a fourth sacrificial insulation layer extending in the second direction D2 between neighboring ones of the bit line structures 395 in the first direction D1 and including an oxide, e.g., silicon oxide, forming the fence patterns 480 spaced apart from each other in the second direction D2 through the fourth sacrificial insulation layer, removing the fourth sacrificial insulation layer to form seventh openings, and forming the lower contact plugs 475 in the seventh openings, respectively.

Figure 40:
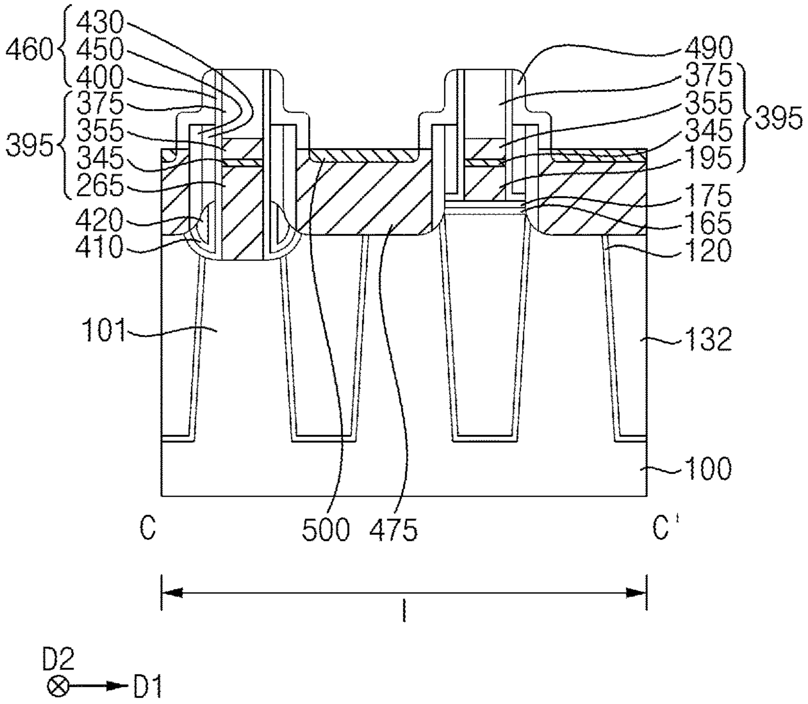

Referring to FIG. 40, an upper portion of the lower contact plug 475 may be removed to expose an upper portion of the preliminary spacer structure 460 on the sidewall of the bit line structure 395, and upper portions of the fourth and fifth spacers 430 and 450 of the exposed preliminary spacer structure 460 may be removed.

An upper portion of the lower contact plug 475 may be further removed. Thus, an upper surface of the lower contact plug 475 may be lower than uppermost surfaces of the fourth and fifth spacers 430 and 450 (e.g., with a lower surface of the substrate 100 providing a base reference plane).

A sixth spacer layer may be formed on the bit line structure 395, the fifth capping pattern 377, the preliminary spacer structure 460, the fence pattern 480 and the lower contact plug 475, and may be anisotropically etched to form a sixth spacer 490 on (e.g., covering) an upper portion of the preliminary spacer structure 460 on each of opposite sidewalls in the first direction D1 of the bit line structure 395. Thus, the upper surface of the lower contact plug 475 may be exposed.

An ohmic contact pattern 500 may be formed on the exposed upper surface of the lower contact plug 475. In example embodiments, the ohmic contact pattern 500 may be formed by forming a metal layer on the bit line structure 395, the fifth capping pattern 377, the third and sixth spacers 400 and 490, the fence pattern 480 and the lower contact plug 475 and performing a heat treatment process on the metal layer. An unreacted portion of the metal layer may be removed.

Figure 41:
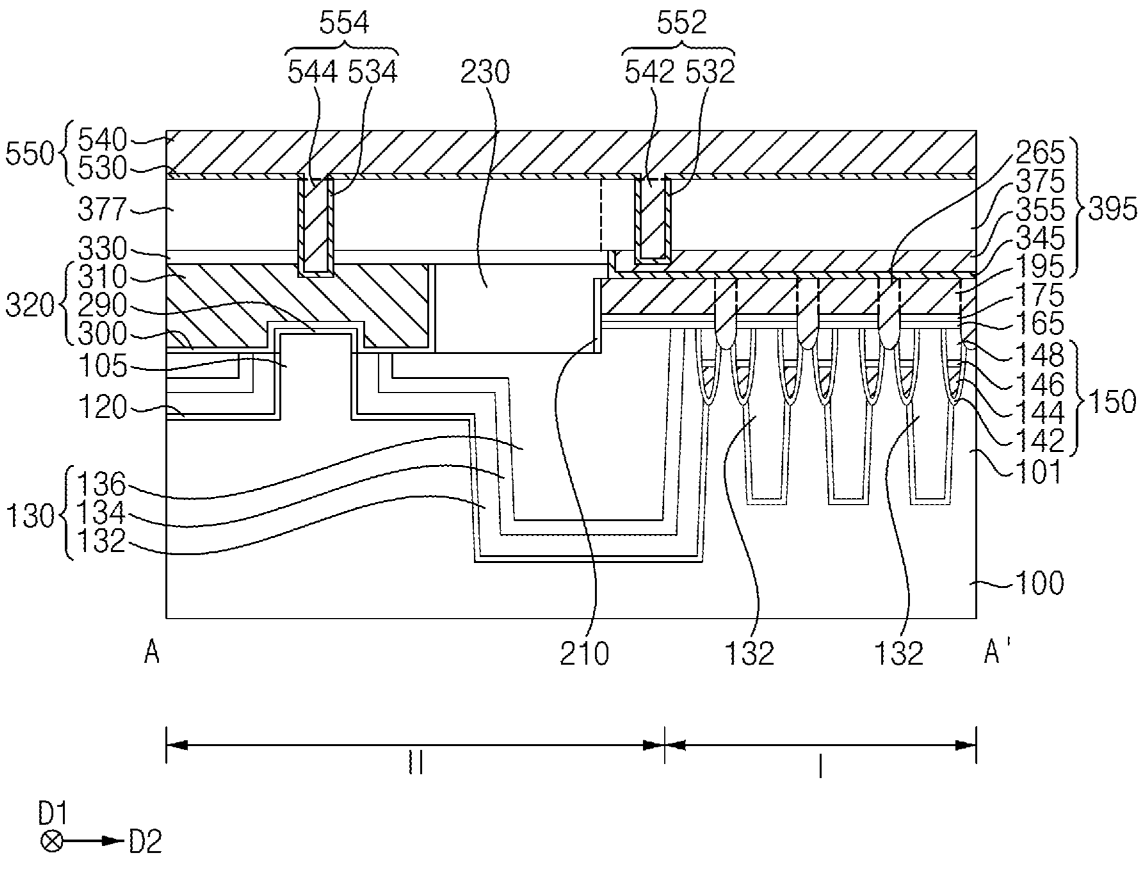
Figure 42:
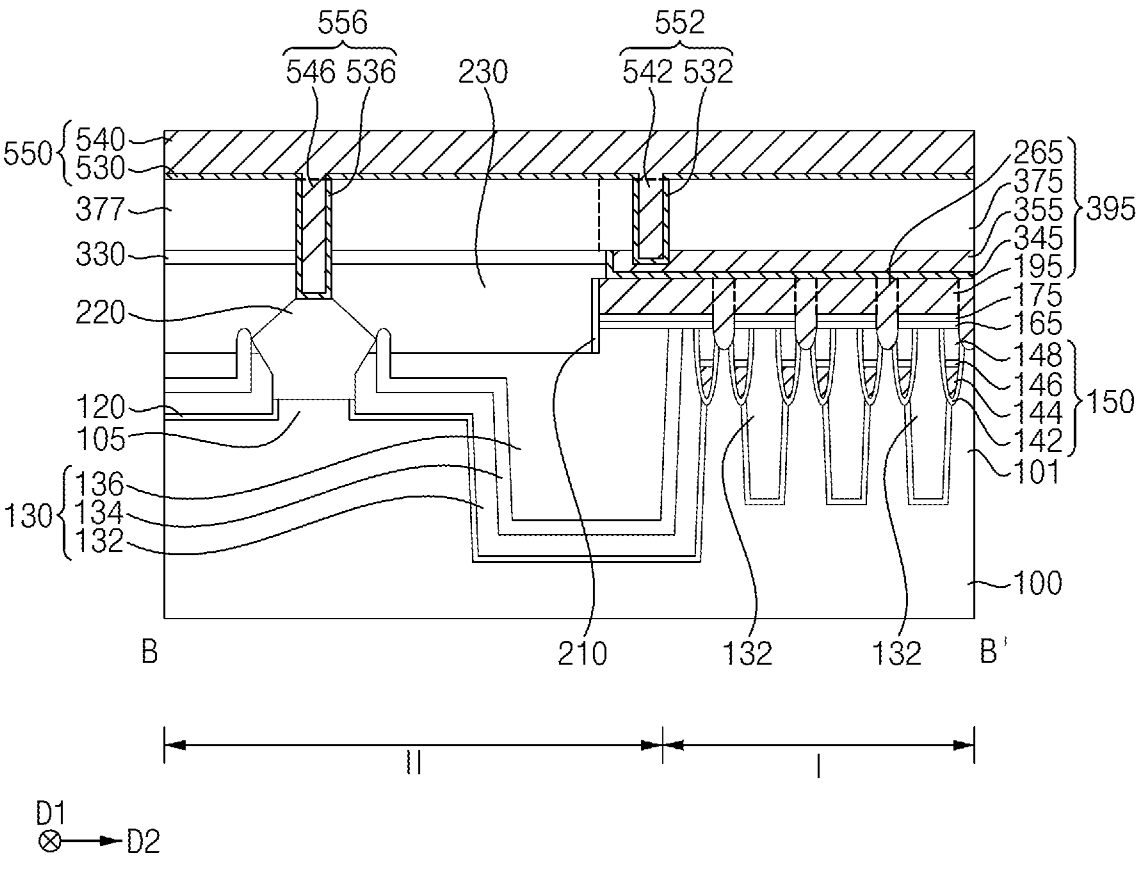
Figure 43:
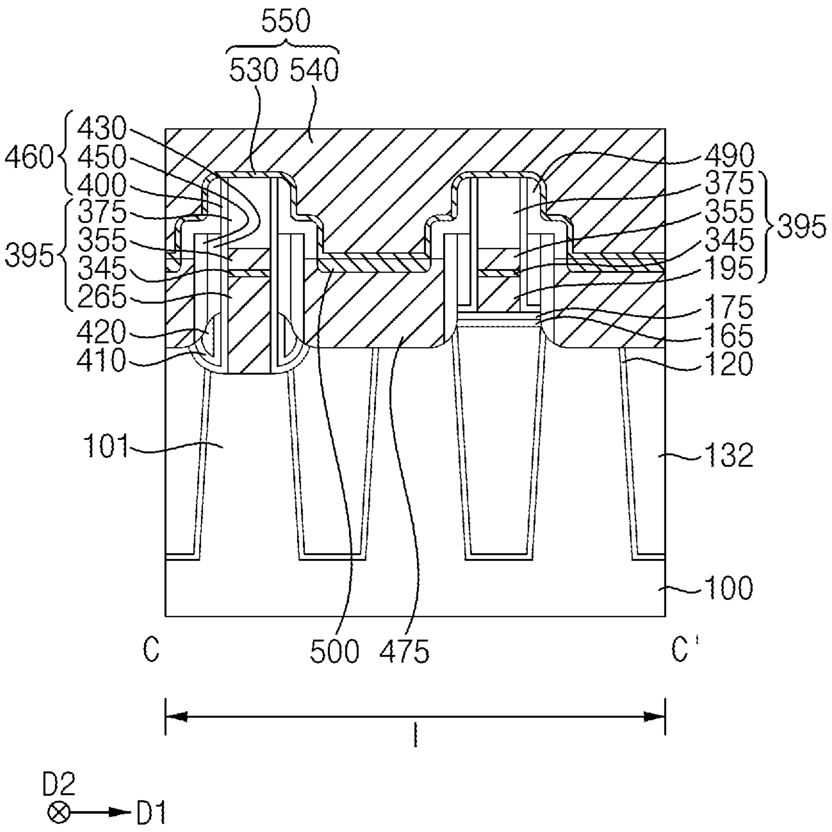

Referring to FIGS. 41 to 43, an eighth opening extending through a portion of the fourth capping pattern 375 to expose an upper surface of the fifth conductive pattern 355 on the portion of the second region II adjacent to the first region I of the substrate 100 in the second direction D2 may be formed, a ninth opening extending through the fifth capping pattern 377 and the protection pattern 330 to expose an upper surface of the second gate electrode 310 may be formed, and a tenth opening extending through the fifth capping pattern 377, the protection pattern 330 and an upper portion of the first insulating interlayer 230 to expose an upper surface of the source/drain layer 220 may be formed, a second barrier layer 530 may be formed on the upper surfaces of the fifth conductive pattern 355, the second gate electrode 310 and the source/drain layer 220 exposed by the eighth to tenth openings, and the upper surfaces of the bit line structure 395, the fifth capping pattern 377, the third and sixth spacers 400 and 490 and the ohmic contact pattern 500, and a seventh conductive layer 540 may be formed to fill the eighth to tenth openings.

Hereinafter, portions of the second barrier layer 530 in the eighth to tenth openings may be referred to as third to fifth barrier patterns 532, 534 and 536, respectively, and portions of the seventh conductive layer 540 in the eighth to tenth openings may be referred to as eight to tenth conductive patterns 542, 544 and 546, respectively. The third barrier pattern 532 and the eighth conductive pattern 542 may collectively form a first contact plug 552, the fourth barrier pattern 534 and the ninth conductive pattern 544 may collectively form a second contact plug 554, and the fifth barrier pattern 536 and the tenth conductive pattern 546 may collectively form a third contact plug 556.

Referring to FIGS. 44 to 47, a seventh conductive layer 540 and a second barrier layer 530 may be patterned.

Thus, an upper contact plug 559 may be formed on the first region I of the substrate 100, and a wiring 551 may be formed on the second region II of the substrate 100. An eleventh opening 567 may be formed between the wirings 551, and a twelfth opening 569 may be formed between the upper contact plugs 559.

The eleventh opening 567 may be formed by partially removing not only the seventh conductive layer 540 and the second barrier layer 530 but also an upper portion of the fifth capping pattern 377, and the twelfth opening 569 may be formed by partially removing not only the seventh conductive layer 540 and the second barrier layer 530 but also the fourth capping pattern 375, the fence pattern 480, the preliminary spacer structure 460 and the sixth spacer 490, and thus may expose an upper surface of the fourth spacer 430.

The wiring 551 may include a seventh conductive pattern 541 and a second barrier pattern 531 on (e.g., covering) a lower surface of the seventh conductive pattern 541, and the upper contact plug 559 may include an eleventh conductive pattern 549 and a sixth barrier pattern 539.

In example embodiments, a plurality of upper contact plugs 559 may be spaced apart from each other in the first and second directions D1 and D2 on the first region I of the substrate 100, and may be arranged in a honeycomb pattern. Each of the upper contact plugs 559 may have a shape of, e.g., a circle, an ellipse, or a polygon in a plan view.

The lower contact plug 475, the ohmic contact pattern 500 and the upper contact plug 559 may collectively form a contact plug structure on the first region I of the substrate 100.

Figure 44:
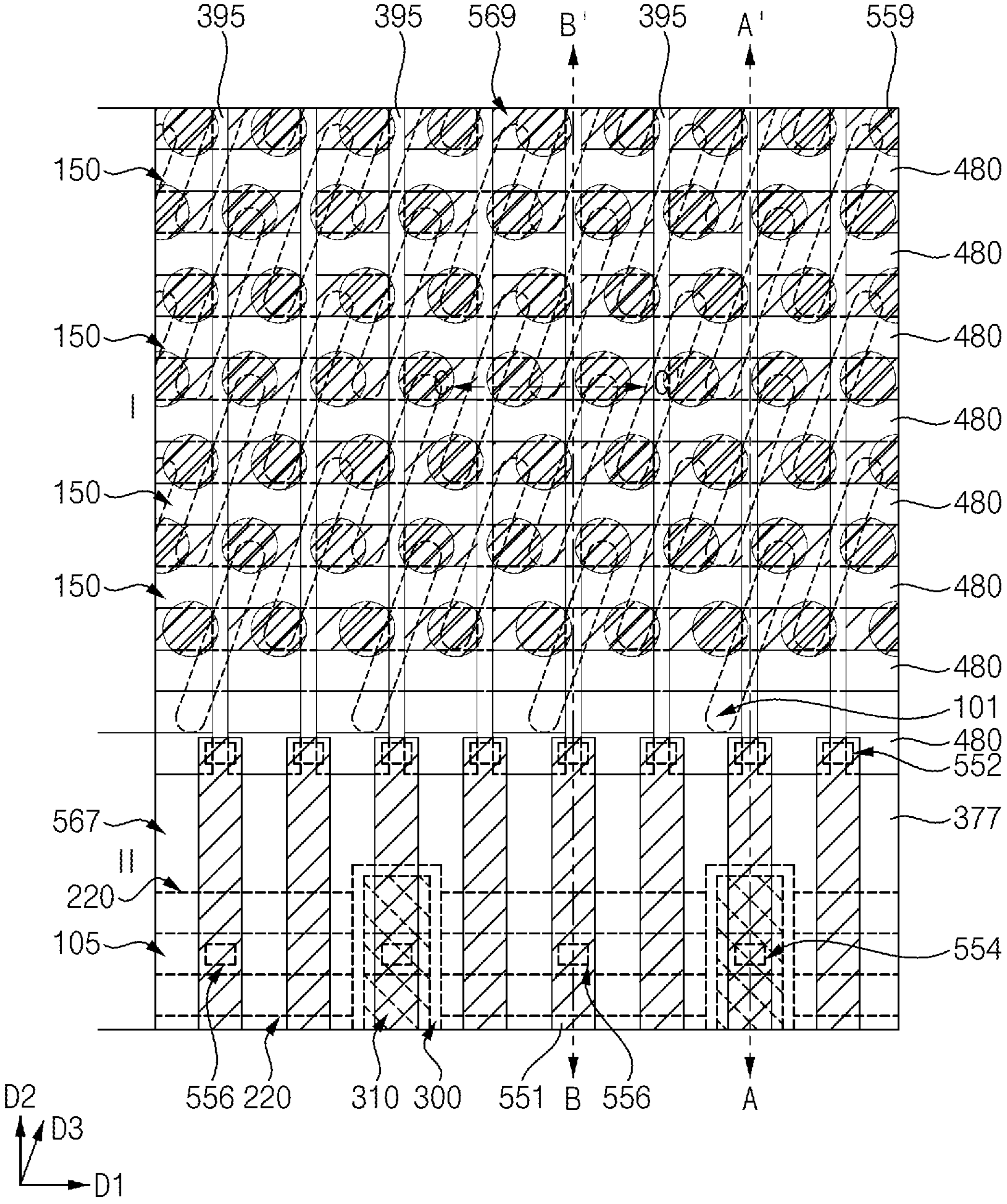
Figure 45:
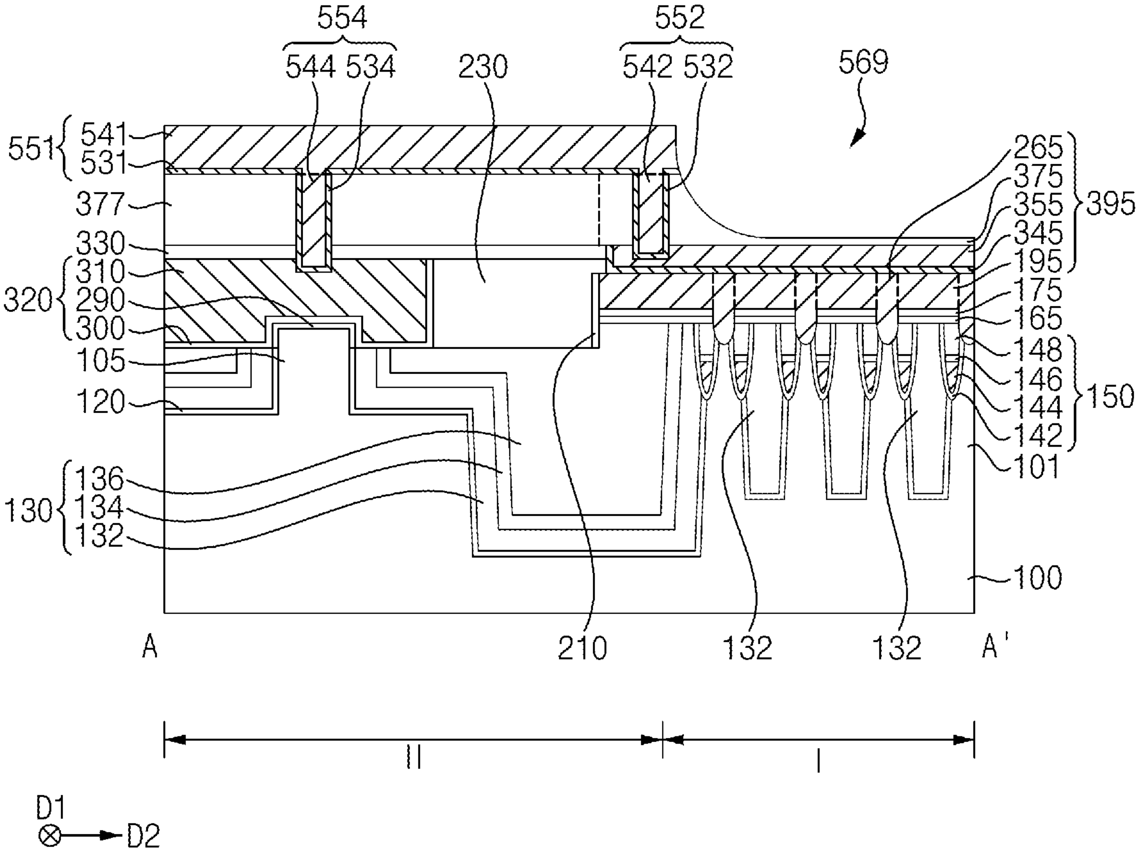
Figure 46:
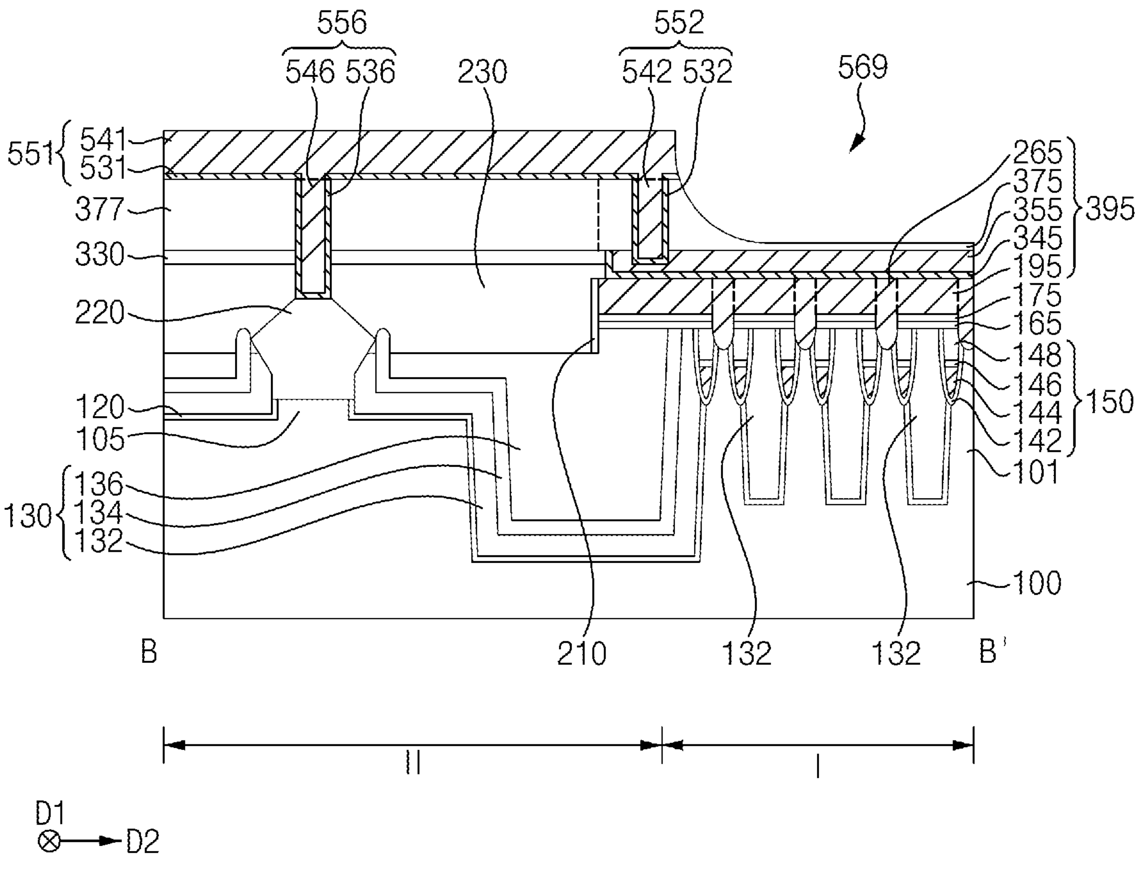
Figure 47:
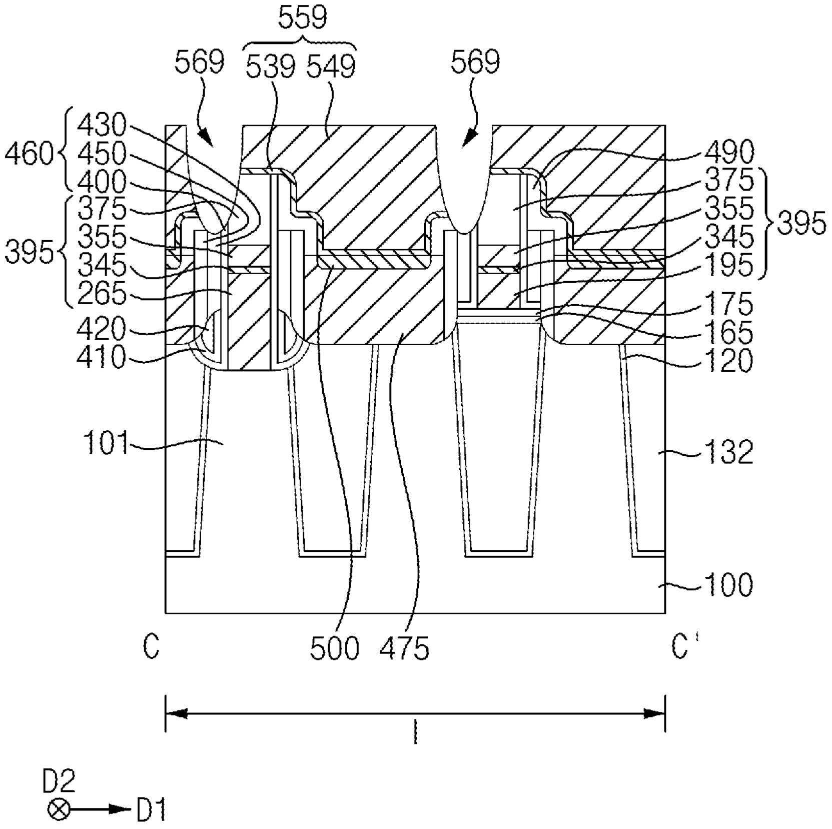

The wirings 551 may have various layouts. FIG. 44 shows that a plurality wirings 551, each of which extends in the second direction D2, are spaced apart from each other in the first direction D1, however, the inventive concepts are not limited thereto.

Referring to FIGS. 1 to 4 again, the fourth spacer 430 may be removed to form an air gap 435 connected to the twelfth opening 569. The fourth spacer 430 may be removed by, e.g., a wet etching process.

In example embodiments, not only a portion of the fourth spacer 430 directly exposed by the twelfth opening 569 may be removed but also other portions of the fourth spacer 430 that are parallel in the horizontal direction thereto may be removed by the wet etching process. That is, not only a portion of the fourth spacer 430 that is exposed by the twelfth opening 569 not to be covered by the upper contact plug 559 may be removed but also a portion of the fourth spacer 430 covered by the upper contact plug 559 may be removed by the wet etching process.

A third insulation pattern structure may be formed to fill the twelfth opening 569.

In example embodiments, the third insulation pattern structure may include sixth and seventh insulation patterns 610 and 620 sequentially stacked. The sixth insulation pattern 610 may be formed using an insulating material having poor gap filling characteristics, and thus the air gap 435 under the twelfth opening 569 may not be filled. The air gap 435 may also be referred to as an air spacer 435, and the third and fifth spacers 400 and 450 and the air spacer 435 may collectively form a spacer structure 465. The air gap 435 may be a spacer including air.

A capacitor 670 may be formed to contact an upper surface of the upper contact plug 559.

That is, a third etch stop layer 630 and a mold layer may be formed on the upper contact plug 559, the third insulation pattern structure and the wiring 551, and may be partially etched to form a thirteenth opening exposing the upper surface of the upper contact plug 559.

A lower electrode layer may be formed on the exposed upper surface of the upper contact plug 559 and the mold layer to fill the thirteenth opening, and may be planarized until the upper surface of the mold layer is exposed to divide the lower electrode layer. For example, a wet etching process may be performed to remove the mold layer, and a lower electrode 640 having a pillar shape may be formed on the upper surface of the upper contact plug 559. Alternatively, the lower electrode 640 may be formed to have a cylindrical shape in the ninth opening.

A dielectric layer 650 may be formed on the lower electrode 640 and the third etch stop layer 630, and an upper electrode 660 may be formed on the dielectric layer 650 to form the capacitor 670 including the lower electrode 640, the dielectric layer 650 and the upper electrode 660 on the first region I of the substrate 100.

Contact plugs and upper wirings may be further formed to be electrically connected to the capacitor 670, the bit line structure 395 and the wiring 551, so that the fabrication of the semiconductor device may be completed.

As illustrated above, the second active pattern 105 may be formed on the second region II of the substrate 100, the first active pattern 101 may be formed on the first region I of the substrate 100, and the first gate structure 150 may be formed on the first region I of the substrate 100. The dummy gate electrode layer may be formed on the first and second regions I and II of the substrate 100, and may be patterned to form the preliminary third conductive layer 190 and the dummy gate electrode 194, respectively.

The source/drain layer 220 may be formed on the second active pattern 105 adjacent to the dummy gate electrode 194, the thickness of the preliminary third conductive layer 190 may be reduced, and an ion implantation process may be performed on the preliminary third conductive layer 190 to form the third conductive layer 193. The bit line contact plug 265 may be formed through the third conductive layer 193 to contact the upper surface of the first active pattern 101, the dummy gate electrode 194 may be removed, and the second gate structure 320 may be formed.

The first barrier layer 340, the fifth conductive layer 350 and the fourth capping layer may be formed on the third conductive layer 193 and the bit line contact plug 265, and may be patterned to form the bit line structure 395. The contact plug structure may be formed between the bit line structures 395, and the capacitor 670 may be formed on the contact plug structure to manufacture the semiconductor device including the FinFET on the second region II of the substrate 100.

Figure 48:
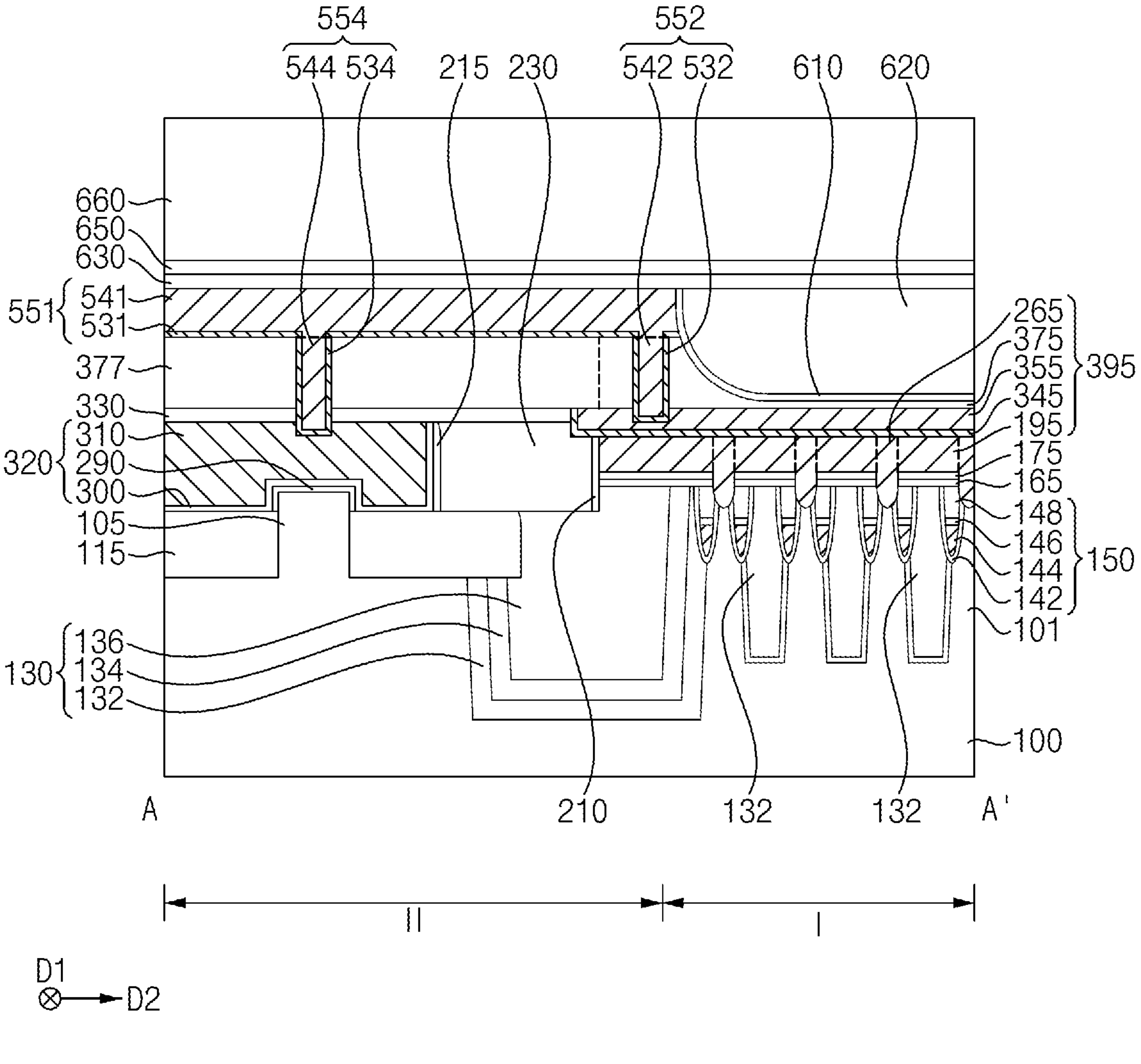
FIG. 48 is a cross-sectional view illustrating a semiconductor device in accordance with example embodiments.

FIG. 48 is a cross-sectional view illustrating a semiconductor device in accordance with example embodiments, which may correspond to FIG. 2.

This semiconductor device may be substantially the same as or similar to that of FIGS. 1 to 4, except for some elements, and thus repeated explanations are omitted herein.

Referring to FIG. 48, the lower sidewall of the second active pattern 105 may be covered by a fifth insulating interlayer pattern 115 instead of the isolation structure 130.

For example, the isolation structure 130 and the fifth insulating interlayer pattern 115 may both be on the lower sidewall of the second active pattern 105, and the fifth insulating interlayer pattern 115 may between the isolation structure 130 and the lower sidewall of the second active pattern 105.

The fifth insulating interlayer pattern 115 may be formed on the second region II of the substrate 100, and may also be formed on a portion of the isolation structure 130. Thus, the second gate structure 320 may be formed on the second active pattern 105 and the fifth insulating interlayer pattern 115. For example, the fifth insulating interlayer pattern 115 may be between the isolation structure 130 and the second gate structure 320. The fifth insulating interlayer pattern 115 may include an oxide, e.g., silicon oxide.

The second spacer 215 may be formed on the sidewall of the second gate structure 320, and may contact the sidewall of the first insulating interlayer 230. The second spacer 215 may include a material substantially the same as a material of the first spacer 210.

An end portion in the second direction D2 of the first barrier pattern 345 included in the bit line structure 395 on the second region II of the substrate 100 may be on (e.g., may cover) the upper surface of the first spacer 210 and a portion of the upper surface of the first insulating interlayer 230. Accordingly, the end portion of the first barrier pattern 345 and the end portion of the third conductive pattern 195 on the second region II of the substrate 100 may have a staircase shape. That is, the end portion of the first barrier pattern 345 and the end portion of the third conductive pattern 195 on the second region II of the substrate 100 may collectively have a stepped profile.

FIGS. 49 to 53 are cross-sectional views illustrating a method of manufacturing a semiconductor device in accordance with example embodiments.

This method may include processes substantially the same as or similar to those illustrated with reference to FIGS. 1 to 47, and thus repeated explanations thereof are omitted herein.

Figure 49:
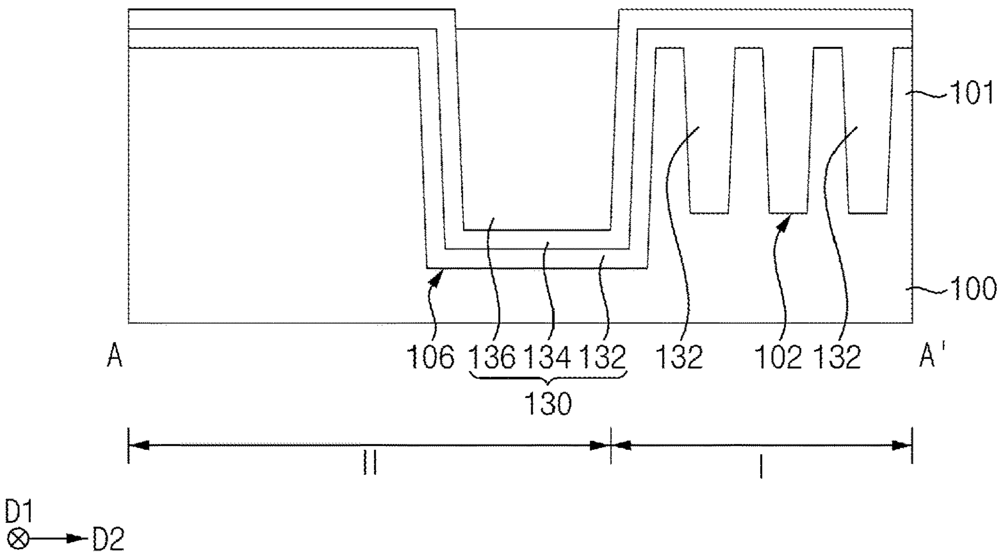
FIGS. 49 to 53 are cross-sectional views illustrating a method of manufacturing a semiconductor device in accordance with example embodiments.

Referring to FIG. 49, processes substantially the same as or similar to those illustrated with reference to FIGS. 5 to 9 may be performed to form the first active pattern 101 on the first region I of the substrate 100, and the isolation structure 130 may be formed on the first and second regions I and II of the substrate 100.

However, the formation of the second active pattern 105 on the second region II of the substrate 100 may not be performed, and the second isolation pattern 134 included in the isolation structure 130 may be formed on an upper surface of a portion of the first isolation pattern 132 on the first and second regions I and II of the substrate 100 as well as on an upper surface of a portion of the first isolation pattern 132 in the third recess 106.

Figure 50:
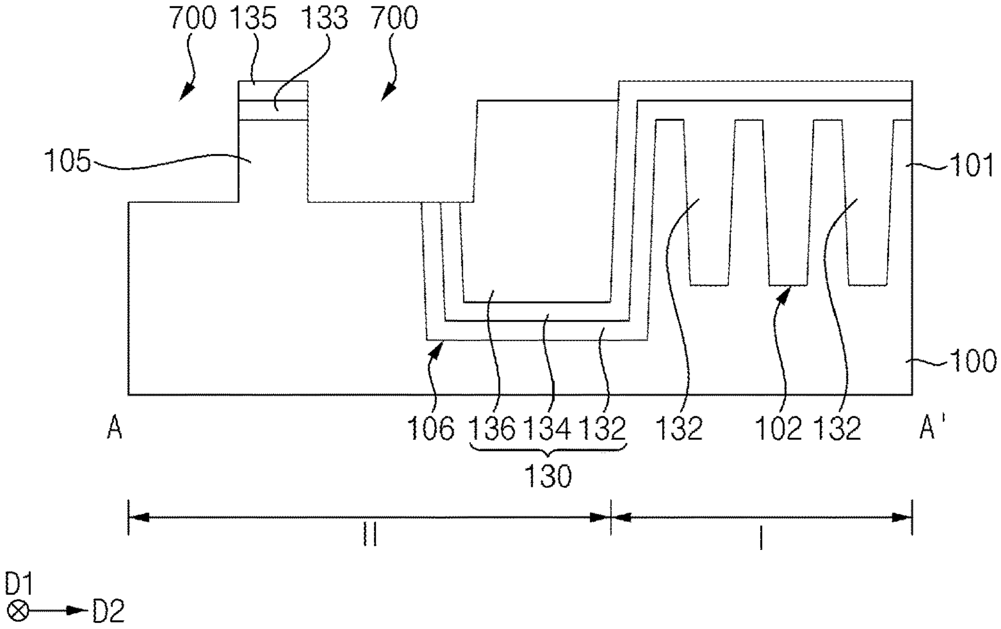

Referring to FIG. 50, an eighth etching mask may be formed on the isolation structure 130 to cover the first region I of the substrate 100 and a portion of the second region II of the substrate 100, and the isolation structure 130 and the second region II of the substrate 100 may be partially etched by an etching process using the eighth etching mask to form the second active pattern 105 on the second region II of the substrate 100.

During the etching process, portions of the first and second isolation patterns 132 and 134 on the second active pattern 105 may be transformed into first and second insulation masks 133 and 135, respectively, and a sixth recess 700 may be formed on the second region II of the substrate 100.

The eighth etching mask may be removed.

Figure 51:
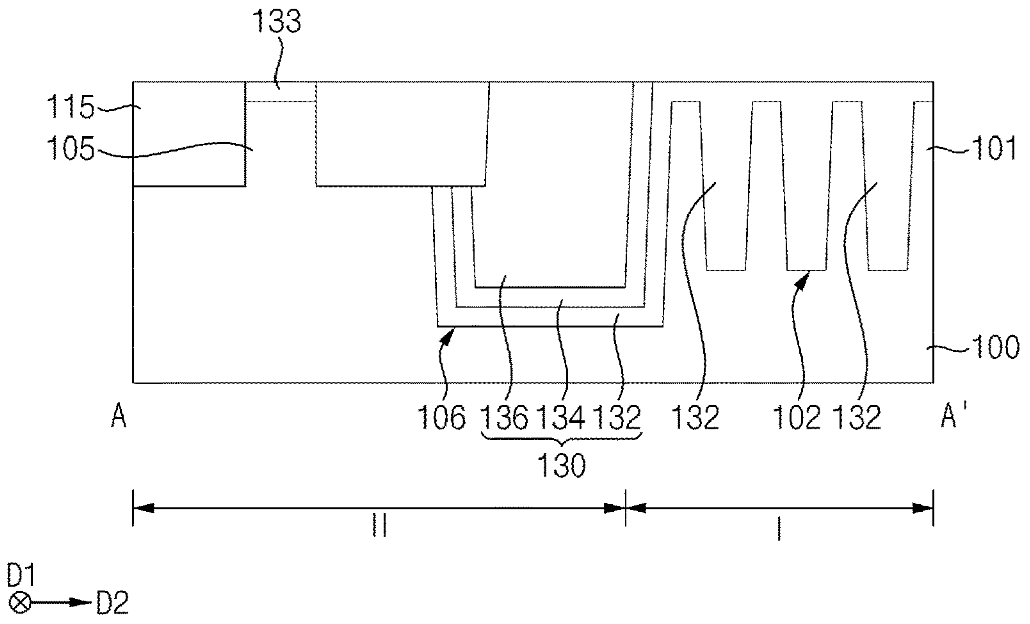

Referring to FIG. 51, a fifth insulating interlayer may be formed on the isolation structure 130 and the second insulation mask 135 to fill the sixth recess 700, and a planarization process may be performed on the fifth insulating interlayer until an upper surface of the second insulation mask 135 is exposed to form the fifth insulating interlayer pattern 115.

A wet etching process may be performed on the fifth insulating interlayer pattern 115 until an upper surface of the third isolation pattern 136 is exposed, and a portion of the second isolation pattern 134 on the second insulation mask 135 and the first region I of the substrate 100 may be removed by, e.g., a stripping process. Thus, an uppermost surface of the second isolation pattern 134 remaining in the third recess 106 may be substantially coplanar with an uppermost surface of the first isolation pattern 132 and an upper surface of the first insulation mask 133.

Figure 52:
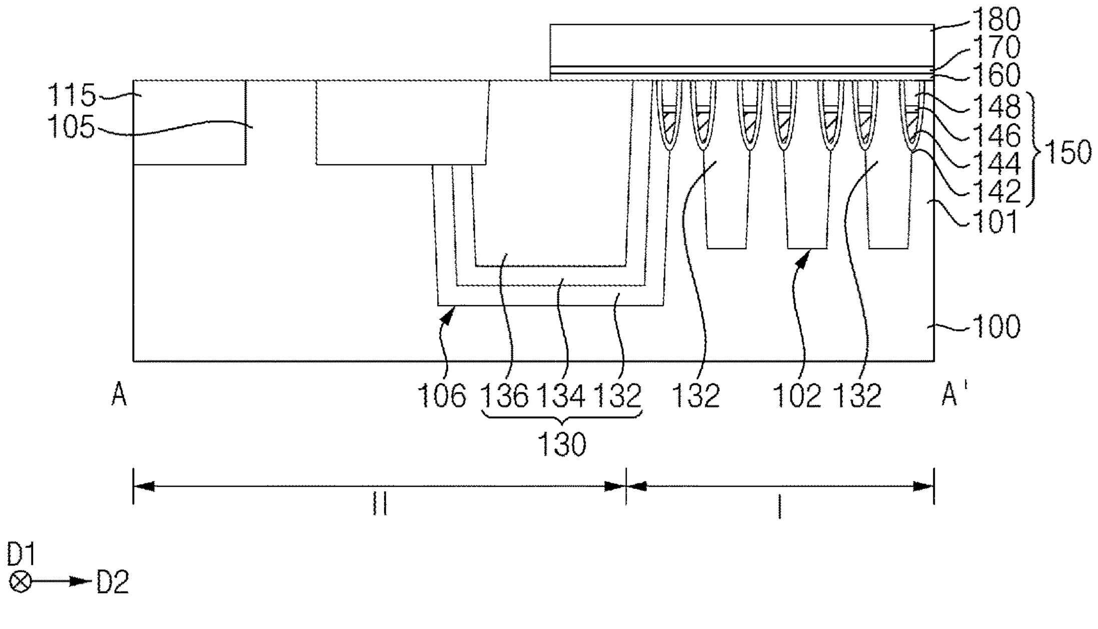

Referring to FIG. 52, processes substantially the same as or similar to those illustrated with reference to FIGS. 10 to 12 may be performed to form the first gate structure 150, the buffer layer 160, the first etch stop layer 170 and the third sacrificial insulation layer 180.

However, the polysilicon layer 120 may not be formed, and the first insulation mask 133 may be removed during the above processes.

Figure 53:
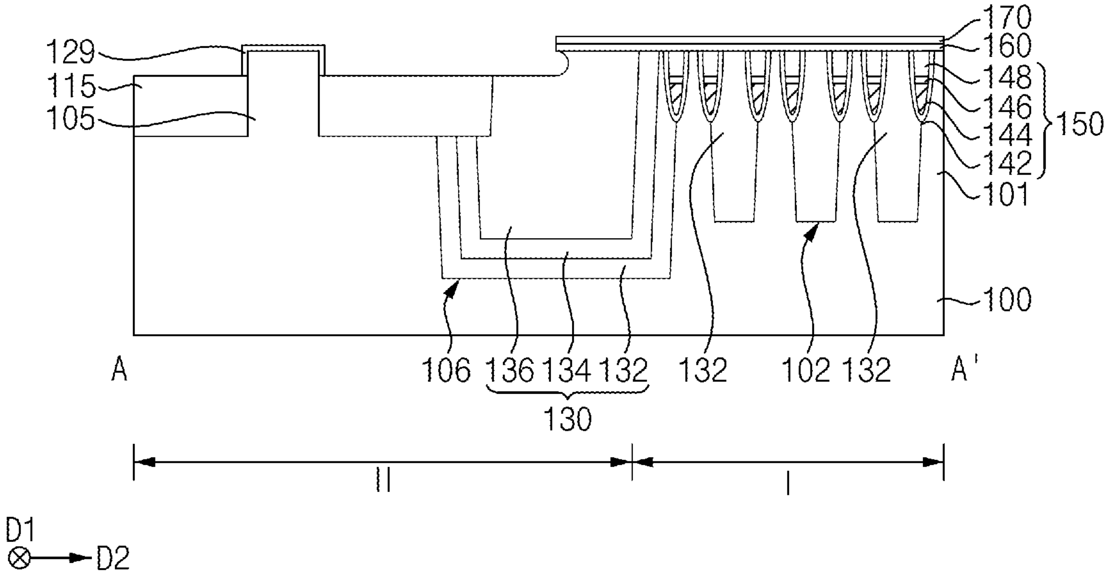

Referring to FIG. 53, processes substantially the same as or similar to those illustrated with reference to FIG. 13 may be performed to remove the upper portion of the fifth insulating interlayer pattern 115 and the third sacrificial insulation layer 180, and thus the upper portion of the second active pattern 105 may be exposed.

Additionally, a plasma oxidation process may be performed on the upper surface and the upper sidewall of the second active pattern 105 to form the oxide pattern 129.

Referring to FIG. 48, processes substantially the same as or similar to those illustrated with reference to FIGS. 14 to 47 and FIGS. 1 to 4 may be performed to manufacture the semiconductor device.

As illustrated above, unlike the method of manufacturing the semiconductor device illustrated with reference to FIGS. 1 to 47, the first active pattern 101 may be formed on the first region I of the substrate 100, the second active pattern 105 may be formed on the second region II of the substrate 100, and the lower sidewall of the second active pattern 105 may be covered by the fifth insulating interlayer pattern 115 instead of the isolation structure 130.

Figure 54:
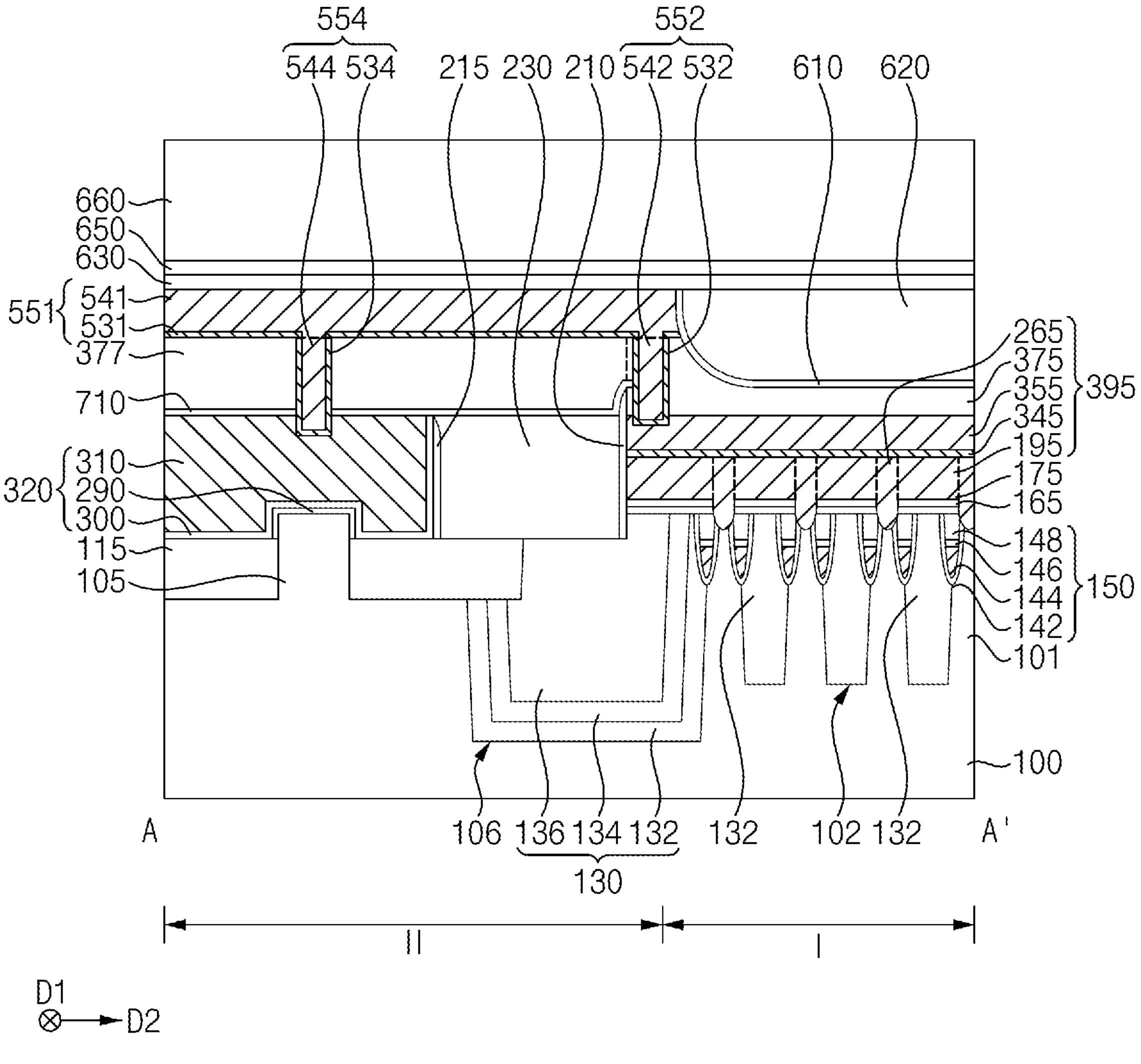
FIG. 54 is a cross-sectional view illustrating a semiconductor device in accordance with example embodiments.

FIG. 54 is a cross-sectional view illustrating a semiconductor device in accordance with example embodiments, which may correspond to FIG. 2.

This semiconductor device may be substantially the same as or similar to that of FIGS. 1 to 4, except for some elements, and thus repeated explanations are omitted herein.

Referring to FIG. 54, the sidewall of the fifth conductive pattern 355 in the second direction D2 may not be covered by the first barrier pattern 345, and a cross-section in the second direction D2 of the first barrier pattern 345 may not have an "L" shape. That is, the sidewall of the fifth conductive pattern 355 in the second direction D2 may be free of the first barrier pattern 345 thereon.

Additionally, the sidewall of the end portion of the third conductive pattern 195 in the second direction D2 may be aligned with, in the vertical direction, the sidewalls of the first barrier pattern 345 and the fifth conductive pattern 355 in the second direction D2.

A fourth etch stop layer 710 may be formed on the second gate structure 320, the first insulating interlayer 230, the first spacer 210 and the second capping layer 360, and the fourth and fifth capping patterns 375 and 377 may be formed on the fourth etch stop layer 710. The fourth etch stop layer 710 may include an insulating nitride, e.g., silicon nitride.

FIGS. 55 to 60 are cross-sectional views illustrating a method of manufacturing a semiconductor device in accordance with example embodiments.

This method may include processes substantially the same as or similar to those illustrated with reference to FIGS. 48 to 53 or FIGS. 1 to 47, and thus repeated explanations thereof are omitted herein.

Figure 55:
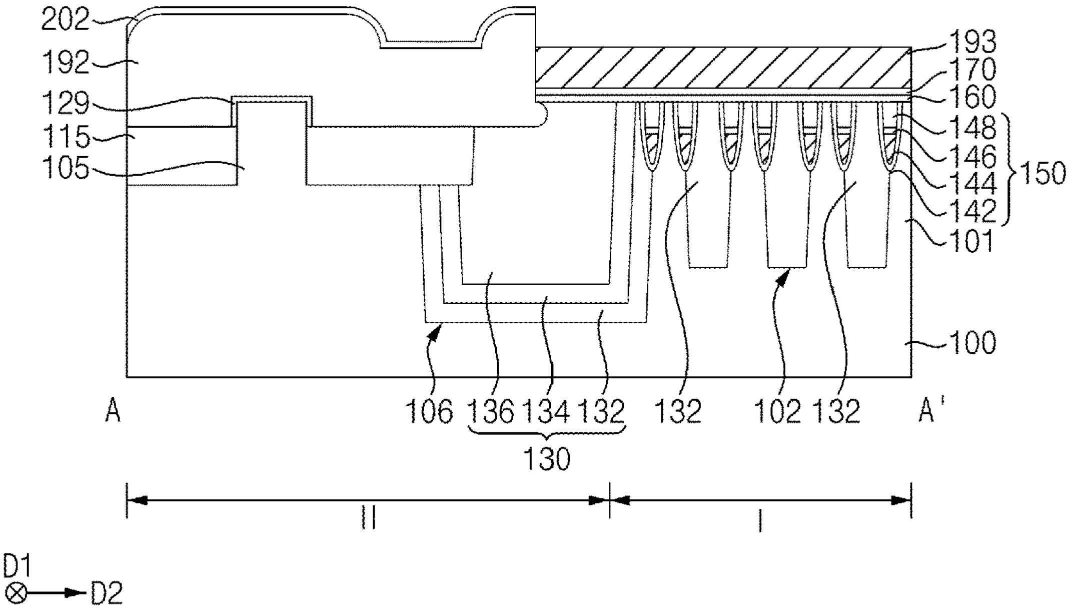
FIGS. 55 to 60 are cross-sectional views illustrating a method of manufacturing a semiconductor device in accordance with example embodiments.

Referring to FIG. 55, processes substantially the same as or similar to those illustrated with reference to FIGS. 49 to 53 may be performed, and the dummy gate electrode layer and the dummy gate mask layer may be sequentially stacked on the first etch stop layer 170, the isolation structure 130, the fifth insulating interlayer pattern 115 and the oxide pattern 129.

Processes substantially the same as or similar to those illustrated with reference to FIGS. 20 to 22 may be performed to form the third etching mask covering the second region II of the substrate 100, and an etching process may be performed using the third etching mask to remove the dummy gate mask layer and the upper portion of the dummy gate electrode layer.

Thus, the thickness of the dummy gate electrode layer on the first region I of the substrate 100 and the portion of the second region II adjacent to the first region I of the substrate 100 may be reduced, and a preliminary dummy gate electrode 192 and a preliminary dummy gate mask 202 may be formed on the second region II of the substrate 100.

An ion implantation process may be performed on a portion of the dummy gate electrode layer on the first region I of the substrate 100 and the portion of the second region II adjacent to the first region I of the substrate 100 to form the third conductive layer 193 including, e.g., n-type impurities.

Figure 56:
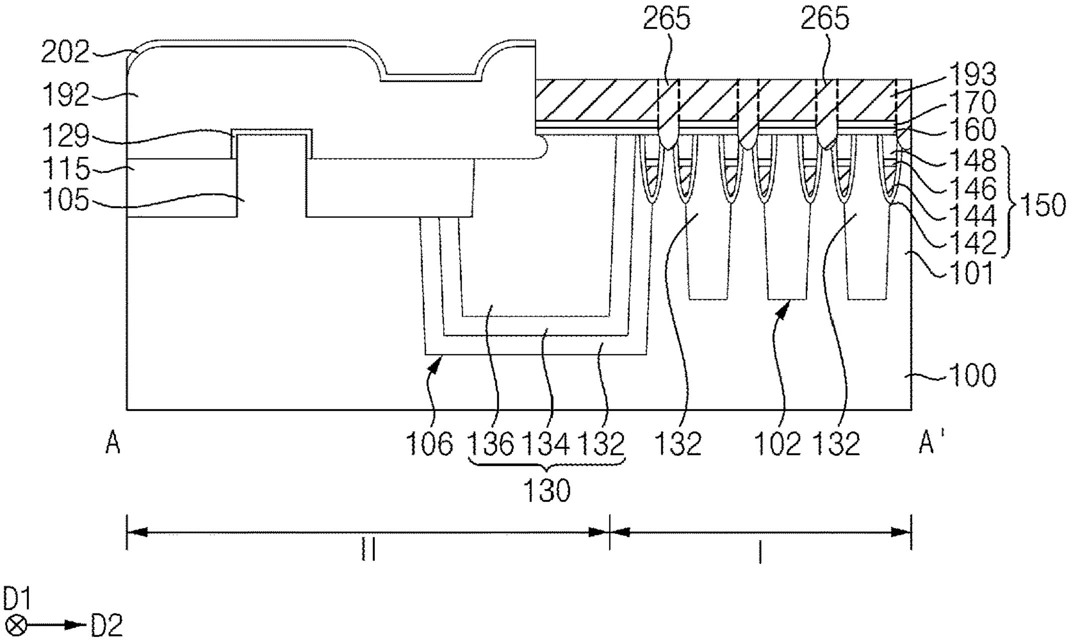

Referring to FIG. 56, processes substantially the same as or similar to those illustrated with reference to FIGS. 23 to 27 may be performed to form the bit line contact plug 265 through the third conductive layer 193, the first etch stop layer 170, the buffer layer 160 and an upper portion of the first active pattern 101.

However, the fourth insulating interlayer 270 may not be formed on the third conductive layer 193 and the bit line contact plug 265.

Figure 57:
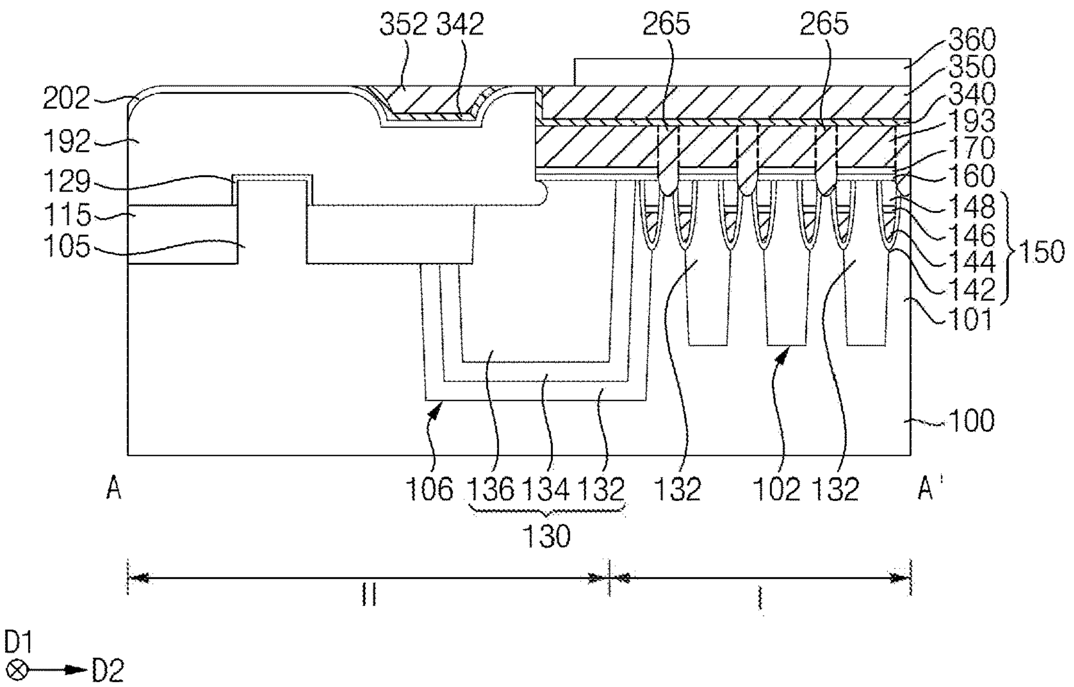

Referring to FIG. 57, processes substantially the same as or similar to those illustrated with reference to FIGS. 32 and 33 may be performed to form the first barrier layer 340, the fifth conductive layer 350 and the second capping layer 360 sequentially stacked in the vertical direction on the first region I of the substrate 100 and the portion of the second region II adjacent to the first region I of the substrate 100.

A first barrier layer residue 342 and a fifth conductive layer residue 352 may remain on the preliminary dummy gate mask 202 on a portion of the second region II of the substrate 100.

Figure 58:
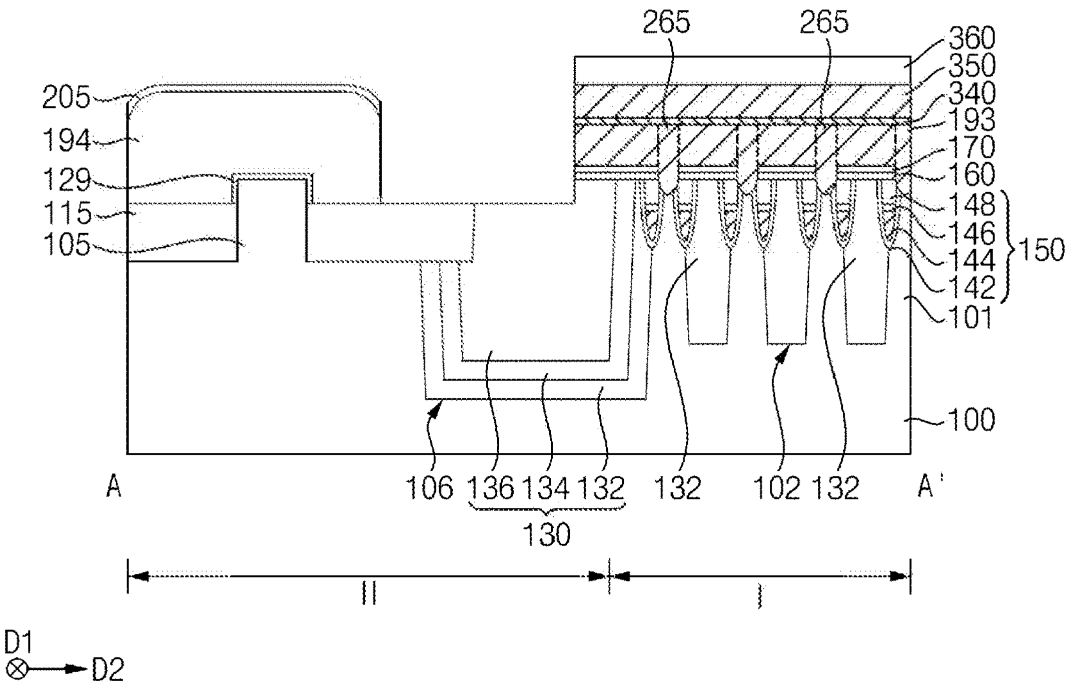

Referring to FIG. 58, the preliminary dummy gate mask 202 and the preliminary dummy gate electrode 192 may be patterned by an etching process to form the dummy gate mask 205 and the dummy gate electrode 194, respectively, which may collectively form the dummy gate structure.

During the etching process, the fifth conductive layer 350, the first barrier layer 340, the third conductive layer 193, the buffer layer 160, the first etch stop layer 170 and the upper portion of the third isolation pattern 136 on the portion of the second region II adjacent to the first region I of the substrate 100 may also be removed.

Figure 59:
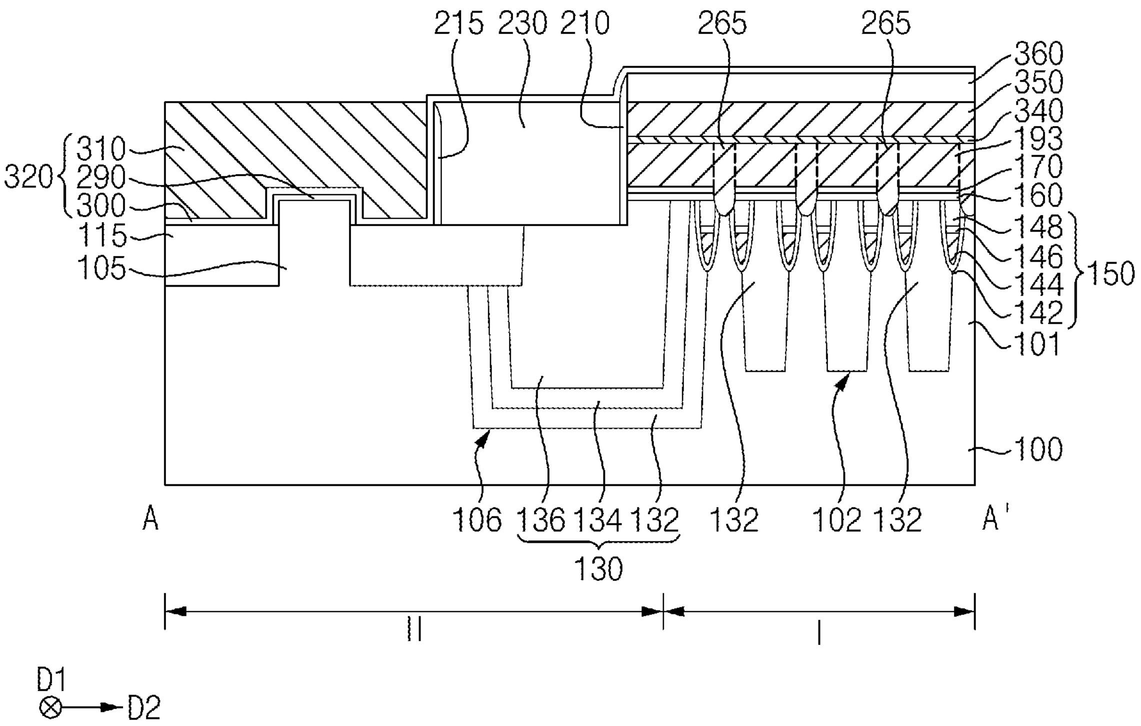

Referring to FIG. 59, processes substantially the same as or similar to those illustrated with reference to FIGS. 16 to 22 may be performed to form the first and second spacers 210 and 215, the source/drain layer 220 and the first insulating interlayer 230, and processes substantially the same as or similar to those illustrated with reference to FIGS. 29 and 30 may be performed to form the second gate structure 320.

However, the high-k dielectric pattern 300 included in the second gate structure 320 may also be formed on the upper surface of the first insulating interlayer 230, the upper sidewall and the upper surface of the first spacer 210 and the upper surface of the second capping layer 360.

Figure 60:
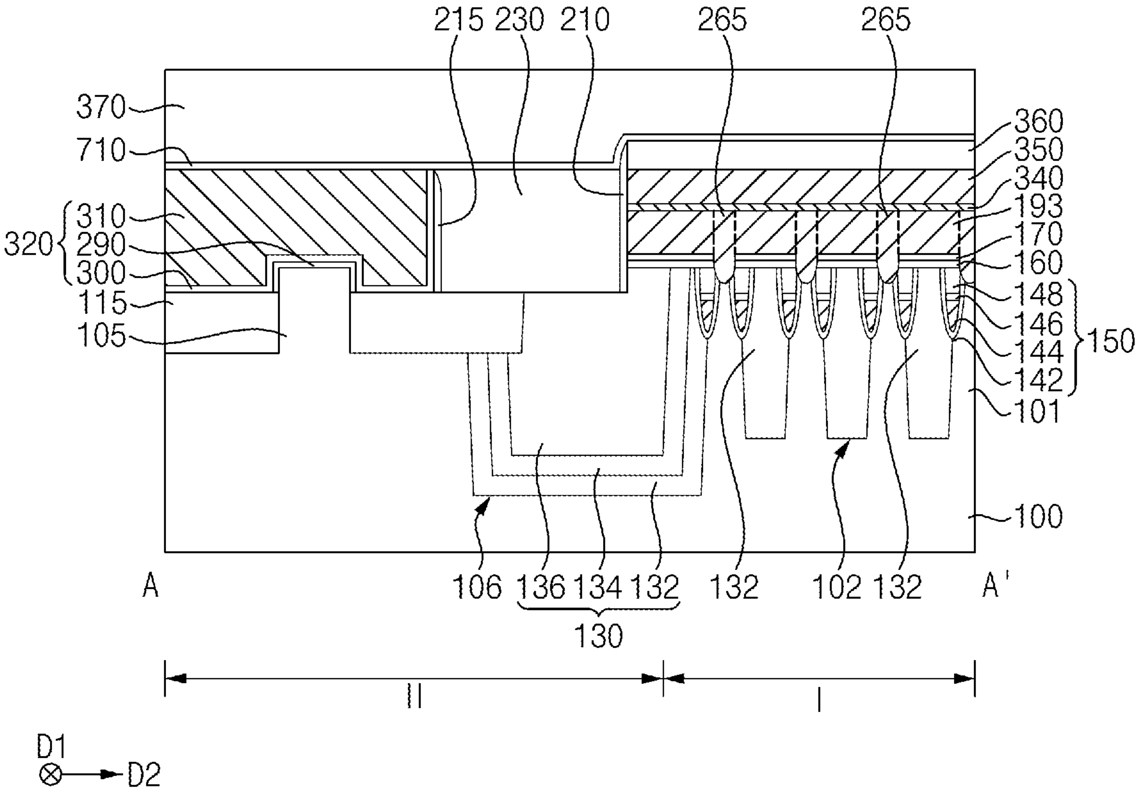

Referring to FIG. 60, a portion of the high-k dielectric pattern 300 on the upper surface of the first insulating interlayer 230, the upper sidewall and the upper surface of the first spacer 210 and the upper surface of the second capping layer 360 may be removed by, e.g., a wet etching process, and the fourth etch stop layer 710 and the third capping layer 370 may be sequentially stacked on the second gate structure 320, the first insulating interlayer 230, the first spacer 210 and the second capping layer 360, and a planarization process may be performed on the third capping layer.

Referring to FIG. 54 again, processes substantially the same as or similar to those illustrated with reference to FIGS. 34 to 47 and FIGS. 1 to 4 may be performed to manufacture the semiconductor device.

As illustrated above, unlike the method illustrated with reference to FIGS. 1 to 47 or the method illustrated with reference to FIGS. 48 to 53, the dummy gate mask layer and the dummy gate electrode layer may be formed on the first and second regions I and II of the substrate 100, the third conductive layer 193, the bit line contact plug 265, the first barrier layer 340, the fifth conductive layer 350 and the second capping layer 360 may be formed on the first region I of the substrate 100, and the dummy gate structure may be formed on the second region II of the substrate 100.

Figure 61:
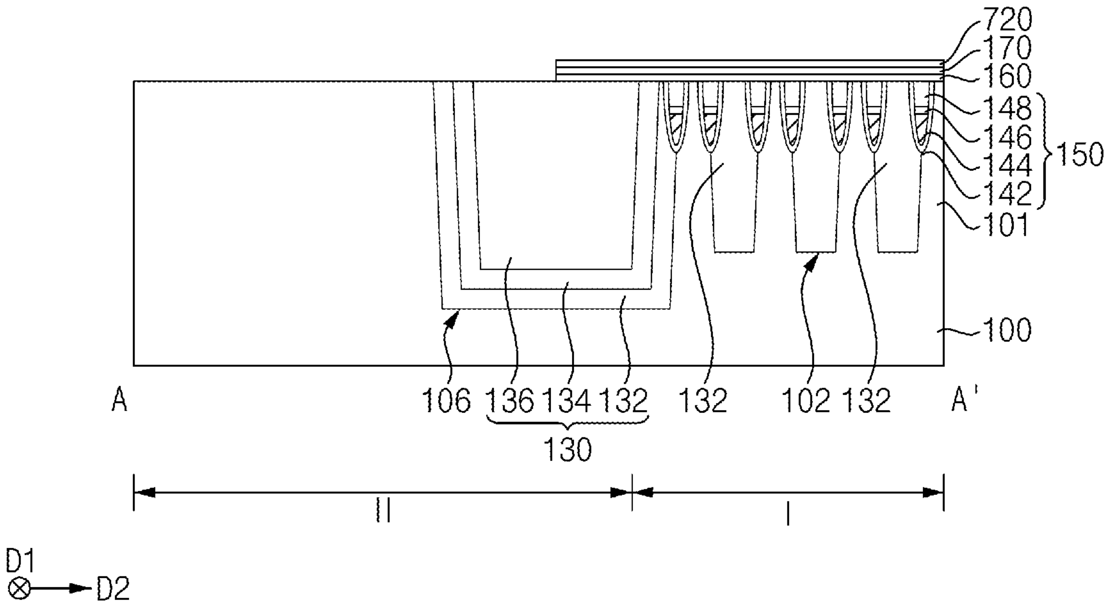
FIGS. 61 to 63 are cross-sectional views illustrating a method of manufacturing a semiconductor device in accordance with example embodiments.
Figure 62:
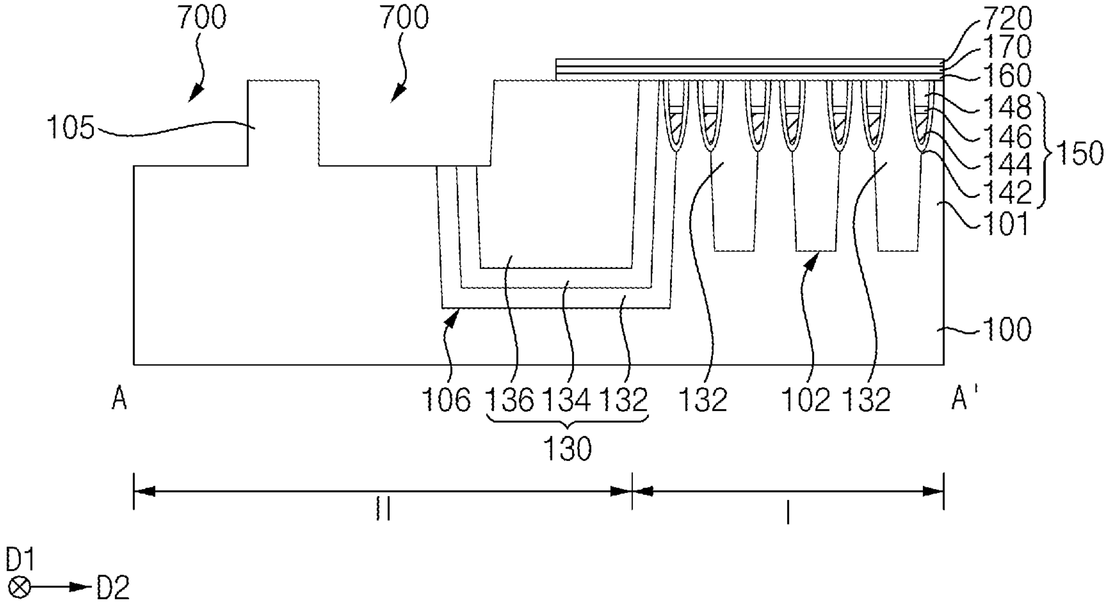
Figure 63:
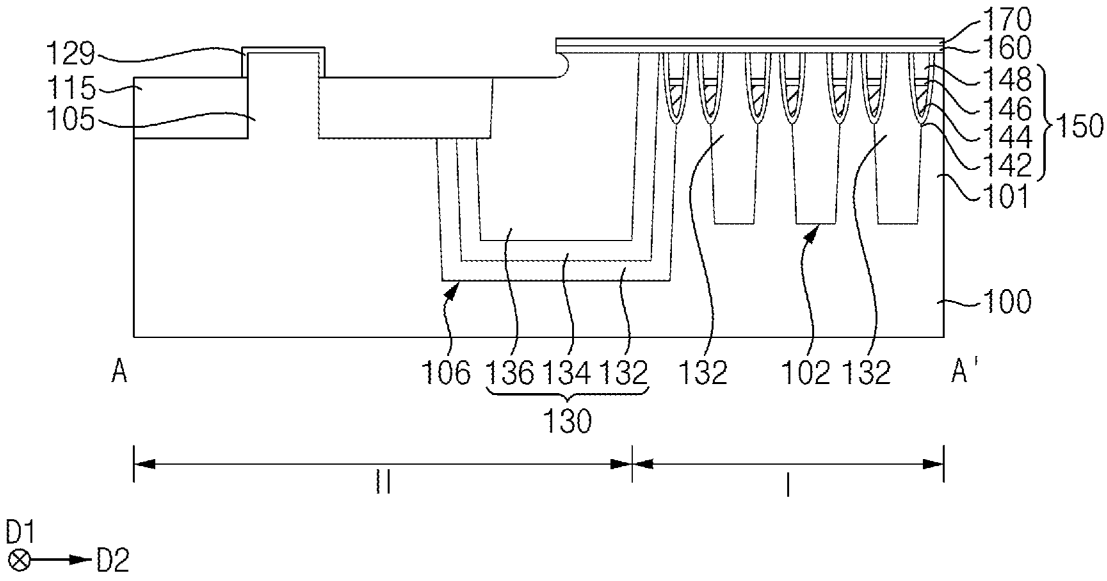

FIGS. 61 to 63 are cross-sectional views illustrating a method of manufacturing a semiconductor device in accordance with example embodiments.

This method may include processes substantially the same as or similar to those illustrated with reference to FIGS. 54 to 60, FIGS. 48 to 53 or FIGS. 1 to 47, and thus repeated explanations thereof are omitted herein.

Referring to FIG. 61, processes substantially the same as or similar to those illustrated with reference to FIG. 49 may be performed to form the first active pattern 101 and the isolation structure 130, and the first gate structure 150 may be formed through the upper portions of the first active pattern 101 and the first isolation pattern 132 in the first region I of the substrate 100.

The buffer layer 160, the first etch stop layer 170 and a third insulation layer 720 may be formed on the first region I of the substrate 100 and the portion of the second region II adjacent to the first region I of the substrate 100. The third insulation layer 720 may include an oxide, e.g., silicon oxide.

Referring to FIG. 62, the second active pattern 105 may be formed on the second region II of the substrate 100, and the sixth recess 700 may also be formed.

Referring to FIG. 63, the fifth insulating interlayer may be formed on the isolation structure 130, the second active pattern 105 and the third insulation layer 720 to fill the sixth recess 700, and a planarization process may be performed on the fifth insulating interlayer until the upper surface of the first etch stop layer 170 is exposed to form the fifth insulating interlayer pattern 115.

During the planarization process, the third insulation layer 720 may be removed.

A wet etching process may be performed on an upper portion of the fifth insulating interlayer pattern 115 until the upper portion of the second active pattern 105 is exposed.

A plasma oxidation process may be performed to form the oxide pattern 129 on the upper surface and the sidewall of the upper portion of the second active pattern 105.

Referring to FIG. 54, processes substantially the same as or similar to those illustrated with reference to FIGS. 14 to 47 and FIGS. 1 to 4 may be performed to manufacture the semiconductor device.

As illustrated above, the first active pattern 101 may be formed on the first region I of the substrate 100, the first gate structure 150 may be formed, and the second active pattern 105 may be formed on the second region II of the substrate 100.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts.

What is claimed is:

1. A semiconductor device, comprising:

first and second active patterns on a cell region and a peripheral circuit region of a substrate, respectively;

a first gate structure that extends through an upper portion of the first active pattern;

a second gate structure on an upper surface and an upper sidewall of the second active pattern;

a source/drain layer on a portion of the second active pattern that is adjacent to the second gate structure;

a bit line structure on a central portion of the first active pattern, the bit line structure overlapping the second gate structure in a horizontal direction that is substantially parallel to an upper surface of the substrate;

a contact plug structure on opposing end portions of the first active pattern; and a capacitor on the contact plug structure.

2. The semiconductor device according to claim 1, further comprising an isolation structure on the substrate and on sidewalls of the first and second active patterns, wherein the isolation structure comprises first, second, and third isolation patterns, and wherein the first gate structure extends through an upper portion of the isolation structure, and the second gate structure is on the isolation structure.

3. The semiconductor device according to claim 2, wherein a first portion of the isolation structure that is on the cell region of the substrate includes the first isolation pattern, and wherein a second portion of the isolation structure that is on the peripheral circuit region of the substrate includes the first to third isolation patterns.

4. The semiconductor device according to claim 3, wherein an upper surface of a portion of the first isolation pattern that is on the cell region of the substrate is substantially coplanar with an uppermost surface of the first active pattern.

5. The semiconductor device according to claim 3, wherein the second active pattern extends in a first direction that is substantially parallel to the upper surface of the substrate, and the second gate structure extends in a second direction that is substantially parallel to the upper surface of the substrate and intersects the first direction, and wherein an upper surface of a third portion of the isolation structure that is on the peripheral circuit region of the substrate and is adjacent to the second active pattern in the second direction is lower than an upper surface of the second active pattern, with a lower surface of the substrate providing a base reference plane.

6. The semiconductor device according to claim 5, wherein an uppermost surface of a portion of the second isolation pattern that is on the peripheral circuit region of the substrate and is adjacent to the source/drain layer in the second direction is higher than uppermost surfaces of portions of the first and third isolation patterns that are on the peripheral circuit region of the substrate and are adjacent to the source/drain layer in the second direction.

7. The semiconductor device according to claim 6, wherein the uppermost surface of the portion of the second isolation pattern is substantially coplanar with the upper surface of the second active pattern.

8. The semiconductor device according to claim 2, further comprising an insulating interlayer pattern between the isolation structure and the second gate structure.

9. The semiconductor device according to claim 8, further comprising a spacer on the insulating interlayer pattern, wherein the spacer is on a sidewall of the second gate structure.

10. The semiconductor device according to claim 1, wherein the first gate structure extends in a first direction that is substantially parallel to the upper surface of the substrate, wherein the bit line structure extends in a second direction that is substantially parallel to the upper surface of the substrate and intersects the first direction, wherein the bit line structure extends on the cell region of the substrate and on a portion of the peripheral circuit region of the substrate that is adjacent to the cell region of the substrate, and wherein the bit line structure comprises a first conductive pattern, a barrier pattern, a second conductive pattern, and a capping pattern stacked in a vertical direction that is substantially perpendicular to the upper surface of the substrate.

11. The semiconductor device according to claim 10, wherein the barrier pattern is on a sidewall of an end portion in the second direction of the second conductive pattern, and wherein the end portion of the second conductive pattern is on the peripheral circuit region of the substrate.

12. The semiconductor device according to claim 10, wherein a cross-section in the second direction of the barrier pattern on the peripheral circuit region of the substrate has an "L" shape.

13. The semiconductor device according to claim 10, wherein a sidewall of an end portion in the second direction of the first conductive pattern is not aligned in the vertical direction with a sidewall of an end portion in the second direction of the barrier pattern, such that the barrier pattern and the first conductive pattern collectively have a stepped profile in the second direction, and wherein the end portion of the first conductive pattern and the end portion of the barrier pattern are on the peripheral circuit region of the substrate.

14. The semiconductor device according to claim 10, wherein a sidewall of an end portion in the second direction of the first conductive pattern is aligned in the vertical direction with a sidewall of an end portion in the second direction of the barrier pattern, and wherein the end portion of the first conductive pattern and the end portion of the barrier pattern are on the peripheral circuit region of the substrate.

15. A semiconductor device, comprising:

a first active pattern on a substrate;

a first gate structure that extends through an upper portion of the first active pattern in a first direction that is substantially parallel to an upper surface of the substrate;

a bit line structure on a central portion of the first active pattern, the bit line structure extending in a second direction that is substantially parallel to the upper surface of the substrate and intersects the first direction, wherein the bit line structure comprises a first conductive pattern, a barrier pattern, a second conductive pattern, and a capping pattern stacked in a vertical direction that is substantially perpendicular to the upper surface of the substrate;

a contact plug structure on opposing end portions of the first active pattern; and a capacitor on the contact plug structure, wherein an end portion of the barrier pattern in the second direction has an "L" shape in a cross-sectional view.

16. The semiconductor device according to claim 15, wherein the barrier pattern is on a sidewall of an end portion in the second direction of the second conductive pattern.

17. The semiconductor device according to claim 15, wherein a sidewall of an end portion in the second direction of the first conductive pattern is not aligned with a sidewall of the end portion of the barrier pattern, such that the barrier pattern and the first conductive pattern collectively have a stepped profile in the second direction.

18. A semiconductor device, comprising:

first and second active patterns on a cell region and a peripheral circuit region of a substrate, respectively;

an isolation structure on the substrate and on sidewalls of the first and second active patterns, the isolation structure comprising first, second, and third isolation patterns;

a first gate structure that extends on the cell region of the substrate through upper portions of the first active pattern and the isolation structure in a first direction that is substantially parallel to an upper surface of the substrate;

a second gate structure on an upper surface and an upper sidewall of the second active pattern, wherein the second gate structure is on the isolation structure and is on the peripheral circuit region of the substrate;

a source/drain layer on a portion of the second active pattern that is adjacent to the second gate structure;

a bit line structure on a central portion of the first active pattern and on the isolation structure, the bit line structure extending in a second direction that is substantially parallel to the upper surface of the substrate and intersects the first direction, wherein the bit line structure is on the cell region and is on a portion of the peripheral circuit region that is adjacent to the cell region, and wherein the bit line structure comprises a first conductive pattern, a barrier pattern, a second conductive pattern, and a capping pattern stacked in a vertical direction that is substantially perpendicular to the upper surface of the substrate;

a contact plug structure on opposing end portions of the first active pattern; and a capacitor on the contact plug structure.

19. The semiconductor device according to claim 18, wherein the barrier pattern is on a sidewall of an end portion in the second direction of the second conductive pattern, and wherein the end portion of the second conductive pattern is on the peripheral circuit region of the substrate.

20. The semiconductor device according to claim 18, wherein a sidewall of an end portion in the second direction of the first conductive pattern is not aligned with a sidewall of an end portion in the second direction of the barrier pattern, such that the barrier pattern and the first conductive pattern collectively have a stepped profile in the second direction, and wherein the end portion of the first conductive pattern and the end portion of the barrier pattern are on the peripheral circuit region of the substrate.

* * * * *